US012610667B2

(12) United States Patent
Cho et al.

(10) Patent No.: US 12,610,667 B2
(45) Date of Patent: Apr. 21, 2026

(54) DISPLAY DEVICE WITH LIGHT OUTPUT PATTERNS ADJACENT TO THE ACTIVE LAYERS FOR IMPROVED OUTPUT EFFICIENCY

(71) Applicant: Samsung Display Co., LTD., Yongin-si (KR)

(72) Inventors: Joo Woan Cho, Seongnam-si (KR); Dae Ho Song, Hwaseong-si (KR); Byung Choon Yang, Seoul (KR); Tae Hee Lee, Hwaseong-si (KR); Hyung Il Jeon, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 612 days.

(21) Appl. No.: 17/563,698

(22) Filed: Dec. 28, 2021

(65) Prior Publication Data

US 2022/0352433 A1      Nov. 3, 2022

(30) Foreign Application Priority Data

Apr. 30, 2021      (KR) ........................ 10-2021-0056668

(51) Int. Cl.
H10H 20/851          (2025.01)
H10H 20/01            (2025.01)
(Continued)

(52) U.S. Cl.
CPC ........ H10H 20/8514 (2025.01); H10H 20/01 (2025.01); H10H 20/8511 (2025.01);
(Continued)

(58) Field of Classification Search
CPC .... H01L 33/505–508; H01L 33/58–60; H10D 86/441; H10H 29/032;
(Continued)

(56) References Cited

U.S. PATENT DOCUMENTS 9,111,464 B2      8/2015   Bibl et al.
9,599,857 B2      3/2017   Bibl et al.
(Continued)

FOREIGN PATENT DOCUMENTS

CN          210110826 U      2/2020
KR        20160010869 A      1/2016
(Continued)

*Primary Examiner* — Christine S. Kim
*Assistant Examiner* — Tyler J Wiegand
(74) *Attorney, Agent, or Firm* — Womble Bond Dickinson (US) LLP

(57)          ABSTRACT

A display device comprises a first substrate including a plurality of pixel circuit units, a plurality of light emitting elements in a display area on the first substrate and electrically connected to a corresponding one of the plurality of pixel circuit units, respectively, a plurality of grooves corresponding to partially recessed top surfaces of the plurality of light emitting elements, respectively, and a plurality of light output patterns corresponding to the plurality of light emitting elements, the light output pattern being partially in a corresponding groove of the plurality of grooves, wherein the light output pattern includes a first surface in contact with the light emitting element in the groove, a second surface opposite to the first surface, and a third surface that is a side surface connecting the first surface and the second surface, and the second surface is a curved outer surface.

13 Claims, 37 Drawing Sheets

(51) Int. Cl.
H10H 20/856 (2025.01)
H10H 20/857 (2025.01)
H10H 29/14 (2025.01)

(52) U.S. Cl.
CPC ...... H10H 20/8516 (2025.01); H10H 20/856 (2025.01); H10H 20/857 (2025.01); H10H 29/142 (2025.01); *H10H 20/0364* (2025.01)

(58) Field of Classification Search
CPC .............. H10H 29/0364; H10H 29/49; H10H 29/832–8321; H10H 29/857
See application file for complete search history.

(56) References Cited

U.S. PATENT DOCUMENTS

| | | | |
|---|---|---|---|
| 9,865,577 B2 | 1/2018 | Bibl et al. | |
| 2005/0248929 A1* | 11/2005 | Kawamura ............ | H10K 59/38 |
| | | | 313/485 |
| 2009/0046470 A1* | 2/2009 | Lai ....................... | H10H 20/853 |
| | | | 362/311.01 |
| 2016/0013170 A1 | 1/2016 | Sakariya et al. | |
| 2017/0117500 A1* | 4/2017 | Gunji ................. | H10K 59/8052 |
| 2017/0309698 A1 | 10/2017 | Bower et al. | |
| 2019/0041700 A1* | 2/2019 | Koo .................. | G02F 1/133514 |
| 2020/0212267 A1* | 7/2020 | Kwak ................ | H10H 20/8514 |

FOREIGN PATENT DOCUMENTS

| | | | |
|---|---|---|---|
| KR | 10-2018-0118488 A | 10/2018 | |
| KR | 10-2018-0133649 A | 12/2018 | |
| KR | 10-2019-0086605 A | 7/2019 | |
| KR | 10-2020-0079817 A | 7/2020 | |

* cited by examiner

ELP: ELP1, ELP2, ELP3

ED: SEM1, SEM2, MQW, EBL, SL
ELP: ELP1, ELP2, ELP3

ED: SEM1, SEM2, EBL, MQW, SL

ED: SEM1, SEM2, EBL, MQW, SL

ED: SEM1, SEM2, MQW, EBL, SL

ED: SEM1, SEM2, MQW, EBL, SL

10_1

EA1      EA2      EA3

ELP1      ELP2      ELP3

WCP
BSP
210
CSE2
CSE1
INS1
RL1
SL
MQW
EBL
SEM1
CNE1
CTE1
CINS
AE
PXC

CNE2

CTE2

CE

110

SEM2

510

NDA            DPA

DR3
DR2
DR1

ED: SEM1, SEM2, MQW, EBL, SL
ELP: ELP1, ELP2, ELP3

ED: SEM1, SEM2, MQW, EBL, SL
ELP: ELP1, ELP2, ELP3

ED: SEM1, SEM2, MQW, EBL, SL
ELP: ELP1, ELP2, ELP3

ED: SEM1, SEM2, EBL, MQW, SL

ED: SEM1, SEM2, EBL, MQW, SL

ED: SEM1, SEM2, EBL, MQW, SL

ED: SEM1, SEM2, MQW, EBL, SL

ED: SEM1, SEM2, EBL, MQW, SL

ED: SEM1, SEM2, MQW, EBL, SL

ED: SEM1, SEM2, MQW, EBL, SL

ED: SEM1, SEM2, MQW, EBL, SL

ED: SEM1, SEM2, MQW, EBL, SL

ED: SEM1, SEM2, MQW, EBL, SL

ED: SEM1, SEM2, MQW, EBL, SL

ED: SEM1, SEM2, MQW, EBL, SL

ED: SEM1, SEM2, MQW, EBL, SL

1

DISPLAY DEVICE WITH LIGHT OUTPUT PATTERNS ADJACENT TO THE ACTIVE LAYERS FOR IMPROVED OUTPUT EFFICIENCY

CROSS-REFERENCE TO RELATED APPLICATION

This application claims priority to and the benefit of Korean Patent Application No. 10-2021-0056668 filed on Apr. 30, 2021 in the Korean Intellectual Property Office, the entire content of which is incorporated herein by reference.

BACKGROUND

1. Field

One or more embodiments of the present disclosure relate to a display device.

2. Description of the Related Art

As information society develops, demands for display devices in various forms for displaying images are increasing. The display devices may be flat panel displays such as liquid crystal displays, field emission displays, and/or light emitting displays. The light emitting displays may include an organic light emitting display including an organic light emitting diode element as a light emitting element, and an inorganic light emitting display including an inorganic semiconductor element as a light emitting element.

Recently, a head-mounted display including a light emitting display has been developed. The head-mounted display is a virtual reality (VR) and/or augmented reality (AR) glasses-like monitor device that is worn by a user in the form of glasses or a helmet and forms a focus at a short distance in front of the user's eyes.

SUMMARY

One or more aspects of embodiments of the present disclosure are directed toward an ultra-high resolution display device including inorganic light emitting elements and including a larger number of emission areas per unit area.

One or more aspects of embodiments of the present disclosure are directed toward a display device that includes a light output structure and prevents or reducing mixing of colors of lights emitted from adjacent emission areas with each other.

However, aspects of embodiments of the present disclosure are not restricted to those set forth herein. The above and other aspects of the disclosure will become more apparent to one of ordinary skill in the art to which the disclosure pertains by referencing the detailed description of the disclosure given below.

A display device according to one or more embodiments includes light output patterns to correspond to light emitting elements. Because the light output patterns are adjacent to the active layers of the light emitting elements, the amount of light lost to an adjacent emission area among the lights generated from the light emitting element may be reduced, which makes it possible to improve the light output efficiency.

Further, the display device may include the light output patterns directly on the light emitting elements to improve the light output efficiency of the lights emitted from the light emitting elements in an upward direction and to prevent or reducing mixing of colors of the lights emitted from the adjacent emission areas.

However, the effects of the embodiments of the present disclosure are not limited to the aforementioned effects, and various other effects are included in the specification.

According to one or more embodiments of the disclosure, a display device comprises a first substrate including a display area and a non-display area surrounding (e.g., around) the display area, the first substrate including a plurality of pixel circuit units, a plurality of light emitting elements in the display area on the first substrate and electrically connected (e.g., electrically coupled) to a corresponding one of the plurality of pixel circuit units, respectively, a plurality of grooves formed corresponding to the plurality of light emitting elements, respectively, such that top surfaces of the plurality of light emitting elements are partially recessed, a connection electrode in the non-display area on the first substrate and electrically connected (e.g., electrically coupled) to the plurality of light emitting elements, and a plurality of light output patterns corresponding to the plurality of light emitting elements, the plurality of light output patterns being partially in a corresponding groove of the plurality of grooves, wherein a light output pattern of the plurality of light output patterns includes a first surface in contact with a light emitting element of the plurality of light emitting elements in a corresponding groove of the plurality of grooves, a second surface opposite to the first surface, and a third surface that is a side surface connecting the first surface and the second surface, and the second surface has a curved outer surface (e.g., the second surface is a curved outer surface and/or the second surface is curved).

A diameter of the light output pattern may increase from the first surface to the second surface.

The third surface may be inclined with respect to a top surface of the first substrate.

The third surface may have a curved shape (e.g., the third surface may be curved).

Each of the plurality of light emitting elements may include a first semiconductor layer, an active layer on the first semiconductor layer, and a second semiconductor layer on the active layer, wherein a respective one of the plurality of grooves corresponds to a respective one of the plurality of light emitting elements, wherein the respective one of the plurality of grooves may have a diameter smaller than a diameter of the second semiconductor layer of the respective one of the plurality of light emitting elements, and wherein the respective one of the plurality of grooves may be on a top surface of the second semiconductor layer of the respective one of the plurality of light emitting elements, and may be surrounded by a side surface portion of the second semiconductor layer.

The first surface of the light output pattern may be in direct contact with the second semiconductor layer.

The display device may further comprise an optical layer between the first surface of the light output pattern and the second semiconductor layer.

The display device may further comprise a reflective layer on the side surface of the light output pattern.

The display device may further comprise a first common semiconductor layer on the plurality of light emitting elements and the connection electrode, wherein the side surface portion of the second semiconductor layer of the respective one of the plurality of light emitting elements may be connected (e.g., may be coupled) to the first common semiconductor layer, and the respective one of the plurality of grooves may penetrate the first common semiconductor layer.

The light output pattern may include a base portion that blocks (or reduces) transmission of some of light emitted from the plurality of light emitting elements, and wavelength conversion particles in the base portion.

The light emitting element may emit light of a first color, and at least some of the plurality of light output patterns may include a colorant that blocks (or reduces) transmission of the light of the first color by the base portion.

The display device may further comprise a second substrate on the first substrate and partially surrounding (e.g., around) the plurality of light output patterns, wherein a refractive index of the light output pattern may be greater than a refractive index of the second substrate.

The display device may further comprise a capping layer on the second substrate, wherein the capping layer may be to cover the second surfaces of the plurality of light output patterns.

A refractive index of the capping layer may be smaller than a refractive index of the light output pattern.

According to an embodiment of the disclosure, a display device comprises a first substrate including a display area and a non-display area surrounding (e.g., around) the display area, a plurality of light emitting elements spaced apart from each other in the display area of the first substrate, a first insulating layer to partially surround the plurality of light emitting elements, respectively, the first insulating layer forming (e.g., including) a groove exposing a top surface of a respective one of the plurality of light emitting elements, a first connection electrode in the non-display area of the first substrate, a second connection electrode on the plurality of light emitting elements and the first connection electrode, the second connection electrode being partially in the groove and in contact with the top surface of the respective one of the plurality of light emitting elements, and a plurality of light output patterns corresponding to the plurality of light emitting elements, the plurality of light output patterns being partially in the groove, wherein the plurality of light output patterns include a first surface in contact with the second connection electrode in the groove.

The light output pattern may include a second surface opposite to the first surface, the second surface having a curved shape (e.g., being curved), and a third surface that is a side surface connecting the first surface and the second surface, and a diameter of the plurality of light output patterns increases from the first surface to the second surface.

The third surface may have a shape (e.g., may be) inclined with respect to a top surface of the first substrate.

A diameter of the first surface may be smaller than a diameter of the groove.

The light emitting element may include a first light emitting element to emit light of a first color, and a second light emitting element to emit light of a second color different from the first color, and the light output pattern may include a first light output pattern on the first light emitting element to block (or reduce) transmission of light of the second color, and a second light output pattern on the second light emitting element to block (or reduce) transmission of light of the first color.

Each of the plurality of light emitting elements may include a first semiconductor layer, an active layer on the first semiconductor layer, and a second semiconductor layer on the active layer, and a diameter of the groove may be equal to a diameter of the second semiconductor layer.

BRIEF DESCRIPTION OF THE DRAWINGS

The above and other aspects and features of the disclosure will become more apparent by describing in more detail embodiments thereof with reference to the attached drawings, in which.

DETAILED DESCRIPTION

Figure 1:
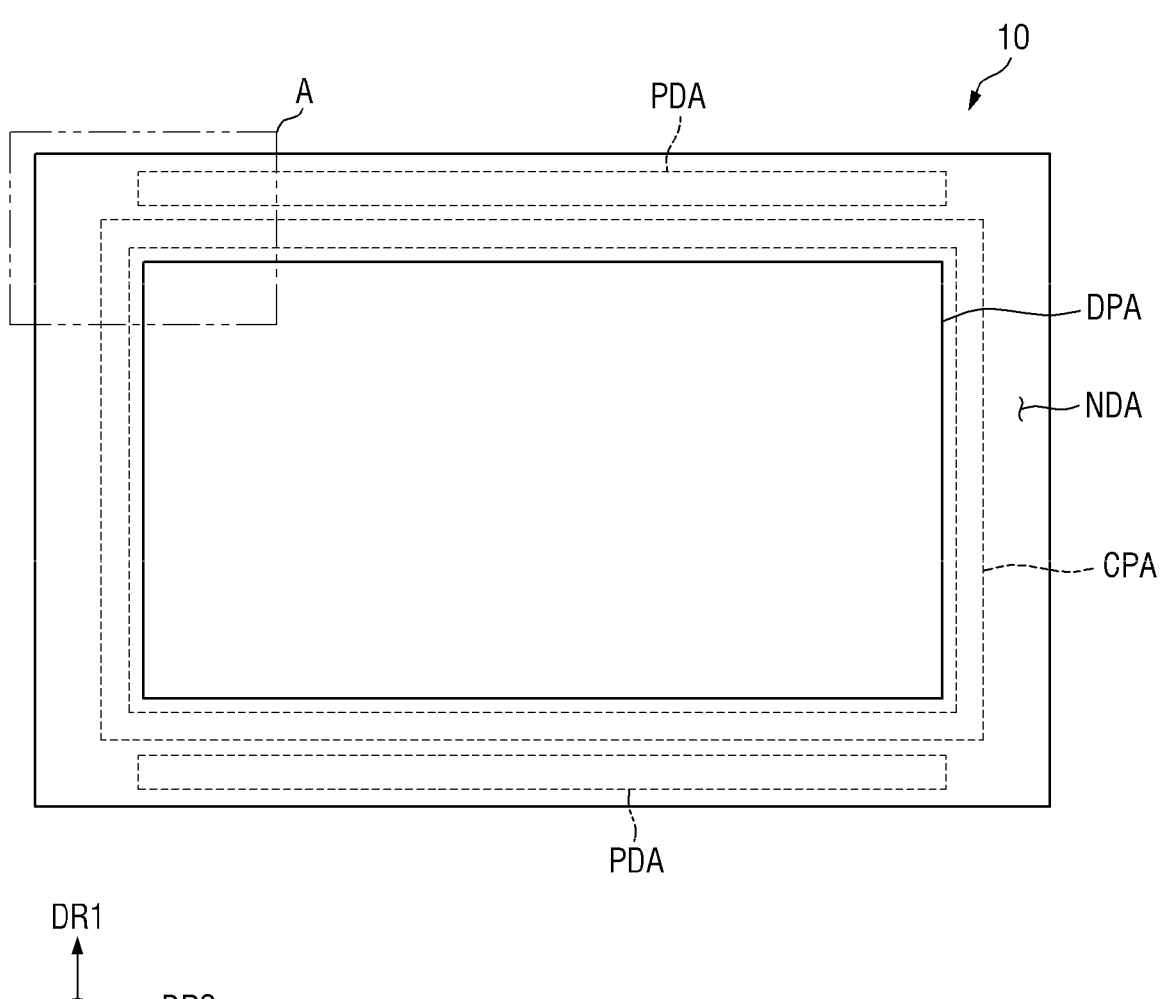
FIG. 1 is a schematic plan view of a display device according to one or more embodiments.

The present disclosure will now be described more fully hereinafter with reference to the accompanying drawings, in which embodiments of the invention are shown. This present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate (e.g., without any intervening layers therebetween), or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure".

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, embodiments will be described with reference to the accompanying drawings.

FIG. 1 is a schematic plan view of a display device according to one or more embodiments.

Referring to FIG. 1, a display device 10 displays a moving image and/or a still image. The display device 10 may refer to any suitable electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel which provides a display screen. Examples of the display panel may include an inorganic light emitting diode display panel, an organic light emitting display panel, a quantum dot light emitting display panel, a plasma display panel, and a field emission display panel. In the following description, a display device in which inorganic light emitting diodes are positioned on a semiconductor circuit board is illustrated as an example of the display panel. However, the disclosure is not limited thereto, and may be applied to another suitable display panel as long as the same (or substantially the same) technical spirit may be applied.

The shape of the display device 10 may be variously suitably modified. For example, the display device 10 may have a shape such as a rectangular shape elongated in a horizontal direction, a rectangular shape elongated in a vertical direction, a square shape, a quadrilateral shape with rounded corners (vertices), another polygonal shape, and/or a circular shape. The shape of a display area DPA of the display device 10 may also be similar to the overall shape of the display device 10. FIG. 1 illustrates a display device 10 having a rectangular shape elongated in a second direction DR2.

The display device 10 may include the display area DPA and a non-display area NDA. The display area DPA is an area where a screen (e.g., an image) can be displayed, and the non-display area NDA is an area where a screen (e.g., an image) is not displayed. The display area DPA may also be referred to as an active region, and the non-display area NDA may also be referred to as a non-active region. The display area DPA may substantially occupy the center of the display device 10.

The non-display area NDA may be around the display area DPA. The non-display area NDA may completely or partially surround the display area DPA. The display area DPA may have a rectangular shape, and the non-display area NDA may be adjacent to the four sides of the display area DPA. The non-display area NDA may form a bezel of the display device 10. Wires and/or circuit drivers included in the display device 10 may be placed in the non-display area NDA, and/or external devices may be mounted thereon.

For example, a non-display area NDA may include a plurality of pad areas PDA and a common electrode connection portion CPA. The common electrode connection portion CPA may surround the display area DPA, and the plurality of pad areas PDA may be arranged in a shape extending in one direction (e.g., a second direction DR2) on one side of the common electrode connection portion CPA. A plurality of pads PD (see FIG. 2) electrically connected (e.g., electrically coupled) to an external device are provided in the pad area PDA, and common electrodes CE (see FIG. 2) electrically connected to a plurality of light emitting elements ED (see FIG. 3) in the display area DPA are provided at the common electrode connection portion CPA. In the drawing, the pad areas PDA at both sides of the display area DPA in the first direction DR1 are illustrated as the pad areas PDA on the outer side of the common electrode connection portion CPA in the non-display area NDA. However, the disclosure is not limited thereto, and a larger or a smaller number of pad areas PDA may be provided. Further, in some embodiments, a display device 10 may further include a pad area PDA in an inner non-display area located inside of the common electrode connection portion CPA in the non-display area NDA.

Figure 2:
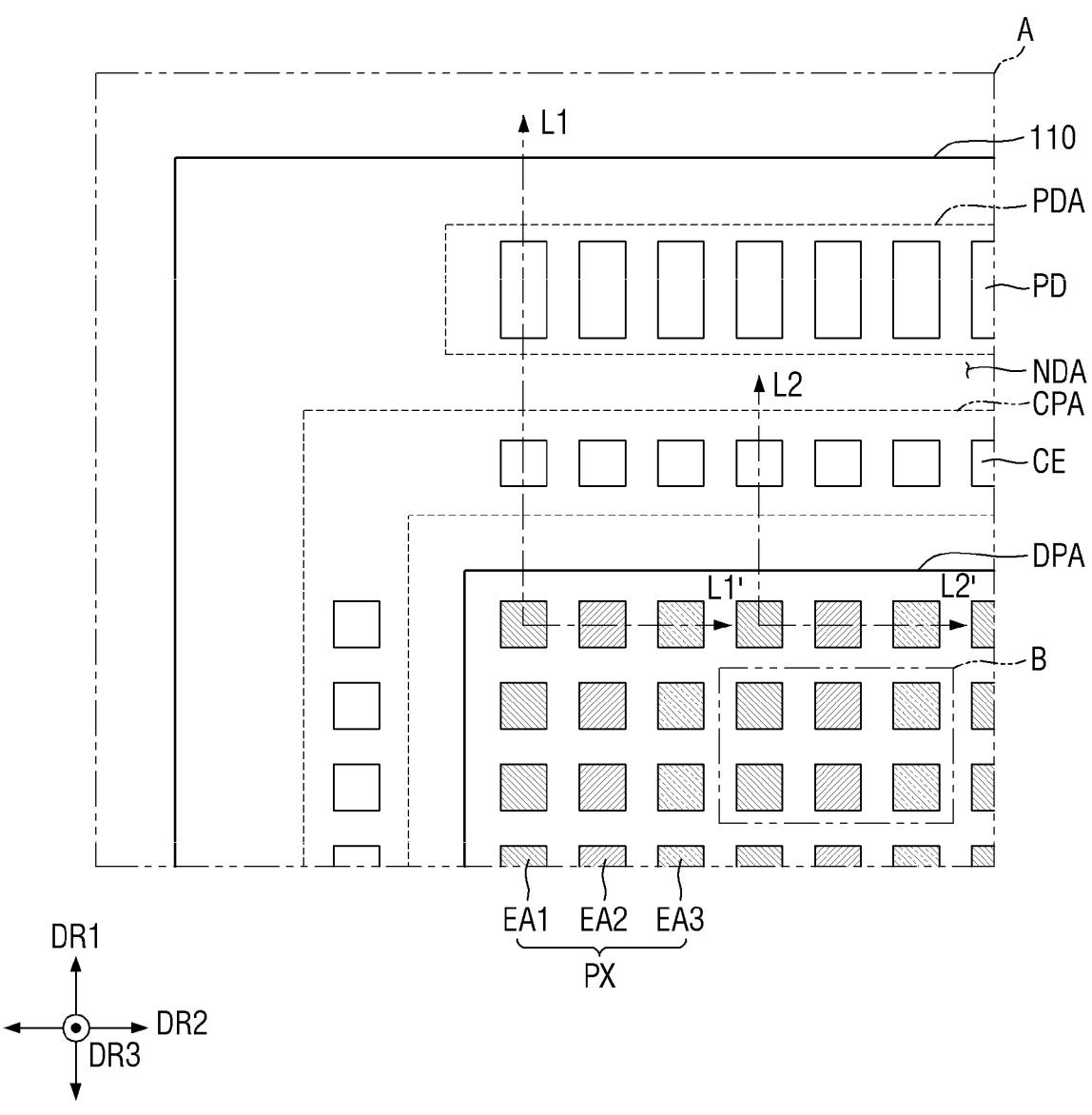
FIG. 2 is a plan view of part A of FIG. 1.
Figure 3:
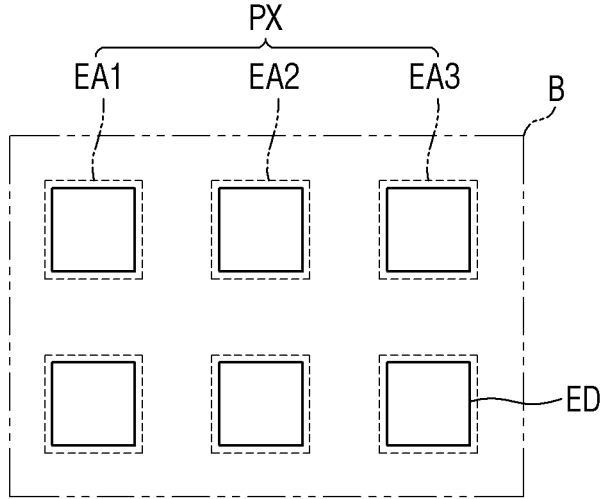
FIG. 3 is a plan view of part B of FIG. 2.
Figure 3:
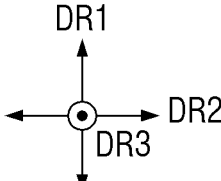

FIG. 2 is a plan view of part A of FIG. 1. FIG. 3 is a plan view of part B of FIG. 2. FIG. 2 is an enlarged view of a part of each of the display area DPA, the pad area PDA, and the common electrode connection portion CPA of the display device 10, and FIG. 3 shows the planar arrangement of some pixels PX in the display area DPA.

Referring to FIGS. 2 and 3, the display area DPA of the display device 10 may include a plurality of pixels PX. The plurality of pixels PX may be arranged in a matrix. The shape of each pixel PX may be a rectangular or square shape in plan view. However, the disclosure is not limited thereto, and it may be a rhombic shape in which each side is inclined with respect to one direction. The pixels PX may be arranged in a stripe pattern or arrangement, and/or an island pattern or arrangement. In one or more embodiments, each of the pixels PX may include one or more light emitting elements that emit light of a set or specific wavelength band to display a set or specific color.

Each of the plurality of pixels PX may include a plurality of emission areas EA1, EA2, and EA3. In the display device 10, one pixel PX including the plurality of emission areas EA1, EA2, and EA3 may each be a minimum light emitting unit.

For example, one pixel PX may include a first emission area EA1, a second emission area EA2, and a third emission area EA3. The first emission area EA1 may emit light of a first color, the second emission area EA2 may emit light of a second color, and the third emission area EA3 may emit light of a third color. For example, the first color may be red, the second color may be green, and the third color may be blue. However, the disclosure is not limited thereto, and the emission areas EA1, EA2, and EA3 may emit light of the same color. In one or more embodiments, one pixel PX may include three emission areas EA1, EA2, and EA3, but the disclosure is not limited thereto. For example, one pixel PX may include four or more emission areas.

Each of the plurality of emission areas EA1, EA2, and EA3 may include a light emitting element ED that emits light of a set or specific color. Although the light emitting element ED having a rectangular planar shape is illustrated, the embodiments of this specification are not limited thereto. For example, the light emitting element ED may have a polygonal shape other than a square shape, a circular shape, an elliptical shape, and/or an atypical (e.g., irregular) shape.

The plurality of emission areas EA1, EA2, and EA3 may be arranged in the first direction DR1 and the second direction DR2, and the first emission area EA1, the second emission area EA2, and the third emission area EA3 may be arranged alternately with the each other in the first direction DR1. Because the plurality of pixels PX are arranged in the first direction DR1 and the second direction DR2, the first emission area EA1, the second emission area EA2, and the third emission area EA3 may be independently sequentially arranged in the first direction DR1, and such arrangement may be repeated. Further, the first emission area EA1, the second emission area EA2, and the third emission area EA3 may be repeatedly arranged with each other in the second direction DR2.

Although it is illustrated in FIGS. 2 and 3 that each of the emission areas EA1, EA2, and EA3 has a square shape in plan view, the disclosure is not limited thereto. The planar shape of each of the emission areas EA1, EA2, and EA3 may be variously suitably modified.

A plurality of common electrodes CE may be provided at the common electrode connection portion CPA of the non-display area NDA. The plurality of common electrodes CE may be spaced apart from each other while surrounding the display area DPA. The common electrode CE may be electrically connected (e.g., electrically coupled) to the plurality of light emitting elements ED in the display area DPA. Further, the common electrode CE may be electrically connected to a semiconductor circuit board.

Although it is illustrated in the drawing that the common electrode connection portion CPA surrounds both sides of the display area DPA in the first direction DR1 and the second direction DR2, the disclosure is not limited thereto. The planar arrangement of the common electrode connection portion CPA may vary depending on the arrangement of the common electrodes CE. For example, when the common electrodes CE are arranged in one direction on one side of the display area DPA, the common electrode connection portion CPA may have a planar shape extending in one direction.

The plurality of pads PD may be arranged in the pad area PDA. Each of the pads PD may be electrically connected to a circuit board pad PDC (see FIG. 4) provided at an external circuit board CB (see FIG. 4). The plurality of pads PD may be spaced apart from each other in the second direction DR2 in the pad area PDA.

The arrangement of the pads PD may be designed depending on the number of light emitting elements ED in the display area DPA and the arrangement of wires electrically connected thereto. The arrangement of the pads PD may be variously suitably modified depending on the arrangement of the light emitting elements ED and the arrangement of the wires electrically connected thereto.

Figure 4:
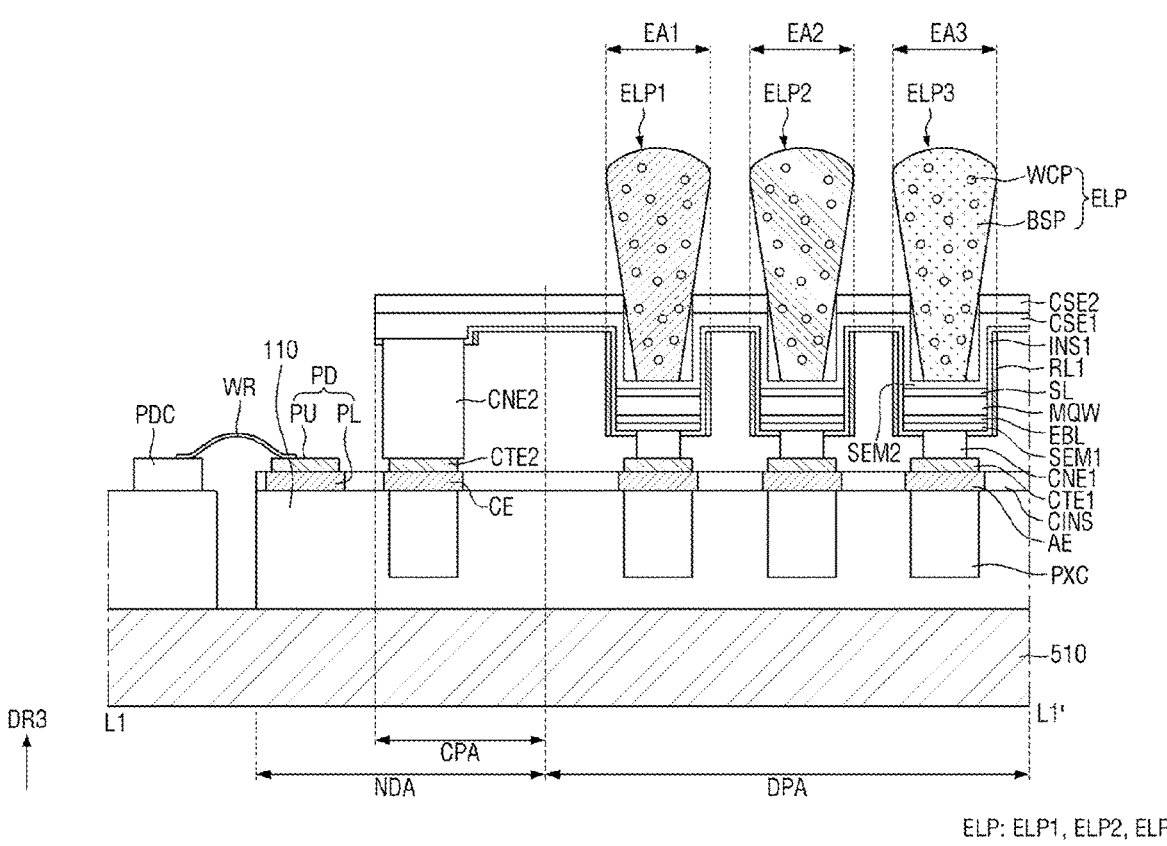
FIG. 4 is a cross-sectional view taken along line L1-L1' of FIG. 2.
Figure 5:
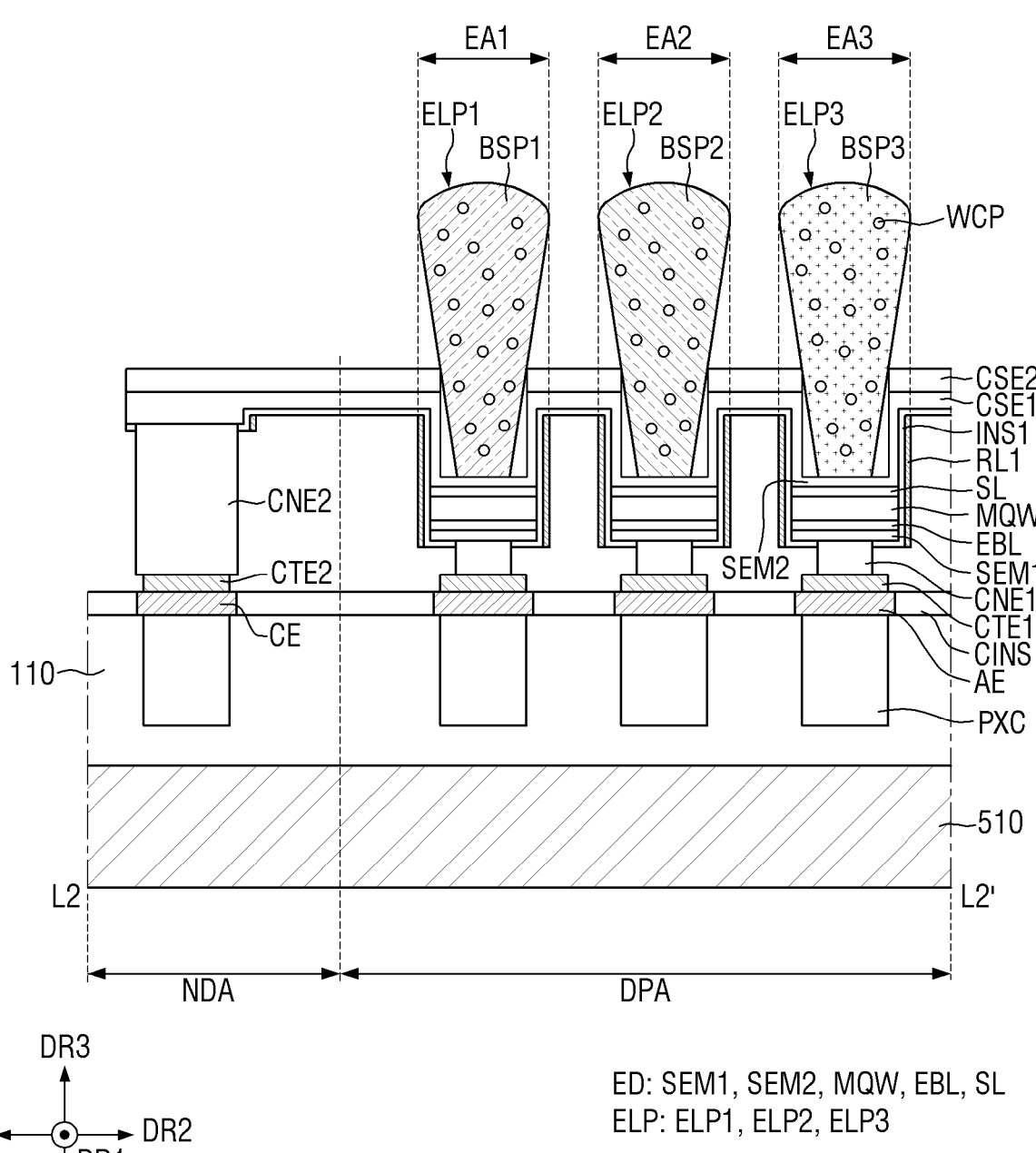
FIG. 5 is a cross-sectional view taken along line L2-L2' of FIG. 2.
Figure 6:
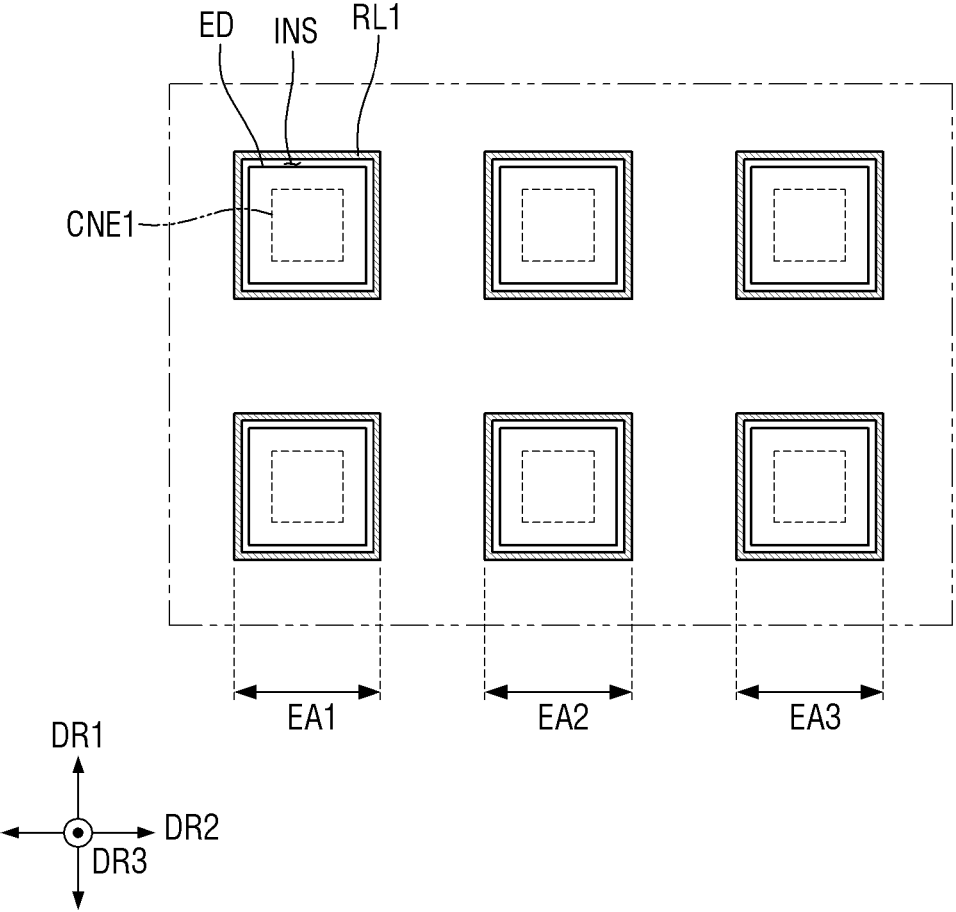
FIG. 6 is a plan view showing the arrangement of light emitting elements of a display device according to one or more embodiments.
Figure 7:
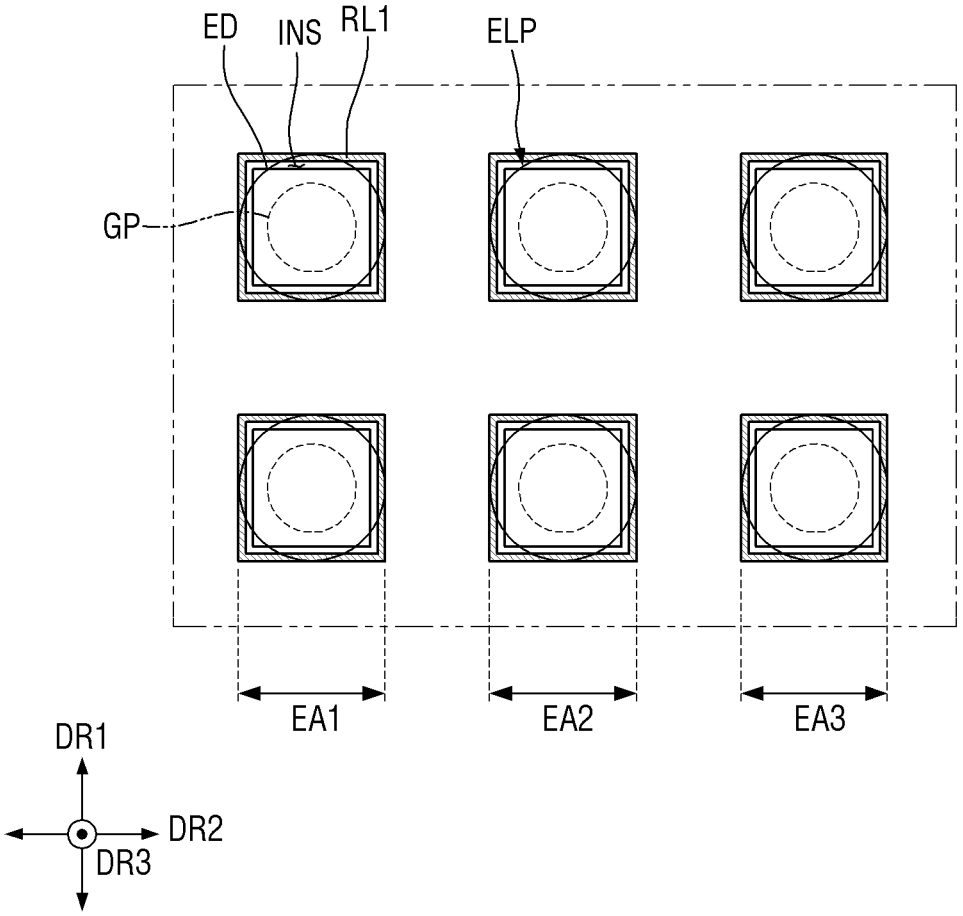
FIG. 7 is a plan view showing the arrangement of light output patterns of a display device according to one or more embodiments.

FIG. 4 is a cross-sectional view taken along line L1-L1' of FIG. 2. FIG. 5 is a cross-sectional view taken along line L2-L2' of FIG. 2. FIG. 6 is a plan view showing the arrangement of light emitting elements of a display device according to one or more embodiments. FIG. 7 is a plan view showing the arrangement of light output patterns of a display device according to one or more embodiments. FIG. 4 shows a cross section taken across the pad area PDA, the common electrode connection portion CPA, and one pixel PX of the display area DPA. FIG. 5 shows a cross section taken across the common electrode connection portion CPA and the light emitting elements ED of one pixel PX. FIGS. 6 and 7 schematically show the planar arrangement of the light emitting elements ED and light output patterns ELP.

Referring to FIGS. 4 to 7 in conjunction with FIGS. 1 to 3, the display device 10 according to one or more embodiments may include a first substrate 110, the plurality of light emitting elements ED, and the plurality of light output patterns ELP. Further, the display device 10 may further include a circuit board CB, and a heat dissipation substrate 510 below a first substrate 110.

The first substrate 110 may be a semiconductor circuit substrate. The first substrate 110 may be a silicon wafer substrate formed by a semiconductor process and may include a plurality of pixel circuit units PXC. Each of the pixel circuit units PXC may be formed by a process of forming a semiconductor circuit on a silicon wafer. Each of the plurality of pixel circuit units PXC may include at least one transistor and at least one capacitor formed by the semiconductor process. For example, the plurality of pixel circuit units PXC may include a CMOS circuit.

The plurality of pixel circuit units PXC may be provided in the display area DPA and the non-display area NDA. Among the plurality of pixel circuit units PXC, each of the pixel circuit units PXC in the display area DPA may be electrically connected to a pixel electrode AE. The plurality of pixel circuit units PXC in the display area DPA may correspond to a plurality of pixel electrodes AE, respectively, and may overlap the light emitting elements ED in the display area DPA in a third direction DR3 that is a thickness direction.

Among the plurality of pixel circuit units PXC, each of the pixel circuit units PXC in the non-display area NDA may be electrically connected to the common electrode CE. The plurality of pixel circuit units PXC in the non-display area NDA may correspond to the plurality of common electrodes CE, respectively, and may overlap the common electrode CE and a second connection electrode CNE2 in the non-display area NDA in the third direction DR3.

A circuit insulating layer CINS may be positioned on the plurality of pixel circuit units PXC. The circuit insulating layer CINS may protect the plurality of pixel circuit units PXC, and may flatten the step portions of the plurality of pixel circuit units PXC. The circuit insulating layer CINS may expose a part of each of the pixel electrodes AE to electrically connect the pixel electrodes AE to first connection electrodes CNE1. The circuit insulating layer CINS may include an inorganic insulating material such as silicon oxide ($SiO_x$), silicon nitride ($SiN_x$), silicon oxynitride ($SiO_xN_y$), aluminum oxide ($AlO_z$), and/or aluminum nitride ($AlN_x$).

The plurality of pixel electrodes AE may be provided in the display area DPA, and each of them may be on the pixel circuit unit PXC corresponding thereto. Each of the pixel electrodes AE may be an exposed electrode that is formed integrally with the pixel circuit unit PXC and exposed from the pixel circuit unit PXC. The plurality of common electrodes CE may be provided at the common electrode connection portion CPA in the non-display area NDA, and each of them may be on the pixel circuit unit PXC corresponding thereto. The common electrode CE may be an exposed electrode that is formed integrally with the pixel circuit unit PXC and exposed from the pixel circuit unit PXC. Each of the pixel electrode AE and the common electrode CE may contain a metal material such as aluminum (Al).

Each of a plurality of electrode connection portions CTE1 and CTE2 may be on the pixel electrode AE or the common electrode CE. Each of the first electrode connection portions CTE1 may be on the pixel electrode AE in the display area DPA. The first electrode connection portions CTE1 may correspond to different pixel electrodes AE, respectively. Each of the second electrode connection portions CTE2 may be at the common electrode connection portion CPA in the non-display area NDA to surround the display area DPA, and may be on the common electrode CE.

In one or more embodiments, each of the electrode connection portions CTE1 and CTE2 may be directly on the pixel electrode AE or the common electrode CE. Each of the electrode connection portions CTE1 and CTE2 may be electrically connected to the pixel electrode AE or the common electrode CE, and the light emitting element ED. Further, the second electrode connection portion CTE2 may be electrically connected to any one of the plurality of pads PD through the pixel circuit unit PXC formed in the non-display area NDA.

Each of the electrode connection portions CTE1 and CTE2 may contain a material that allows electrical connection with the pixel electrode AE or the common electrode CE, and the light emitting elements ED. For example, each of the electrode connection portions CTE1 and CTE2 may contain at least one of gold (Au), copper (Cu), aluminum (Al), and/or tin (Sn). In one or more embodiments, each of the electrode connection portions CTE1 and CTE2 may include a first layer containing any one of gold (Au), copper (Cu), aluminum (Al), and/or tin (Sn), and a second layer containing another one of gold (Au), copper (Cu), aluminum (Al), and/or tin (Sn).

The plurality of pads PD are provided in the pad area PDA in the non-display area NDA. The plurality of pads PD are spaced apart from the common electrode CE and the second electrode connection portion CTE2. The plurality of pads PD may be spaced apart from the common electrode CE in the second direction DR2 and may be positioned toward the outer side of the non-display area NDA.

Each of the pads PD may include a pad base layer PL and a pad upper layer PU. The pad base layer PL may be on the first substrate 110, and the circuit insulating layer CINS may expose the pad base layer PL. The pad upper layer PU may be directly on the pad base layer PL.

Each of the plurality of pads PD may be electrically connected to the circuit board pad PDC of the circuit board CB. The plurality of pads PD may be electrically connected to the circuit board pad PDC through a conductive line such as a wire WR. However, the disclosure is not limited thereto, and the plurality of pads PD may be electrically connected to the circuit board pad PDC through via holes penetrating the first substrate 110.

The circuit board CB may be a flexible printed circuit board (FPCB), a printed circuit board (PCB), a flexible printed circuit (FPC), and/or a flexible film such as a chip on film (COF).

The heat dissipation substrate 510 may be positioned on the lower side of the first substrate 110 that is the surface opposite to a surface where the light emitting elements ED are positioned. The heat dissipation substrate 510 may substantially have a shape similar to that of the first substrate 110 and may be in contact with the lower side of the first substrate 110. In accordance with one or more embodiments, the heat dissipation substrate 510 may be positioned such that at least a part of the heat dissipation substrate 510 overlaps the display area DPA of the display device 10 in the thickness direction and another part of the heat dissipation substrate 510 overlaps the non-display area NDA. The heat dissipation substrate 510 may contain a material having high thermal conductivity and thus may effectively or suitably release the heat generated by the light emitting elements ED and the circuit board CB. For example, the heat dissipation substrate 510 may be made of a metal material having high thermal conductivity, such as tungsten (W), aluminum (Al), and/or copper (Cu).

In one or more embodiments, the heat dissipation substrate 510 may be partially on the bottom surface of the circuit board CB and may be in contact with the circuit board CB. However, the disclosure is not limited thereto. In some embodiments, the heat dissipation substrate 510 may have a structure capable of effectively or suitably releasing the heat generated by the display device 10, particularly the heat generated by the light emitting elements ED.

The plurality of light emitting elements ED may be arranged to respectively correspond to the emission areas EA1, EA2, and EA3 in the display area DPA. One light emitting element ED may correspond to one of the emission areas EA1, EA2, and EA3.

The light emitting element ED may be provided on the first electrode connection portion CTE1 in the display area DPA. The light emitting element ED may be an inorganic light emitting diode having a shape extending in one direction. The light emitting element ED may have a cylindrical shape that is longer in a width than in a height, a disc shape, and/or a rod shape. However, the disclosure is not limited thereto, and the light emitting element ED may have various suitable shapes, such as a rod shape, a wire shape, a tube shape, a polygonal prism shape such as a regular cube, a rectangular parallelepiped and/or a hexagonal prism, and/or a shape extending in one direction and having a partially inclined outer surface.

In accordance with one or more embodiments, the light emitting element ED may include the first connection electrode CNE1, a first semiconductor layer SEM1, an electron blocking layer EBL, an active layer MQW, a superlattice layer SL, and a second semiconductor layer SEM2. The first connection electrode CNE1, the first semiconductor layer SEM1, the electron blocking layer EBL, the active layer MQW, the superlattice layer SL, and the second semiconductor layer SEM2 may be sequentially stacked in the third direction DR3.

The first connection electrode CNE1 may be on the first electrode connection portion CTE1. The first connection electrode CNE1 may be in direct contact with the first electrode connection portion CTE1, and may transmit the light emitting signal applied to the pixel electrode AE to the light emitting element ED. The first connection electrode CNE1 may be an ohmic connection electrode. However, the disclosure is not limited thereto, and it may be a Schottky connection electrode. The light emitting element ED may include at least one first connection electrode CNE1.

When the light emitting element ED is electrically connected to the electrode connection portions CTE1 and CTE2, the first connection electrode CNE1 may reduce a resistance due to the contact between the light emitting element ED and the electrode connection portions CTE1 and CTE2. The first connection electrode CNE1 may contain a conductive metal. For example, the first connection electrode CNE1 may contain at least one of gold (Au), copper (Cu), tin (Sn), titanium (Ti), aluminum (Al), and/or silver (Ag). For example, the first connection electrode CNE1 may contain a 9:1 alloy, a 8:2 alloy or a 7:3 alloy of gold and tin, or may contain an alloy (SAC305) of copper, silver, and tin.

The first semiconductor layer SEM1 may be on the first connection electrode CNE1. The first semiconductor layer SEM1 may be a p-type semiconductor, and may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of p-type doped AlGaInN, GaN, AlGaN, InGaN, AlN and/or InN. The first semiconductor layer SEM1 may be doped with a p-type dopant, and the p-type dopant may be Mg, Zn, Ca, Se, Ba, and/or the like. For example, the first semiconductor layer SEM1 may be p-GaN doped with p-type Mg.

The electron blocking layer EBL may be on the first semiconductor layer SEM1. The electron blocking layer EBL may prevent or reduce the injection of electrons that flow into the active layer MQW into another layer, without being recombined with holes in the active layer MQW. For example, the electron blocking layer EBL may be p-AlGaN doped with p-type Mg. The thickness of the electron blocking layer EBL may be within a range of 10 nm to 50 nm, but the disclosure is not limited thereto. In some embodiments, the electron blocking layer EBL may be omitted.

The active layer MQW may be on the electron blocking layer EBL. The active layer MQW may emit light due to recombination of the electrons and the holes in response to the light emitting signal applied through the first semiconductor layer SEM1 and the second semiconductor layer SEM2. In one or more embodiments, the light emitting element ED of the display device 10 may emit light of a third color, for example, blue light, in which the active layer MQW has a central wavelength band of 450 nm to 495 nm.

The active layer MQW may include a material having a single or multiple quantum well structure. When the active layer MQW contains a material having a multiple quantum well structure, the active layer MQW may have the structure in which a plurality of well layers and barrier layers are alternately laminated. In one or more embodiments, the well layer may be formed of InGaN, and the barrier layer may be formed of GaN and/or AlGaN, but the disclosure is not limited thereto.

For example, the active layer MQW may have a structure in which semiconductor materials having large band gap energy and semiconductor materials having small band gap energy are alternately stacked, and may include other group III to V semiconductor materials according to the wavelength band of the emitted light. The light emitted from the active layer MQW is not limited to the blue light of the third color. In some embodiments, red light of the first color and/or green light of the second color may be emitted.

The superlattice layer SL is on the active layer MQW. The superlattice layer SL may reduce stress resulting from the difference in lattice constant between the second semiconductor layer SEM2 and the active layer MQW. For example, the superlattice layer SL may be formed of InGaN and/or GaN. The thickness of the superlattice layer SL may be about 50 nm to 200 nm. However, the superlattice layer SL may be omitted.

The second semiconductor layer SEM2 may be on the superlattice layer SL. The second semiconductor layer SEM2 may be an n-type semiconductor. The second semiconductor layer SEM2 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of n-type doped AlGaInN, GaN, AlGaN, InGaN, AlN, and/or InN. The second semiconductor layer SEM2 may be doped with an n-type dopant, and the n-type dopant may be Si, Ge, Sn, and/or the like. For example, the second semiconductor layer SEM2 may be n-GaN doped with n-type Si. The thickness of the second semiconductor layer SEM2 may be within a range of 2 µm to 4 µm, but the disclosure is not limited thereto.

In accordance with one or more embodiments, in the plurality of light emitting elements ED of the display device 10, the second semiconductor layers SEM2 may be connected to each other. The second semiconductor layers SEM2 of the plurality of light emitting elements ED may be connected to each other through a first common semiconductor layer CSE1 as a single common layer. The first common semiconductor layer CSE1 may be in the display area DPA and a part of the non-display area NDA while extending in the first direction DR1 and the second direction DR2. The second semiconductor layers SEM2 of the light emitting elements ED may partially protrude from the first common semiconductor layer CSE1 to form patterns spaced apart from each other.

The first common semiconductor layer CSE1 may transmit the light emitting signal applied through the second connection electrode CNE2 and the second electrode connection portion CTE2 to the plurality of light emitting elements ED. As will be described herein below, the second connection electrode CNE2 may be on one surface of the portion of the first common semiconductor layer CSE1 that is in the non-display area NDA, and may be electrically connected to the common electrode CE through the second electrode connection portion CTE2.

A second common semiconductor layer CSE2 is on the second semiconductor layers SEM2 and the first common semiconductor layer CSE1 of the light emitting elements ED. The second common semiconductor layer CSE2 may be in the display area DPA and a part of the non-display area NDA, and may be on the entire first common semiconductor layer CSE1. The second common semiconductor layer CSE2 may be an undoped semiconductor. The second common semiconductor layer CSE2 may contain the same material as that of the second semiconductor layer SEM2, and may contain a material that is not doped with an n-type or p-type dopant. In one or more embodiments, the second common semiconductor layer CSE2 may be, but is not limited to, at least one of undoped InAlGaN, GaN, AlGaN, InGaN, AlN, and/or InN.

Unlike the first common semiconductor layer CSE1, the second common semiconductor layer CSE2 may not have conductivity, and the light emitting signal applied to the pixel electrode AE and the common electrode CE may flow through the light emitting element ED and the first common semiconductor layer CSE1. In the manufacturing process of the light emitting element ED, the first common semiconductor layer CSE1 and the plurality of light emitting elements ED may be formed on the second common semiconductor layer CSE2.

A plurality of second connection electrodes CNE2 may be provided at the common electrode connection portion CPA in the non-display area NDA. The second connection electrode CNE2 may be on one surface of the first common semiconductor layer CSE1. Further, the second connection electrode CNE2 may be directly on the second electrode connection portion CTE2, and may transmit the light emitting signal applied from the common electrode CE to the light emitting element ED. The second connection electrode CNE2 may be made of the same material as that the first connection electrodes CNE1. The thickness of the second connection electrode CNE2 in the third direction DR3 may be greater than the thickness of the first connection electrode CNE1.

A first insulating layer INS1 may be provided on one surface of the first common semiconductor layer CSE1 and the side surfaces of the light emitting elements ED. The first insulating layer INS1 may surround at least the light emitting elements ED. The portions of the first insulating layer INS1 surrounding the light emitting elements ED may respectively correspond to the light emitting elements ED, and thus may be spaced apart from each other in the first direction DR1 and the second direction DR2 in plan view. The first insulating layer INS1 may protect each of the plurality of light emitting elements ED, and may insulate the first common semiconductor layer CSE1 and the light emitting elements ED from other layers. The first insulating layer INS1 may include an inorganic insulating material such as silicon oxide ($SiO_x$), silicon nitride ($SiN_x$), silicon oxynitride ($SiO_xN_y$), aluminum oxide ($AlO_y$), and/or aluminum nitride ($AlN_x$).

A first reflective layer RL1 may surround the side surfaces of the plurality of light emitting elements ED. The first reflective layer RL1 may correspond to each of the emission areas EA1, EA2, and EA3 in the display area DPA, and may be directly on the first insulating layer INS1 on the side surface of the light emitting element ED. Because the first reflective layers RL1 surrounds the light emitting elements ED spaced apart from each other while corresponding thereto, different first reflective layers RL1 may be spaced apart from each other in the first direction DR1 and the second direction DR2 in plan view. The first reflective layer RL1 may reflect the lights emitted from the active layer MQW of the light emitting element ED, and the lights may travel in the upward direction of the first substrate 110.

The first reflective layer RL1 may contain a metal material having high reflectivity such as aluminum (Al). The thickness of the first reflective layer RL1 may be about 0.1 µm, but is not limited thereto.

The plurality of light output patterns ELP may be respectively on the light emitting elements ED. The plurality of light output patterns ELP may respectively correspond to different emission areas EA1, EA2, and EA3, and one light output pattern ELP may correspond to one light emitting element ED. The plurality of light output patterns ELP may respectively overlap the light emitting elements ED in the thickness direction.

The light output patterns ELP may include a first light output pattern ELP1 to correspond to the first emission area EA1, a second light output pattern ELP2 to correspond to the second emission area EA2, and a third light output pattern ELP3 to correspond to the third emission area EA3. The light output patterns ELP may be in different emission areas EA1, EA2, and EA3 and may be spaced apart from each other in the first direction DR1 and the second direction DR2. A plurality of first light output patterns ELP1 may be spaced apart from each other in the first direction DR1, similarly to how the first emission areas EA1 are spaced apart, and a plurality of second light output patterns ELP2 and a plurality of third light output patterns ELP3 may also be spaced apart from each other in the first direction DR1, similarly to how the second emission area EA2 and the third emission area EA3, respectively, are spaced apart. The first light output patterns ELP1, the second light output patterns ELP2, and the third light output patterns ELP3 may be sequentially spaced apart from each other in the second direction DR2, and may be repeatedly arranged using this arrangement as a basic unit.

In accordance with one or more embodiments, the light output pattern ELP may convert the light emitted from the light emitting element ED into light of another wavelength band. The light output pattern ELP may contain wavelength conversion particles WCP dispersed in a base portion BSP.

The wavelength conversion particles WCP may be dispersed in the base portion BSP of the light output pattern ELP, and may convert the wavelength band of the light emitted from the light emitting element ED. In the embodiments in which the light emitting element ED emits blue light of a third color, the wavelength conversion particles WCP of the light output pattern ELP may convert at least a part of the light emitted from the light emitting element ED into yellow light of a fourth color. The wavelength conversion particles WCP may be materials that convert blue light of the third color into yellow light of the fourth color. The wavelength conversion particles WCP may be quantum dots, quantum rods, and/or fluorescent substances. Examples of the quantum dot may include group IV nanocrystal, group II-VI compound nanocrystal, group III-V compound nanocrystal, group IV-VI nanocrystal, and combinations thereof.

A part of the light of the third color emitted from the light emitting element ED may be converted into the yellow light of the fourth color by the wavelength conversion particles WCP, and the mixed light of the light of the third color and the light of the fourth color may be generated in the light output pattern ELP. As will be described herein below, the base portion BSP of the light output pattern ELP may transmit only a part of the mixed light of the light of the third color and the light of the fourth color, and may block or reduce the transmission of other lights.

Further, each of the light output pattern ELP may further include a scatterer dispersed in the base portion BSP. The scatterer may be a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin, urethane resin, and the like.

The content of the wavelength conversion particles WCP contained in the light output pattern ELP increases as the thickness of the light output pattern ELP in the third direction DR3 increases, so that the light conversion efficiency of the light output pattern ELP may be increased. The thickness of the light output pattern ELP may be designed in consideration of the light conversion efficiency of the wavelength conversion particles WCP and the output angles of the lights emitted from a second surface S2 as described above.

Each of the light output patterns ELP may block or reduce the transmission of some of the incident lights. In accordance with one or more embodiments, the base portions BSP of the light output patterns ELP may contain a material that blocks or reduces the transmission of some of the incident lights. The plurality of light output patterns ELP may be color filters that transmit only some of the lights emitted from the light emitting element ED.

For example, the first light output pattern ELP1 in the first emission area EA1 may be a red color filter that blocks or reduces the transmission of lights other than the light of a red wavelength band. A first base portion BSP1 of the first light output pattern ELP1 may contain a colorant such as a dye or a pigment that absorbs lights other than the red light of the first color. Similarly, the second light output pattern ELP2 in the second emission area EA2 may be a green color filter that blocks or reduces the transmission of lights other than the light of the green wavelength band, and the third light output pattern ELP3 in the third emission area EA3 may be a blue color filter that blocks or reduces the transmission of lights other than the light of the blue wavelength band. A second base portion BSP2 of the second light output pattern ELP2 may contain a colorant such as a dye or a pigment that absorbs lights other than the green light of the second color, and a third base portion BSP3 of the third light output pattern ELP3 may include a colorant such as a dye or a pigment that absorbs lights other than the blue light of the third color.

The light output patterns ELP may guide the lights emitted from the light emitting element ED and transmit only some of the lights, and may block or reduces the transmission of other lights. The emission areas EA1, EA2, and EA3 may emit lights of different colors depending on the colorant contained in the base portion BSP of the light output pattern ELP.

However, in the embodiments in which the lights emitted from the plurality of light emitting elements ED have different colors, the light output pattern ELP may not contain the wavelength conversion particles WCP. In this case, each light output pattern ELP may perform only the function of the color filter.

In accordance with one or more embodiments, the display device 10 may include a plurality of grooves GP formed to respectively correspond to the light emitting elements ED, and the light output patterns ELP may be respectively positioned in the plurality of grooves GP. In one example, the groove GP may be formed in the second semiconductor layer SEM2 of the light emitting element ED, and the light output pattern ELP may be partially positioned in the groove GP.

Figure 8:
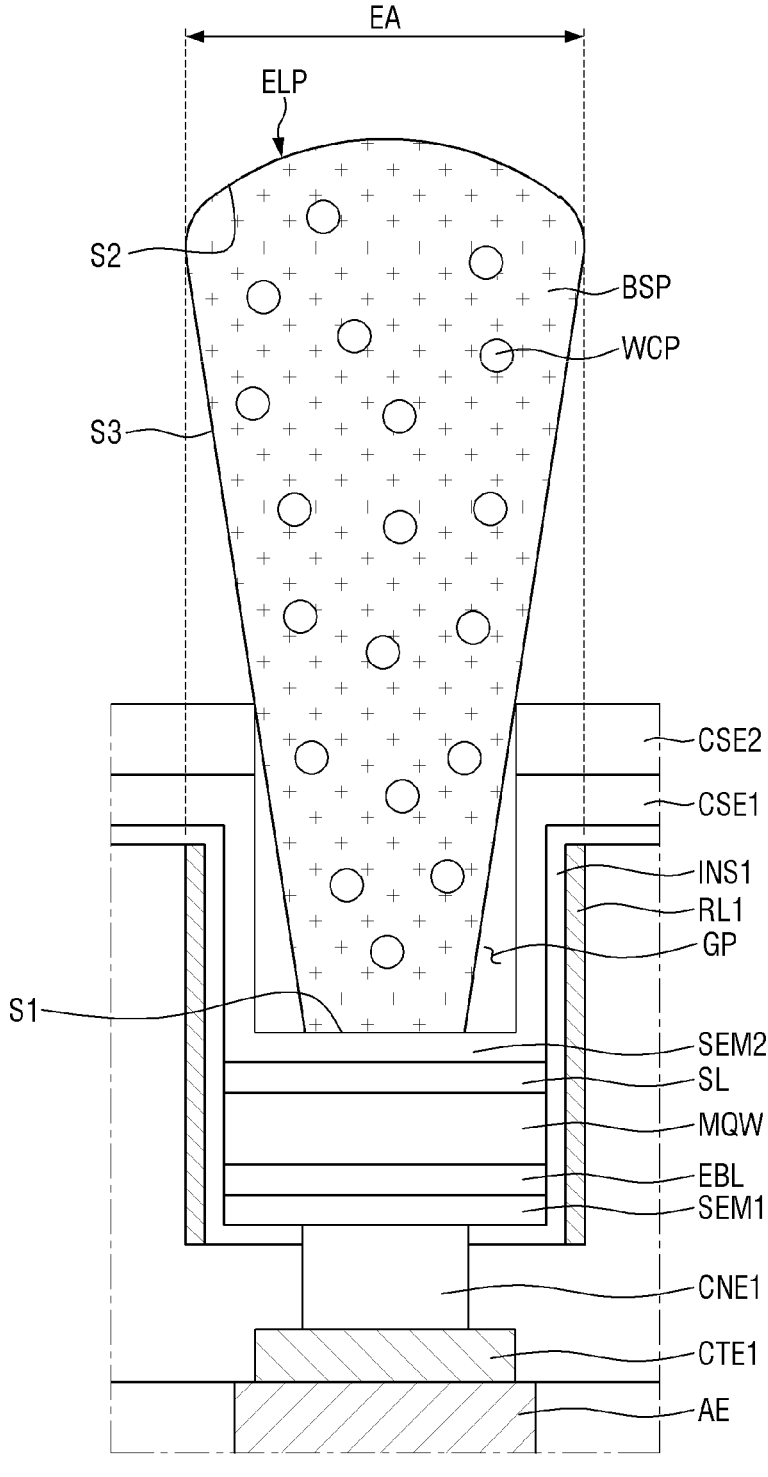
FIG. 8 is an enlarged cross-sectional view showing the light emitting element and the light output pattern of a display device according to one or more embodiments.

FIG. 8 is an enlarged cross-sectional view showing the light emitting element and the light output pattern of a display device according to one or more embodiments.

Referring to FIG. 8 in addition to FIGS. 4 to 7, the display device 10 may include the plurality of grooves GP in which the top surfaces of the second semiconductor layers SEM2 of the light emitting elements ED are partially recessed. The groove GP may penetrate the first common semiconductor layer CSE1 and the second common semiconductor layer CSE2 and may be formed such that the top surface of the second semiconductor layer SEM2 is partially recessed. The groove GP may have a thickness that is enough to prevent complete removal of the second semiconductor layer SEM2 of the light emitting element ED, and the bottom surface of the light output pattern ELP may be in direct contact with the second semiconductor layer SEM2. Further, a width W1 of the groove GP may be smaller than a width W2 of the second semiconductor layer SEM2 of the light emitting element ED, and the side surface of the light output pattern ELP may be in direct contact with the second semiconductor layer SEM2. The groove GP may be formed such that a part of the top surface of the second semiconductor layer SEM2 is recessed, and the second semiconductor layer SEM2 may be formed such that a part of the second semiconductor layer SEM2 surrounds the groove GP. The side surfaces of the second semiconductor layer SEM2 may be connected to the first common semiconductor layer CSE1 while surrounding the groove GP. The second semiconductor layer SEM2 of each of the light emitting elements ED may be electrically connected to the second connection electrode CNE2 through the first common semiconductor layer CSE1.

The plurality of grooves GP may be formed by the process of etching a part of the second semiconductor layers SEM2 of the light emitting elements ED in the manufacturing process of the display device 10. Although the second semiconductor layers SEM2 of the light emitting elements ED may be formed to have a thickness greater than thicknesses of other layers, the thickness of the second semiconductor layers SEM2 may be reduced by the process of forming the groove GP after they are formed on the first substrate 110. The thickness of the portion of the second semiconductor layer SEM2 on the superlattice layer SL may be smaller than the height of the side surface of the second semiconductor layer SEM2. Further, the thickness of the side surface of the second semiconductor layer SEM2 surrounding the groove GP may be smaller than the height of the side surface.

In accordance with one or more embodiments, the light output pattern ELP may guide the traveling path of the light such that the light emitted from the light emitting element ED travels in a set or specific direction. The light output pattern ELP may be made of a material capable of transmitting light and having a high refractive index. The lights emitted from the light emitting element ED may travel in the light output pattern ELP and then may be emitted in the upward direction of the first substrate 110. In accordance with one or more embodiments, the light output pattern ELP may include a lens type (e.g., a lens-like) light output portion to guide the light emitted from the light emitting element ED in a set or specific direction.

The light output pattern ELP may have a height greater than the depth of the groove GP, and may be partially positioned in the groove GP and partially protrude upward from the second common semiconductor layer CSE2. The light output pattern ELP may include a first surface S1 facing the active layer MQW of the light emitting element ED, the second surface S2 that is the top surface opposite to the first surface S1, and a third surface S3 that is the side surface connecting the first surface S1 and the second surface S2. The first surface S1 that is the bottom surface of the portion of the light output pattern ELP in the groove GP may be a light receiving surface on which the light emitted from the light emitting element ED is incident, and the second surface S2 that is the top surface of the portion of the light output pattern ELP protruding upward from the second common semiconductor layer CSE2 may be a light output surface from which the incident light is emitted. Further, the third surface S3 that is the side surface of the light output pattern ELP may form the reflective surface that guides the incident light to travel to the top surface without being emitted from the side surface.

Figure 9:
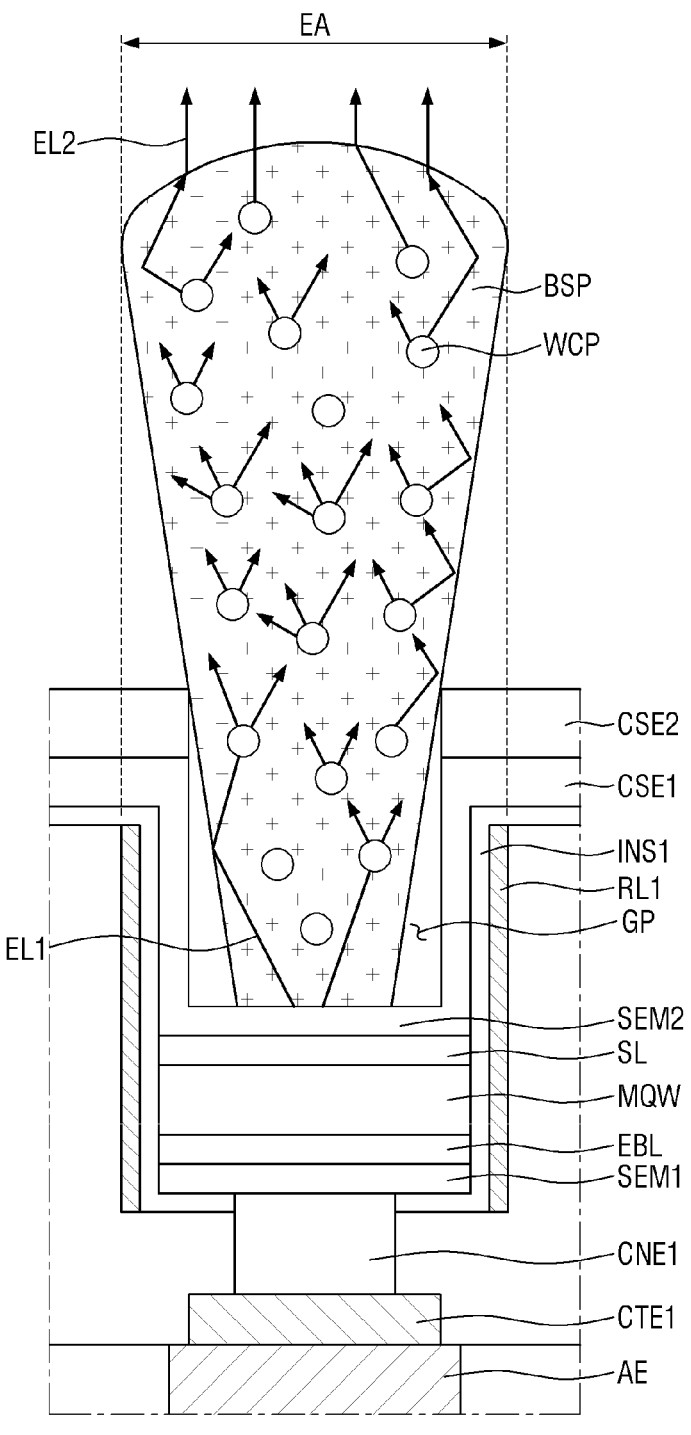
FIG. 9 is a diagram schematically illustrating that lights emitted from the light emitting element of FIG. 8 are emitted through an output pattern.

The first surface S1 that is the surface facing the active layer MQW of the light emitting element ED may be directly on the second semiconductor layer SEM2. The first surface S1 of the light output pattern ELP may be adjacent to the active layer MQW while being in direct contact with the second semiconductor layer SEM2. In one or more embodiments, the diameter of the first surface S1 may be smaller than the diameter of the groove GP. As will be described herein below, the third surface S3 that is the side surface of the light output pattern ELP may be inclined such that the diameter increases from the first surface S1 toward the second surface S2. In the light output pattern ELP having the inclined side surface, the diameter of the first surface S1 that is the bottom surface may be smaller than the diameter of the groove GP, so that the light output pattern ELP may be partially inserted into the groove GP. In the display device 10, the first surface S1 of the light output pattern ELP may be as close as possible to the active layer MQW of the light emitting element ED, and most of lights EL1 (see FIG. 9) generated from the active layer MQW of the light emitting element ED may be incident on the first surface S1.

Although the structure in which the first surface S1 is in direct contact with the second semiconductor layer SEM2 is illustrated in the drawing, the disclosure is not limited thereto. In some embodiments, the display device 10 may further include other layers in the groove GP, the structure of the second semiconductor layer SEM2 may be changed, and/or the first surface S1 of the light output pattern ELP may not be in direct contact with the second semiconductor layer SEM2.

The lights EL1 emitted from the light emitting element ED may travel substantially in the upward direction of the first substrate 110. Because the light output pattern ELP is positioned in the groove GP and the first surface S1 is adjacent to the active layer MQW, most of the lights EL1 may be incident on the light output pattern ELP. Some of the lights incident on the light output pattern ELP may be incident on the wavelength conversion particles WCP, and some other lights may be incident on the second surface S2 and/or the third surface S3, without passing through the wavelength conversion particles WCP. The lights incident on the wavelength conversion particles WCP may be emitted after the wavelengths thereof are converted, and then may be incident on other wavelength conversion particles WCP, and/or on the second surface S2 and/or the third surface S3.

The second surface S2 that is the top surface of the light output pattern ELP may be the surface from which the incident lights are emitted. The second surface S2 may have a shape that allows the incident lights to be effectively emitted to the outside. In accordance with one or more embodiments, the light output pattern ELP may have a shape in which the outer surface of the second surface S2 is curved. As described above, the light output pattern ELP may be made of a material having a high refractive index, and the air layer outside the light output pattern ELP may have a refractive index lower than that of the light output pattern ELP. At the interface between the light output pattern ELP having a high refractive index and the outside, total reflection may occur depending on the incident angle of the light. The second surface S2 of the light output pattern ELP may have a curved shape to prevent or reduce the total reflection of the incident light EL1, and most of lights EL2 (see FIG. 9) may be emitted in the upward direction from the second surface S2.

The third surface S3 that is the side surface of the light output pattern ELP may be the reflective surface that prevents or reduces the emission of the incident lights to other adjacent emission areas EA1, EA2, and EA3. The third surface S3 may have a shape that allows the incident lights to be totally reflected without being emitted to the outside. In accordance with one or more embodiments, the third surface S3 of the light output pattern ELP may be inclined or curved, and the lights incident on the third surface S3 may be totally reflected due to the difference in refractive index between the light output pattern ELP and the outside. The light EL1 incident on the third surface S3 of the light output pattern ELP may be totally reflected and travel in the light output pattern ELP, and then may be incident on other wavelength conversion particles WCP, and/or on another portion of the second surface S2 and/or the third surface S3. The light incident on other wavelength conversion particles WCP may be subjected to wavelength conversion, the light incident on another part of the third surface S3 may be totally reflected again, and the light incident on the second surface S2 may be effectively or suitably emitted.

In one or more embodiments, the lights EL1 incident on the light output pattern ELP may be mixed with the lights whose wavelengths are converted by the wavelength conversion particles WCP in the light output pattern ELP. Some of the mixed lights may be incident on other wavelength conversion particles WCP, and/or on the second surface S2 and/or the third surface S3 while travelling in the base portion BSP of the light output pattern ELP. However, some other mixed lights have the wavelength bands in which they are blocked, absorbed, or reduced by the base portion BSP of the light output pattern ELP, and thus may not travel in another direction in the light output pattern ELP. For example, only a part of the lights EL1 incident on the light output pattern ELP and the lights whose wavelengths are converted by the wavelength conversion particles WCP may be emitted from the light output pattern ELP to the outside.

Because the light output patterns ELP respectively correspond to the grooves GP formed in the emission areas EA1, EA2, and EA3, the lights emitted from the light emitting element ED may be emitted through the light output pattern ELP. The light output pattern ELP provided in any one of the emission areas EA1, EA2, and EA3 may prevent or reduce the emission of the incident lights to the other adjacent emission areas EA1, EA2, and EA3, and may guide the lights to be emitted in the upward direction. The light output pattern ELP may guide the light emitted from the light emitting element ED to be emitted in the emission areas EA1, EA2, and EA3, and the display device 10 may prevent or reduce the mixing of colors of the lights emitted from the adjacent emission areas EA1, EA2, and EA3.

In one or more embodiments, the light output pattern ELP having the curved second surface S2 may serve as a lens that guides the incident lights EU to be emitted in a direction perpendicular (or substantially perpendicular) to the top surface of the first substrate 110. In the light output pattern ELP, the curvature of the second surface S2, the distance between the first surface S1 and the second surface S2, and/or the length of the light output pattern ELP may be adjusted to control the traveling direction of the light EL2 emitted from the second surface S2.

Some of the lights EU generated from the active layer MQW of the light emitting element ED and traveling to the light output pattern ELP may have an incident angle in a direction perpendicular (or substantially perpendicular) to the first surface S1, and may travel in the vertical direction in the light output pattern ELP. Some of them may travel to the second surface S2 and be emitted or blocked (or reduced) by the base portion BSP, and some other lights may be incident on the wavelength conversion particles WCP.

Some other lights among the lights incident on the first surface S1 may have an incident angle inclined from a normal line passing through the center of the first surface S1. The lights having a set or specific incident angle may travel in an inclined direction instead of the vertical direction in the light output pattern ELP, or may be totally reflected in an inclined direction on the second surface S2. The lights incident on the interface between the second surface S2 and the outside may be refracted at the interface and emitted. Here, by adjusting the incident angle of the light incident on the interface between the second surface S2 and the outside, the lights EL2 emitted to the outside may be guided to travel in the direction perpendicular (or substantially perpendicular) to the top surface of the first substrate 110.

The incident angle of the light incident on the interface between the second surface S2 and the outside may be determined by adjusting the curvature of the outer surface of the second surface S2 and the thickness of the light output pattern ELP. When the first surface S1 is placed on the focal plane of the second surface S2, the lights EL1 that have passed through the first surface S1 at a set or specific incident angle may be refracted on the interface between the second surface S2 and the outside and emitted in the direction perpendicular (or substantially perpendicular) to the top surface of the first substrate 110. The display device 10 may adjust the length of the light output pattern ELP and the curvature of the second surface S2 to guide the lights EL2 emitted from the light output pattern ELP to be emitted in the direction perpendicular (or substantially perpendicular) to the top surface of the first substrate 110. The display device 10 is advantageous in that the lights emitted from the light emitting element ED are not mixed with the lights of the adjacent emission areas EA1, EA2, and EA3 and the light output efficiency in the upward direction is improved.

The shape of the groove GP and the arrangement of the light output pattern ELP are not limited to those illustrated in FIG. 8. In some embodiments, the width of the groove GP may be the same as that of the second semiconductor layer SEM2 of the light emitting element ED. In this case, the groove GP may be surrounded by the first insulating layer INS1 and the first reflective layer RL1, instead of the second semiconductor layer SEM2. Further, the second semiconductor layer SEM2 may not be connected to the first common semiconductor layer CSE1, and another connection electrode may be further provided in the groove GP and on the second semiconductor layer SEM2. A description of another connection electrode may be understood by referring to the description provided in connection with other embodiments of the present disclosure.

Hereinafter, a manufacturing process of the display device 10 according to one or more embodiments will be described with reference to the drawings.

FIGS. 10 to 14 are cross-sectional views illustrating acts of a process of manufacturing a display device according to one or more embodiments. FIGS. 10 to 14 schematically show acts of the process of forming the light emitting elements ED and the light output patterns ELP.

Figure 10:
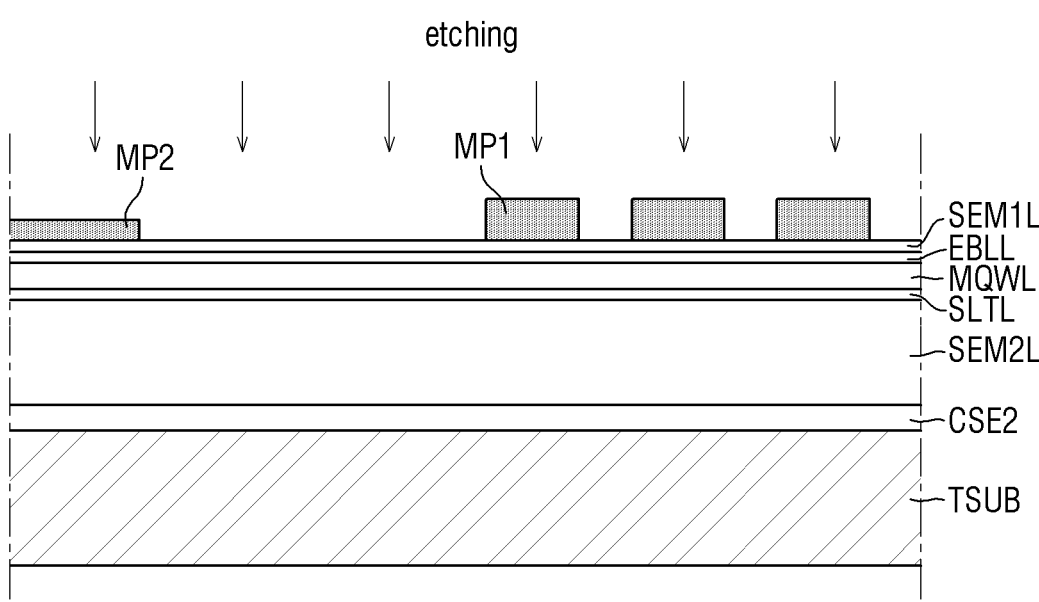
FIGS. 10-14 are cross-sectional views illustrating acts of a process of manufacturing a display device according to one or more embodiments.
Figure 11:
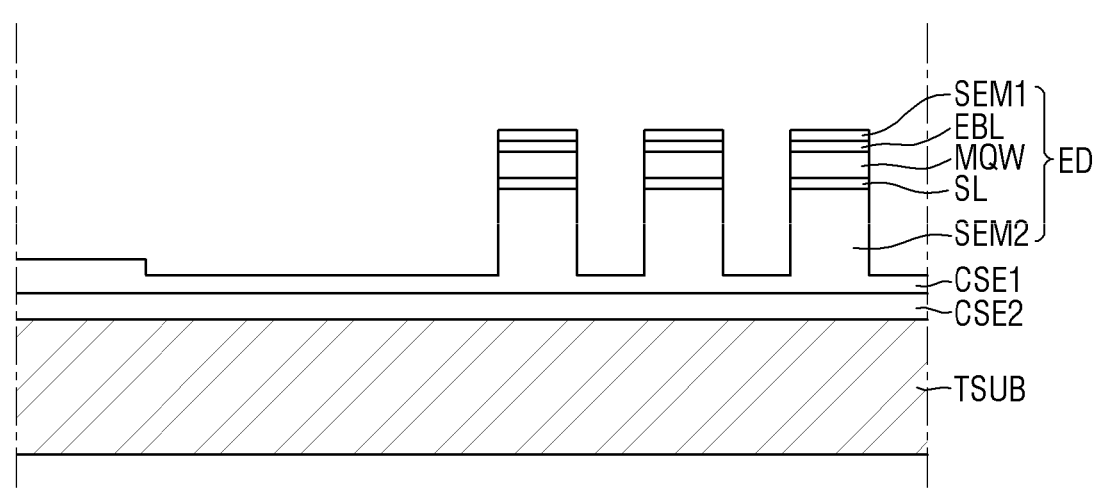

Referring to FIGS. 10 and 11, a plurality of semiconductor material layers CSE2, SEM2L, SLTL, MQML, EBLL, and SEM1L are formed on a target substrate TSUB.

First, the target substrate TSUB is prepared, and the plurality of semiconductor material layers CSE2, SEM2L, SLTL, MQML, EBLL, and SEM1L are sequentially formed on the target substrate TSUB. The semiconductor material layers may be formed by an epitaxial growth method. The method of forming the semiconductor material layer may be electron beam deposition, physical vapor deposition (PVD), chemical vapor deposition (CVD), plasma laser deposition (PLD), dual-type thermal evaporation, sputtering, metal organic chemical vapor deposition (MOCVD), and/or the like.

For example, the second common semiconductor layer CSE2 is formed on the target substrate TSUB. The second common semiconductor layer CSE2 may reduce the difference in lattice constant between the second semiconductor material layer SEM2L and the target substrate TSUB. Next, the second semiconductor material layer SEM2L, the superlattice material layer SLTL, the active material layer MQWL, the electron blocking material layer EBLL, and the first semiconductor material layer SEM1L are sequentially formed on the second common semiconductor layer CSE2.

Next, the plurality of semiconductor material layers SEM2L, SLTL, MQML, EBLL, and SEM1L are etched to form the plurality of light emitting elements ED.

For example, a plurality of first mask patterns MP1 and a second mask pattern MP2 are formed on the first semiconductor material layer SEM1L. The first mask pattern MP1 and the second mask pattern MP2 may be a hard mask containing an inorganic material or a photoresist mask containing an in organic material. The first mask pattern MP1 is formed to have a thickness greater than that of the second mask pattern MP2 to prevent or reduce the risk of etching the plurality of semiconductor material layers SEM2L, SLTL, MQML, EBLL, and SEM1L below the first mask pattern MP1.

A part of the plurality of semiconductor material layers is etched while using the plurality of first mask patterns MP1 and the second mask pattern MP2 as masks. On the target substrate TSUB, the plurality of semiconductor material layers SEM2L, SLTL, MQML, EBLL, and SEM1L may be partially etched and removed, and portions that are not etched may form the light emitting element ED. The etching process of the semiconductor material layers may be any one of a dry etching process and/or a wet etching process, and the etching process is not particularly limited. For example, the process of etching the semiconductor material layers may be performed by a reactive ion etching (RIE) method, a deep reactive ion etching (DRIE) method, an inductively coupled plasma reactive ion etching (ICP-RIE) method, and/or the like. The dry etching method may be suitable for vertical etching because anisotropic etching can be performed. In the case of using the aforementioned etching technique, it may be possible to use $Cl_2$ and/or $O_2$ as an etchant. However, the disclosure is not limited thereto.

The plurality of semiconductor material layers SEM2L, SLTL, MQML, EBLL, and SEM1L overlapping the first mask pattern MP1 may form the plurality of light emitting elements ED without being etched. Here, the second semiconductor material layer SEM2L may form the second semiconductor layers SEM2 of the light emitting elements ED and the first common semiconductor layer CSE1. Among the plurality of semiconductor material layers SEM2L, SLTL, MQML, EBLL, and SEM1L overlapping the second mask pattern MP2, the superlattice material layer SLTL, the active material layer MQWL, the electron blocking material layer EBLL, and the first semiconductor material layer SEM1L may be etched and removed by etching the second mask pattern MP2, and a part of the second semiconductor material layer SEM2L and the second common semiconductor layer CSE2 may remain without being etched. Among the plurality of semiconductor material layers SEM2L, SLTL, MQML, EBLL, and SEM1L that do not overlap the mask patterns MP1 and MP2, the superlattice material layer SLTL, the active material layer MQWL, the electron blocking material layer EBLL, and the first semiconductor material layer SEM1L may be etched and removed, and a part of the second semiconductor material layer SEM2L and the second common semiconductor layer CSE2 may remain without being etched by adjusting the etching process. For example, at the edge of the target substrate TSUB, the thickness of the second semiconductor material layer SEM2L may be relatively greater than that in the adjacent region to set the position where the second connection electrode CNE2 to be described herein below will be positioned.

Figure 12:
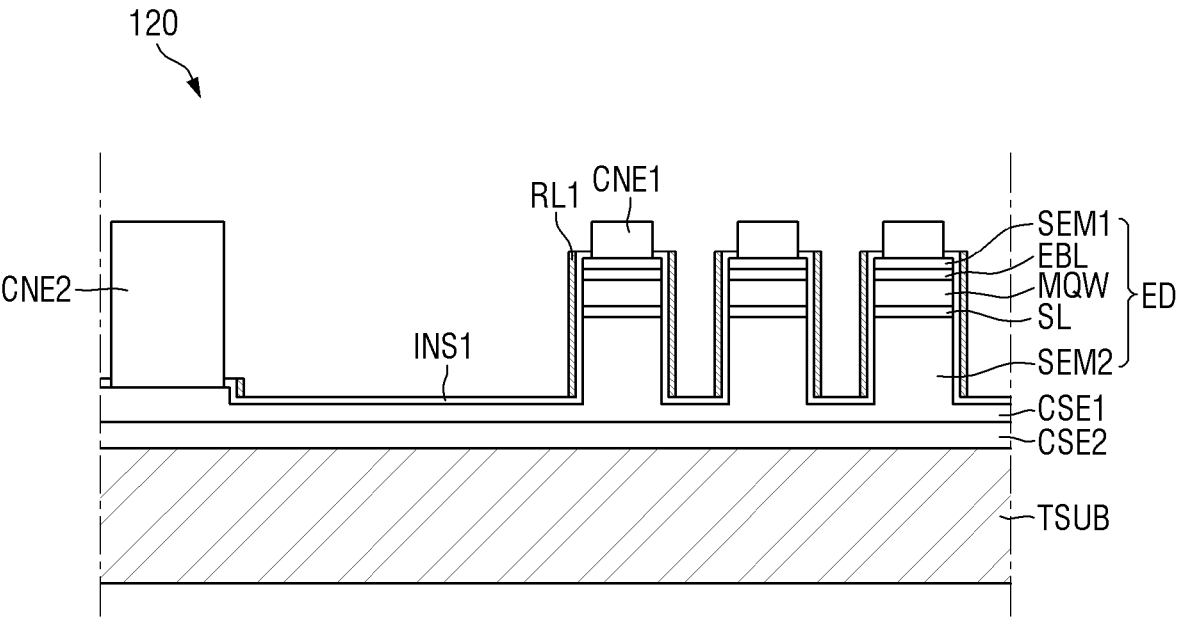

Next, referring to FIG. 12, the first insulating layer INS1 and the first reflective layer RL1 surrounding the light emitting elements ED are formed, and the plurality of connection electrodes CNE1 and CNE2 are formed on the light emitting elements ED and the first common semiconductor layer CSE1.

The first insulating layer INS1 and the first reflective layer RL1 may be formed by the process of coating materials respectively forming the first insulating layer INS1 and the first reflective layer RL1 on the target substrate TSUB and partially etching them. The first insulating layer INS1 may be formed by completely covering the top surfaces of the light emitting elements ED and the first common semiconductor layer CSE1 with the insulating material layer and removing it to expose parts of the top surfaces of the light emitting elements ED and the common semiconductor layer CSE1. The first reflective layer RL1 may be formed by completely covering the top surfaces of the first insulating layer INS1, the light emitting elements ED, and the first common semiconductor layer CSE1 with the reflective material layer and removing it to expose the top surfaces of the light emitting elements ED and a part of the top surface of the first common semiconductor layer CSE1. The connection electrodes CNE1 and CNE2 may be positioned in the regions where the first insulating layer INS1 and the first reflective layer RL1 are removed. The first connection electrodes CNE1 may be on the first semiconductor layers SEM1 of the light emitting elements ED to correspond thereto, and the second connection electrode CNE2 may be at a portion where a part of the top surface of the first common semiconductor layer CSE1 is exposed. By executing the above processes, a light emitting element layer 120 including the plurality of light emitting elements ED formed on the target substrate TSUB may be formed.

Figure 13:
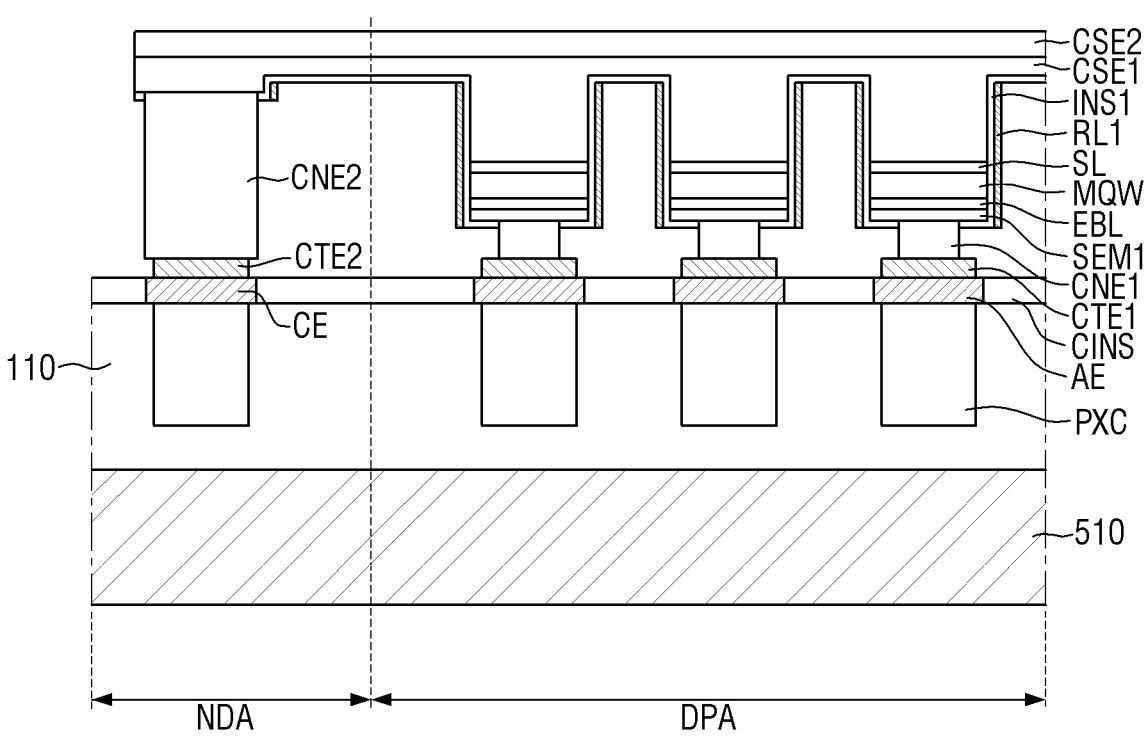

Next, referring to FIG. 13, the light emitting element layer 120 may be on the first substrate 110 including the plurality of pixel circuit units PXC, the common electrode CE, the pixel electrode AE, and the electrode connection portions CTE1 and CTE2, and the target substrate TSUB may be removed. The light emitting element layer 120 may be provided such that the connection electrodes CNE1 and CNE2 correspond to the electrode connection portions CTE1 and CTE2, respectively. When the upper portion of the light emitting element layer 120 faces the top surface of the first substrate 110 and the connection electrodes CNE1 and CNE2 are respectively in contact with the electrode connection portions CTE1 and CTE2, the target substrate TSUB is removed.

Figure 14:
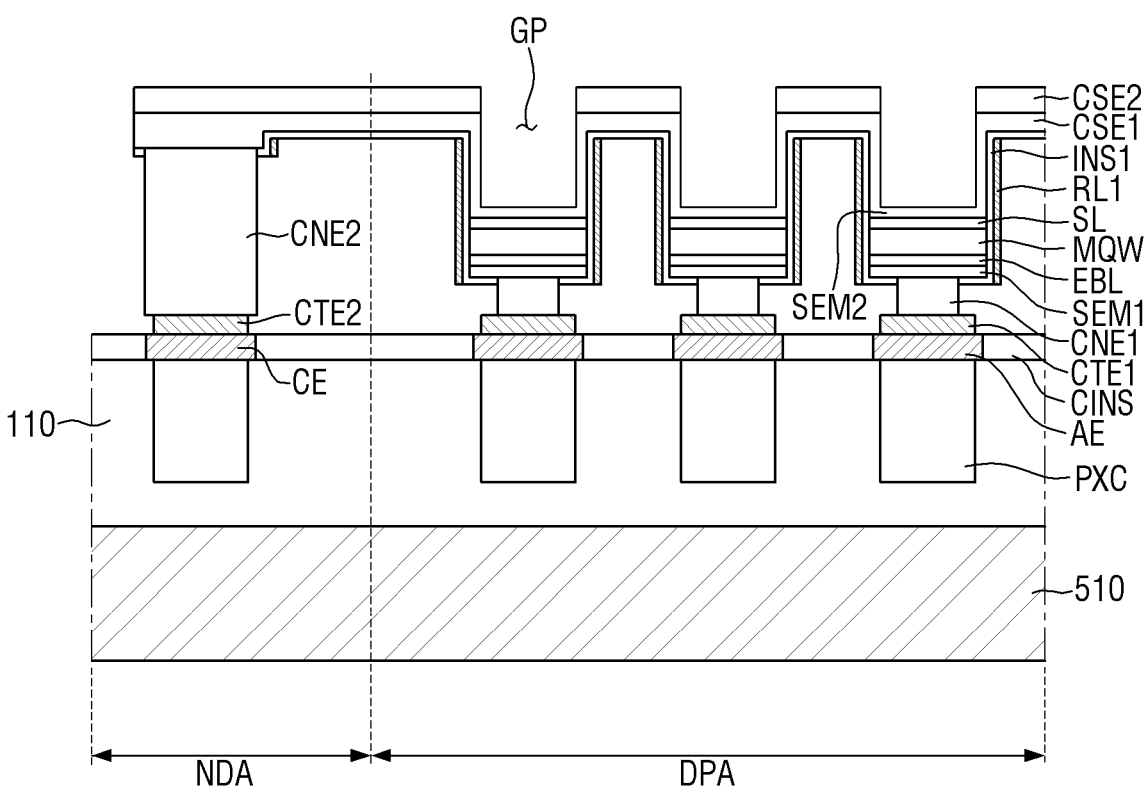

Next, referring to FIG. 14, the second semiconductor layers SEM2 of the light emitting elements ED, the first common semiconductor layer CSE1, and the second common semiconductor layer CSE2 are partially etched to form the plurality of grooves GP. The grooves GP may be formed to respectively correspond to the light emitting elements ED. The grooves GP may be arranged in the first direction DR1 and the second direction DR2 to correspond to the arrangement of the plurality of light emitting elements ED in the first direction DR1 and the second direction DR2. One groove GP may penetrate the first common semiconductor layer CSE1 and the second common semiconductor layer CSE2, and may be formed such that a part of the top surface of the second semiconductor layer SEM2 is recessed.

As described above, the groove GP may have a depth that allows the portion of the second semiconductor layer SEM2 positioned on the superlattice layer SL to remain, and may have a width smaller than the width of the second semiconductor layer SEM2. Accordingly, the second semiconductor layer SEM2 of each of the light emitting elements ED may have a shape surrounding the groove GP, and the side surface portion of the second semiconductor layer SEM2 in contact with the first insulating layer INS1 may be connected (e.g., coupled) to the first common semiconductor layer CSE1. The second semiconductor layer SEM2 of each of the light emitting elements ED may be electrically connected to the second connection electrode CNE2 through the first common semiconductor layer CSE1.

Next, according to one or more embodiments, the display device 10 may be manufactured by arranging the plurality of light output patterns ELP in the respective grooves GP of the plurality of light emitting elements ED. The light output pattern ELP may be partially inserted into the groove GP of each of the light emitting elements ED, so that the first surface S1 may face the active layer MQW of the light emitting element ED and the second surface S2 opposite the first surface S1 may face upward. The outer surface of the second surface S2 may be curved to have a lens shape. In one or more embodiments, the light output pattern ELP may be formed by the process of arranging an organic material having a high refractive index in the groove GP of each of the light emitting elements ED and then applying heat to the organic material to reflow it. The curved second surface S2 of the light output pattern ELP may be formed by reflowing an organic pattern having a shape in which a central portion protrudes. Here, the curvature of the second surface S2 may be adjusted by adjusting the size of the pattern having the protruding shape and the condition of the reflow process.

Hereinafter, various embodiments of the display device 10 will be described with reference to other drawings.

Figure 15:
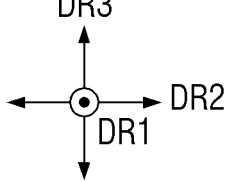
FIG. 15 is a cross-sectional view illustrating a portion of a display device according to one or more other embodiments.

FIG. 15 is a cross-sectional view illustrating a portion of a display device according to one or more other embodiments.

Referring to FIG. 15, a display device 10_1 according to one or more embodiments may further include a second substrate 210 on the second common semiconductor layer CSE2. The embodiment is different from the embodiment of FIG. 5 in that the display device 10_1 further includes the second substrate 210. In the following description, redundant descriptions will not be provided, and the differences will mainly be described.

The second substrate 210 may be positioned on the second common semiconductor layer CSE2. The second substrate 210 may cover a part of the plurality of light output patterns ELP, and may protect or support the light output patterns ELP. The second substrate 210 may include a plurality of opening holes formed to correspond to the respective light output patterns ELP, and the light output patterns ELP may be positioned in different opening holes.

The light output patterns ELP may be in the opening holes formed in the second substrate 210, and may partially protrude from the top surface of the second substrate 210. In the display device 10_1, the light output patterns ELP partially protrude from the top surface of the second substrate 210, and the top surface may have surface roughness due to the light output patterns ELP. However, the disclosure is not limited thereto, and the display device 10_1 may further include a layer on the second substrate 210 to have a flat surface (e.g., a planarization layer).

In accordance with one or more embodiments, the second substrate 210 may contain a material having a refractive index different from that of a material of the light output pattern ELP, and may guide the traveling path of the light emitted from the light emitting element ED such that the light is emitted in the upward direction through the light output pattern ELP. The second substrate 210 and the light output pattern ELP may be made of different transparent materials, and the light emitted from the light emitting element ED may travel in the light output pattern ELP and be emitted to the position above the second substrate 210 and the light output pattern ELP.

For example, the second substrate 210 is made of a material having a refractive index lower than that of the light output patterns ELP, and the light incident on the light output pattern ELP may be totally reflected at the interface with the second substrate 210 and emitted in the upward direction. The third surface S3 of the light output pattern ELP may be inclined so that the diameter increases from the first surface S1 on the lower side toward the upper side. The third surface S3 that is the surface in contact with the second substrate 210 may be the interface between the light output pattern ELP and the second substrate 210. Because the light output pattern ELP contains a material having a refractive index higher than that of the second substrate 210, the lights directed toward the side surface among the lights incident on the light output pattern ELP may be totally reflected at the third surface S3 and/or at the interface with the second substrate 210. The light output pattern ELP may guide the light to be emitted from the second surface S2 without being lost to the second substrate 210. The display device 10_1 may further include the second substrate 210 to support and protect the light output patterns ELP and to further improve the light output efficiency in the upward direction.

Figure 16:
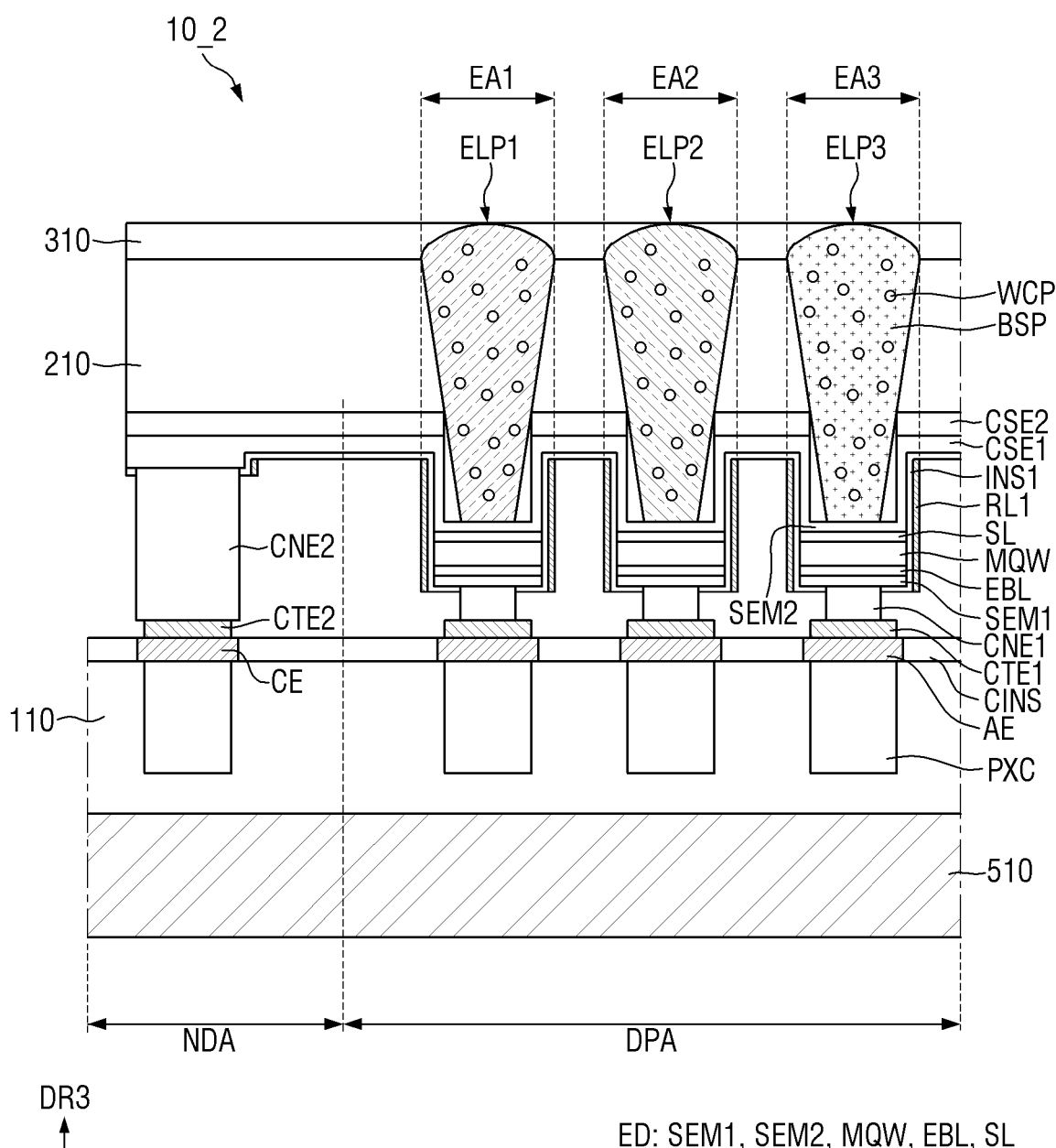
FIG. 16 is a cross-sectional view illustrating a portion of a display device according to one or more other embodiments.

FIG. 16 is a cross-sectional view illustrating a portion of a display device according to one or more other embodiments.

Referring to FIG. 16, a display device 10_2 according to one or more embodiments may further include a capping layer 310 on the second substrate 210. The embodiment is different from the embodiment of FIG. 15 in that the display device 10_2 further includes the capping layer 310. In the following description, redundant descriptions will not be provided, and the differences will mainly be described.

The capping layer 310 may be provided on the entire top surface of the second substrate 210 to cover and/or surround the second surfaces S2 of the light output patterns ELP. The capping layer 310 contains a transparent material, so that the light may be emitted even if the capping layer 310 covers the light output pattern ELP. Although the display device 10_2 includes the light output patterns ELP, the top surface may be formed flat due to the second substrate 210 and the capping layer 310.

Because the display device 10_2 further includes the capping layer 310, the interface between the second surface S2 and the capping layer 310 may be formed at the light output portion of the light output pattern ELP. The capping layer 310 may contain a material that prevents or reduces the refraction of the light emitted from the light output pattern ELP toward the adjacent emission areas EA1, EA2, and EA3. In one or more embodiments, the capping layer 310 may be made of a material having a refractive index lower than that of the material of the light output pattern ELP. For example, the light output pattern ELP may contain a material having a refractive index higher than those of the materials of the second substrate 210 and the capping layer 310, and the capping layer 310 may contain a material having a refractive index higher than or equal to that of the material of the second substrate 210. The display device 10_2 may have the flat top surface due to the capping layer 310, and the light emitted from the light emitting element ED may be effectively or suitably emitted in the upward direction even if the capping layer 310 covers the light output patterns ELP.

Figure 17:
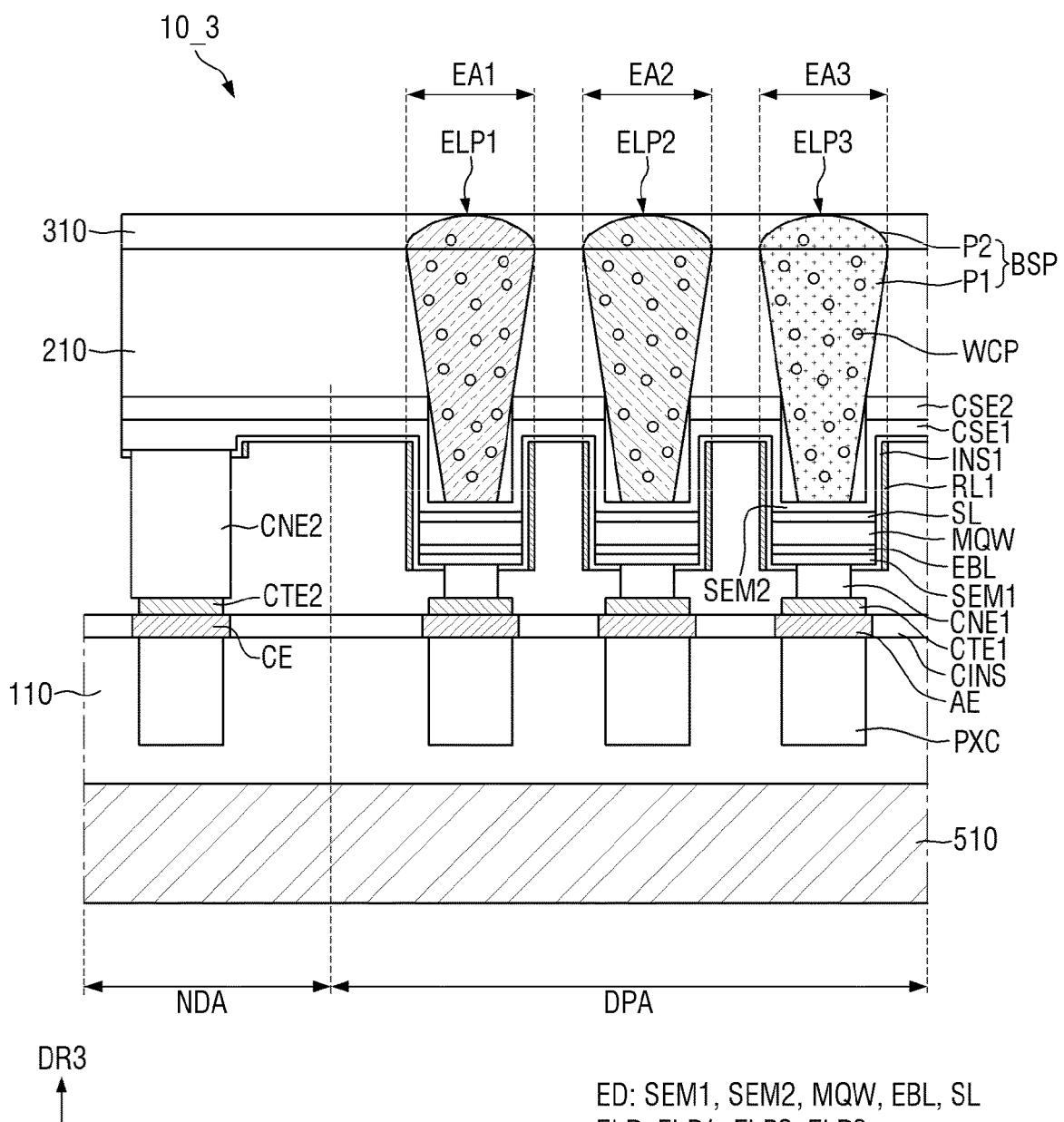
FIG. 17 is a cross-sectional view illustrating a portion of a display device according to one or more other embodiments.

FIG. 17 is a cross-sectional view illustrating a portion of a display device according to one or more other embodiments.

Referring to FIG. 17, in a display device 10_3, the output pattern ELP may include a first portion P1 and a second portion P2 having different refractive indices. The light output pattern ELP may include the first portion P1 and the second portion P2 distinguished to respectively correspond to the positions of the second substrate 210 and the capping layer 310. Because the first portion P1 and the second portion P2 have different refractive indices, it is possible to further improve the light output efficiency of the light emitted from the light emitting element ED in the upward direction. The embodiment is the same as the embodiment of FIG. 16 except for the structure of the light output pattern ELP and the relationship of the refractive index.

The light output pattern ELP may include the first portion P1 in the opening hole formed in the second substrate 210 and in contact with the second substrate 210, and the second portion P2 on the first portion P1 and protruding from the top surface of the second substrate 210. After the groove GP corresponding to the light emitting element ED is formed and the opening hole is formed in the second substrate 210, the light output pattern ELP may be inserted into the groove GP and the opening hole. The light output pattern ELP may include the first portion P1 and the second portion P2 distinguished depending on the thickness of the second substrate 210 and the thickness of the light output pattern ELP (e.g., the first portion P1 may have substantially the same thickness in the third direction DR3 as the second substrate 210, and the second portion P2 may correspond to the difference between the thickness of the output pattern ELP and the thickness of the second substrate 210). The first portion P1 and the second portion P2 may be distinguished depending on the relative arrangement with the second substrate 210. Further, the first portion P1 and the second portion P2 may contain materials having different refractive indices.

In accordance with one or more embodiments, in the light output pattern ELP, the second portion P2 may contain a material having a refractive index higher than that of the material of the first portion P1. The light incident from the first portion P1 to the second portion P2 may be refracted at the interface therebetween. Because the second portion P2 has a refractive index higher than that of the first portion P1, the refracted lights may be refracted to the inside of the emission areas EA1, EA2, and EA3 without being directed to the other adjacent emission areas EA1, EA2, and EA3. The lights emitted from the display device 10_3 may be mostly emitted in the upward direction from the regions corresponding to the emission areas EA1, EA2, and EA3, and may hardly be mixed (e.g., may substantially not mix) with the lights from the other adjacent emission areas EA1, EA2, and EA3.

Figure 18:
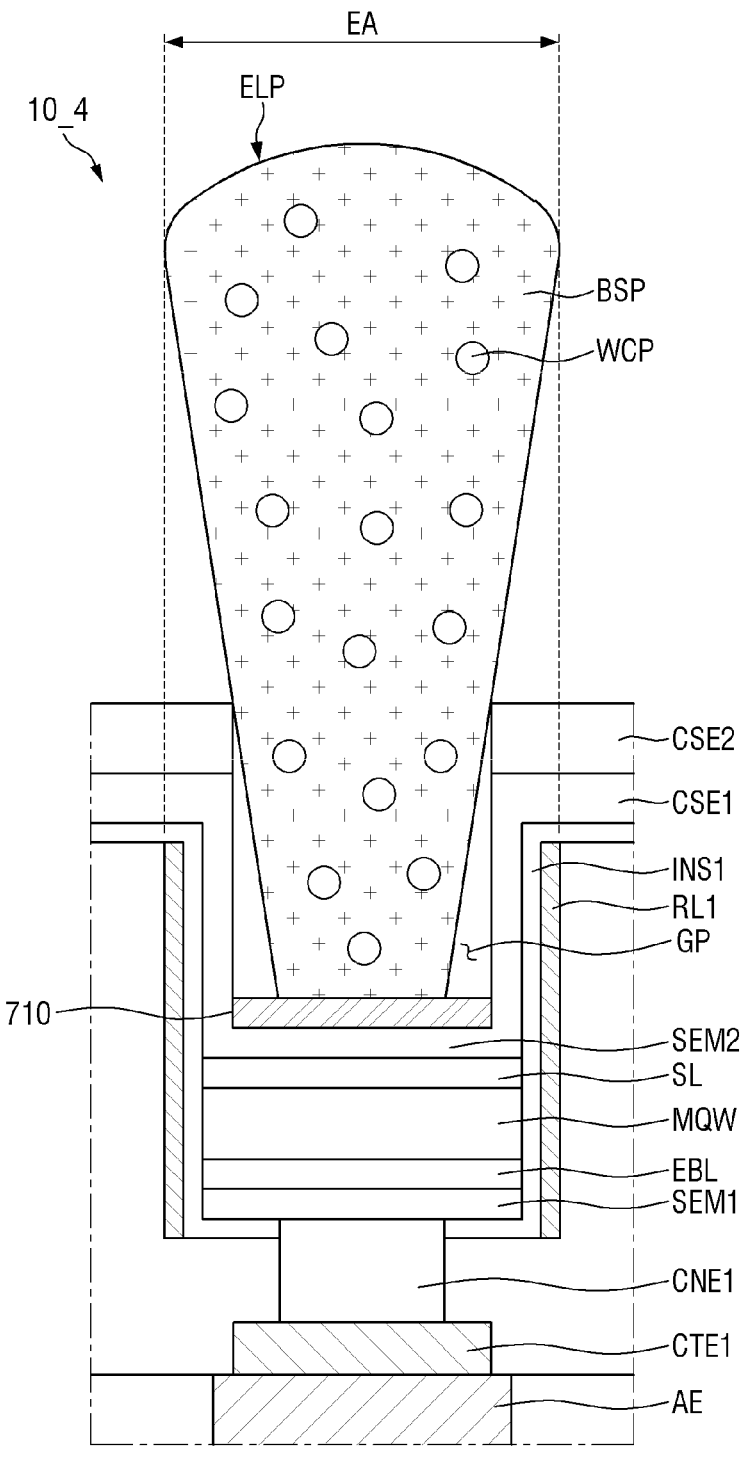
FIG. 18 is an enlarged cross-sectional view of the light emitting element and the light output pattern of a display device according to one or more other embodiments.

FIG. 18 is an enlarged cross-sectional view showing the relative arrangement of the light emitting element and the light output pattern of a display device according to one or more other embodiments.

Referring to FIG. 18, a display device 10_4 according to one or more embodiments may further include an optical layer 710 between the light output pattern ELP and the light emitting element ED. The optical layer 710 may be between the first surface S1 of the light output pattern ELP and the active layer MQW of the light emitting element ED, and the light emitted from the light emitting element ED may be effectively incident on the light output pattern ELP through the optical layer 710. For example, the optical layer 710 may be directly on the second semiconductor layer SEM2 of the light emitting element ED. The light output pattern ELP may be directly on the optical layer 710, so that the first surface S1 may form an interface with the optical layer 710.

In one or more embodiments, the optical layer 710 may be an anti-diffused reflection layer. The second semiconductor layer SEM2 of the light emitting element ED and the light output pattern ELP may contain different materials and thus may have different refractive indices. When the refractive index difference therebetween is large, the light may be excessively refracted and diffusely reflected on the first surface S1, so that the light output amount may be reduced. In order to prevent or reduce this phenomena, the optical layer 710 may be provided between the first surface S1 of the light output pattern ELP and the light emitting element ED, so that the lights emitted from the light emitting element ED may be incident on the light output pattern ELP without diffused reflection. Because the display device 10_4 further includes the optical layer 710 between the first surface S1 of the light output pattern ELP and the active layer MQW of the light emitting element ED, it is possible to prevent or reduce diffused reflection of the light and to further improve the light output efficiency.

Figure 19:
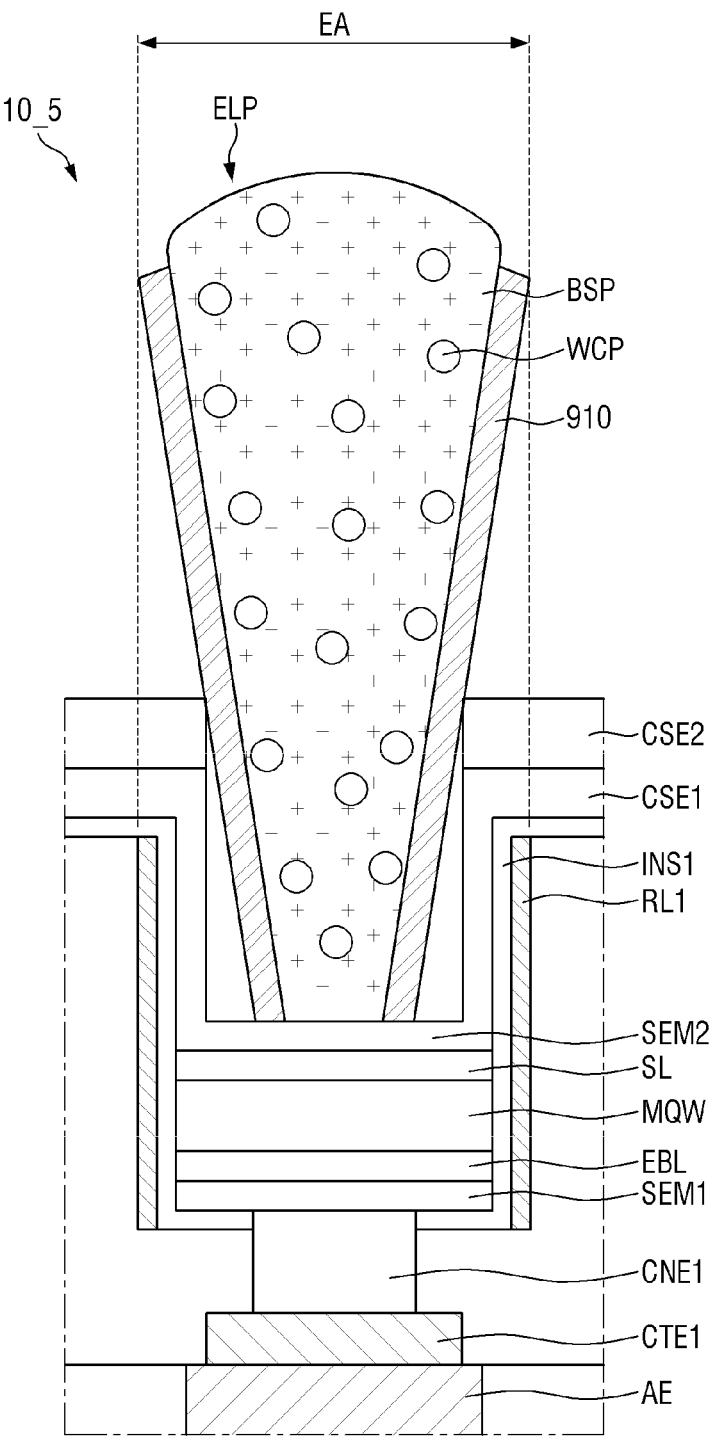
FIG. 19 is an enlarged cross-sectional view of the light emitting element and the light output pattern of a display device according to one or more other embodiments.

FIG. 19 is an enlarged cross-sectional view showing the relative arrangement of the light emitting element and the light output pattern of a display device according to one or more other embodiments.

Referring to FIG. 19, a display device 10_5 according to one or more embodiments may further include a reflective layer 910 surrounding the side surface of the light output pattern ELP. The reflective layer 910 may contain a material having high reflectivity and may be in contact with the third surface S3 of the light output pattern ELP. The lights incident on the third surface S3 may be reflected again on the reflective layer 910 into the light output pattern ELP. The reflective layer 910 may be made of substantially the same material as the first reflective layer RL1 surrounding the side surface of the light emitting element ED. For example, the reflective layer 910 may be made of a metal material such as aluminum (Al).

In the display device 10_5 according to the embodiments, the light output pattern ELP guides the light utilizing the difference in refractive index, and the reflective layer 910 on the side surface is further provided so that it is possible to further prevent or reduce the emission of the light to the adjacent emission areas EA1, EA2, and EA3.

Figure 20:
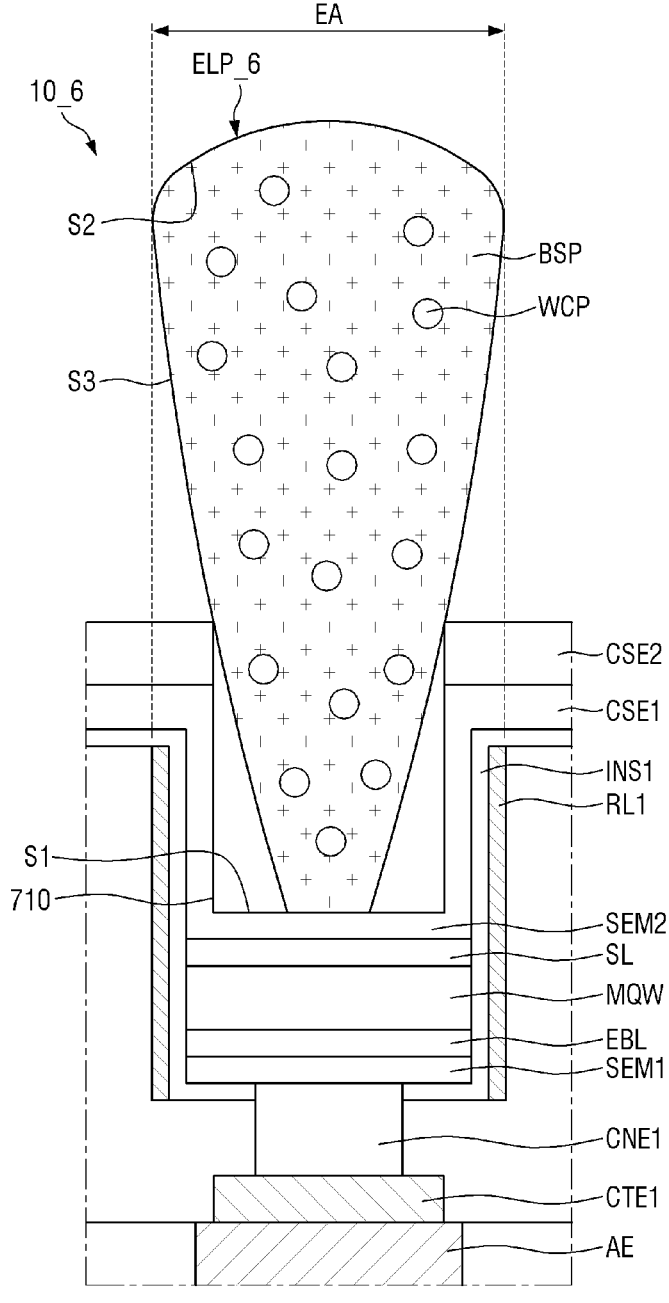
FIG. 20 is an enlarged cross-sectional view of the light emitting element and the light output pattern of a display device according to one or more other embodiments.

FIG. 20 is an enlarged cross-sectional view showing the relative arrangement of the light emitting element and the light output pattern of a display device according to one or more other embodiments.

Referring to FIG. 20, a display device 10_6 according to one or more embodiments may have a shape in which a third surface S3 of a light output pattern ELP_6 is curved. The light output pattern ELP_6 is made of a material having a high refractive index, and the incident light may be totally reflected on the third surface S3 that is the side surface among the interfaces with the outside. The total reflection of the light, as well as the refractive index of another medium (e.g., an outside medium such as, for example, air), may affect the incident angle of the light incident on the interface. The third surface S3 of the light output pattern ELP_6 may be curved, so that most of the lights incident on the light output pattern ELP_6 and directed toward the side surface may be totally reflected. The display device 10_6 according to one or more embodiments may control the shape of the side surface of the light output pattern ELP_6 to more effectively or suitably prevent or reduce the mixing of colors of the lights between the adjacent emission areas EA1, EA2, and EA3.

Figure 21:
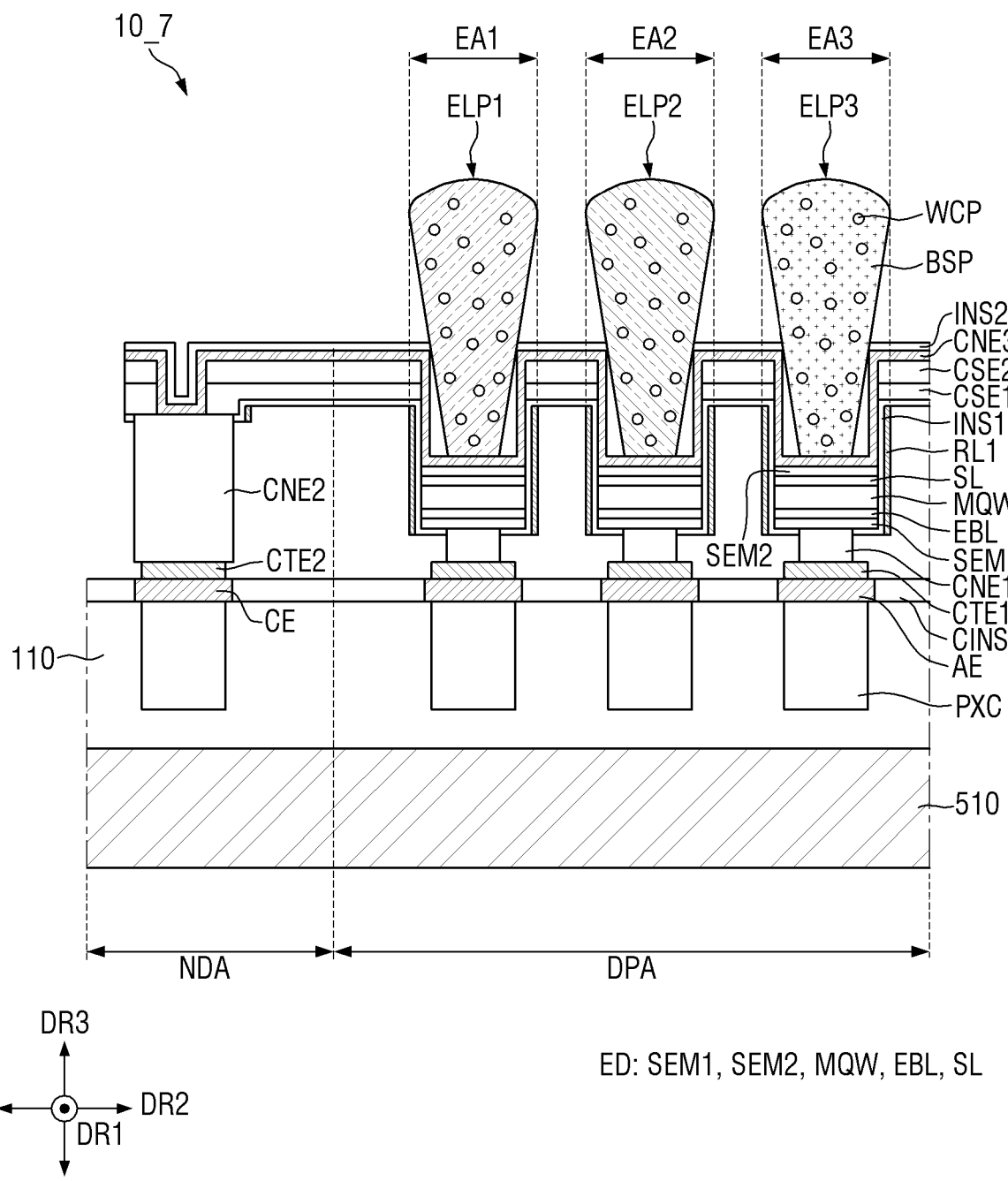
FIG. 21 is a cross-sectional view illustrating a portion of a display device according to one or more other embodiments.
Figure 22:
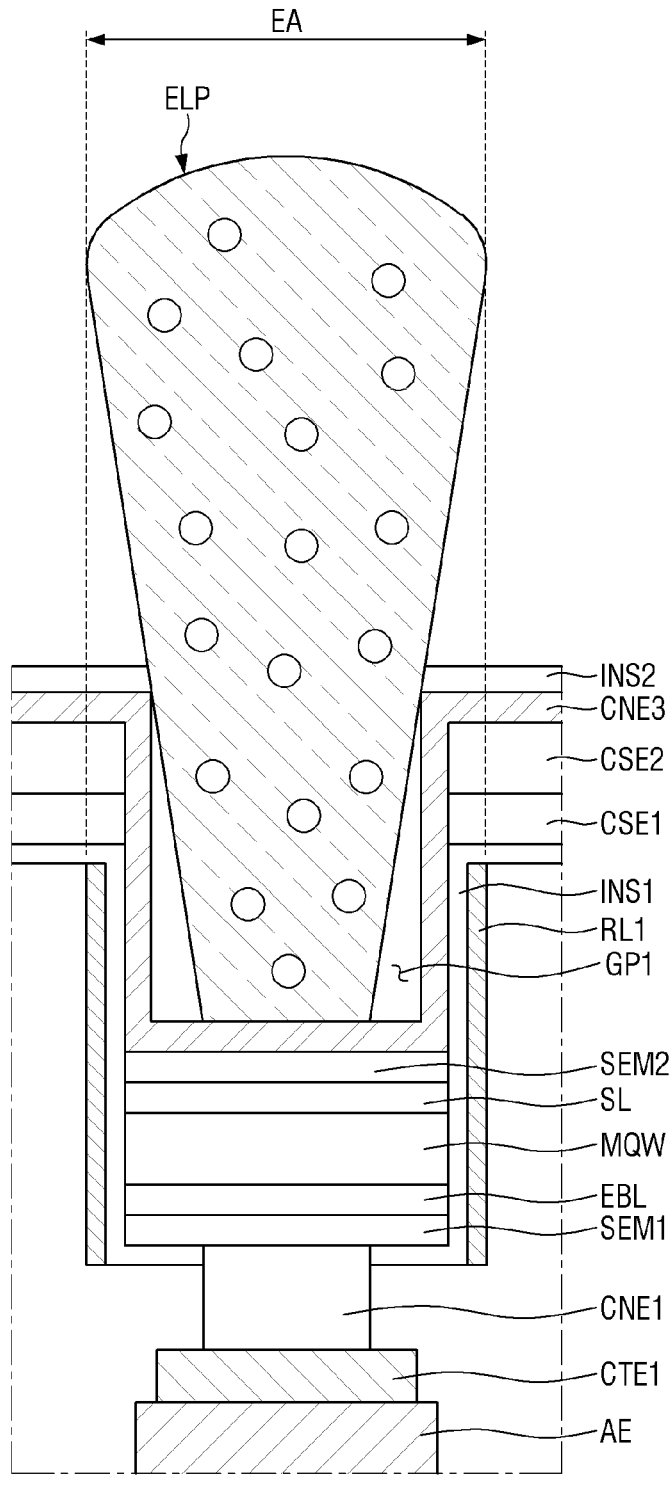
FIG. 22 is an enlarged cross-sectional view of the light emitting element and the light output pattern of the display device of FIG. 21.
Figure 23:
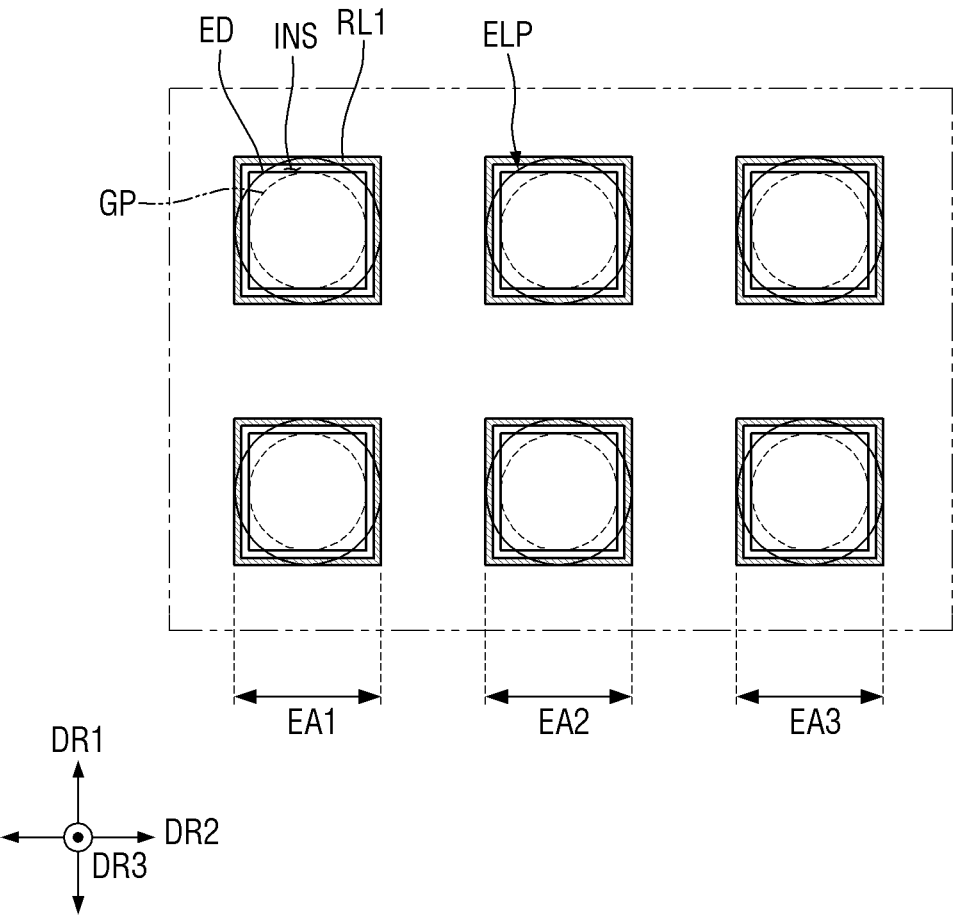
FIG. 23 is a plan view showing the arrangement of the light output patterns of the display device of FIG. 21.

FIG. 21 is a cross-sectional view illustrating a portion of a display device according to one or more other embodiments. FIG. 22 is an enlarged cross-sectional view showing the relative arrangement of the light emitting element and the light output pattern of the display device of FIG. 21. FIG. 23 is a plan view showing the arrangement of the light output patterns of the display device of FIG. 21.

Referring to FIGS. 21 to 23, in a display device 10_7 according to one or more embodiments, the width of the groove GP formed at the light emitting element ED may be the same as the width of the active layer MQW and the second semiconductor layer SEM2. Accordingly, the second semiconductor layer SEM2 on the superlattice layer SL may have a relatively small thickness and may not be directly connected to the first common semiconductor layer CSE1. The display device 10_7 may further include a third connection electrode CNE3 electrically connected to the second semiconductor layers SEM2 of the plurality of light emitting elements ED and the second connection electrode CNE2. The embodiment is different from the embodiment in FIG. 5 in that the width of the groove GP is the same as that of the second semiconductor layer SEM2 of the light emitting element ED and, thus, the arrangement of the connection electrode is different. In the following description, redundant descriptions will not be provided, and the differences will mainly be described.

The grooves GP formed to correspond to the respective light emitting elements ED may be formed by the process of etching the common semiconductor layers CSE1 and CSE2 and a part of the second semiconductor layer SEM2 in the manufacturing process of the display device 10_7. In the embodiment of FIG. 5, the groove GP is formed to have a width smaller than that of the second semiconductor layer SEM2, so that the second semiconductor layers SEM2 of the plurality of light emitting elements ED may be connected to the common semiconductor layer CSE1. Accordingly, the second semiconductor layer SEM2 of each of the light emitting elements ED may be electrically connected to the common electrode CE through the second connection electrode CNE2 positioned on one surface of the first common semiconductor layer CSE1.

In contrast, in the display device 10_7 of the embodiments, the grooves GP (GP1 and GP2) may be formed to have the same width as the width of the second semiconductor layer SEM2 in the process of etching the common semiconductor layers CSE1 and CSE2 and a part of the second semiconductor layer SEM2. The groove GP formed to correspond to each of the light emitting elements ED may be formed to expose the top surface of the second semiconductor layer SEM2, and the second semiconductor layer SEM2 may partially remain in the region separated from the first common semiconductor layer CSE1 and surrounded by the first insulating layer INS1. A part of the first insulating layer INS1 may surround the light emitting elements ED and form the groove GP exposing the top surface of the light emitting element ED. The length of the portion of the first insulating layer INS1 surrounding the light emitting element ED in the third direction DR3 may be greater than that of the light emitting element ED, and the first insulating layer INS1 may surround the groove GP.

The first common semiconductor layer CSE1 may only physically connect the light emitting elements ED adjacent to each other, and may not electrically connect them through the second semiconductor layer SEM2. Before the light output pattern ELP is placed in the groove GP, the third connection electrode CNE3 electrically connecting the second semiconductor layers SEM2 of the plurality of light emitting elements ED and the second connection electrode CNE2 may be provided, and a part of the plurality of grooves GP may penetrate the common semiconductor layers CSE1 and CSE2 to expose the top surface of the second connection electrode CNE2.

In accordance with one or more embodiments, the plurality of grooves GP1 and GP2 may include first grooves GP1 formed to correspond to the respective light emitting elements ED and second grooves GP2 formed to correspond to the second connection electrodes CNE2. The first grooves GP1 that are formed to expose the top surfaces of the second semiconductor layers SEM2 of the light emitting elements ED may be the same as the grooves GP of FIG. 5 except that the widths are different. The first grooves GP1 may correspond to the first connection electrodes CNE1 in the display area DPA. The width of each of the first grooves GP1 may be the same as the width of the second semiconductor layer SEM2 of the light emitting element ED, and the first grooves GP1 may be surrounded by the first insulating layer INS1. The light output patterns ELP may be positioned in the respective first grooves GP1.

The second groove GP2 may expose a part of the top surface of the second connection electrode CNE2. The first groove GP1 may penetrate the common semiconductor layers CSE1 and CSE2 and may be formed by removing a part of the second semiconductor layer SEM2, whereas the second groove GP2 may penetrate only the common semiconductor layers CSE1 and CSE2. A part of the top surface of the second connection electrode CNE2 that is on one surface of the first common semiconductor layer CSE1 may be exposed by the second groove GP2. The second groove GP2 may correspond to the second connection electrode CNE2 in the non-display area NDA.

The third connection electrode CNE3 may be provided on the semiconductor layers SEM2 of the light emitting elements ED and the second connection electrode CNE2 respectively exposed by the grooves GP1 and GP2. The third connection electrode CNE3 may also be on the second common semiconductor layer CSE2. The third connection electrode CNE3 may be substantially in the entire display area DPA and the entire non-display area NDA on the second common semiconductor layer CSE2, and may also be in the grooves GP1 and GP2. Accordingly, the third connection electrode CNE3 may be partially positioned directly on the second connection electrode CNE2 and the second semiconductor layers SEM2 of the light emitting elements ED. The third connection electrode CNE3 may be in contact with the top surface of the second semiconductor layer SEM2 and the inner sidewall of the first insulating layer INS1 in the first groove GP1, and may be in direct contact with a part of the top surface of the second connection electrode CNE2 in the second groove GP2. The second semiconductor layers SEM2 of the plurality of light emitting elements ED may be electrically connected to the second connection electrode CNE2 and the common electrode CE through the third connection electrode CNE3.

In accordance with one or more embodiments, the display device 10_7 may further include a second insulating layer INS2 in a region other than the portions corresponding to the first grooves GP1 on the third connection electrode CNE3. The second insulating layer INS2 may contain substantially the same material as the first insulating layer INS1, and may protect the third connection electrode CNE3. The second insulating layer INS2 may cover the third connection electrode CNE3 without overlapping the first groove GP1. The second insulating layer INS2 may cover the portion of the third connection electrode CNE3 in the second groove GP2. The second insulating layer INS2 may correspond to the region where the light output patterns ELP are positioned, including the opening corresponding to the first groove GP1, and may protect it by covering the third connection electrode CNE3. However, the disclosure is not limited thereto. The second insulating layer INS2 may be formed on the entire third connection electrode CNE3 without including the opening corresponding to the first groove GP1. In this case, a part of the second insulating layer INS2 may also be in the first groove GP1. In this case, the light output pattern ELP may be directly on the second insulating layer INS2 in the first groove GP1.

The light output patterns ELP may be in different first grooves GP1, and may correspond to different light emitting elements ED. Each of the light output patterns ELP may be directly on the third connection electrode CNE3 in the first groove GP1, and the first surface 51 may be in direct contact with the top surface of the third connection electrode CNE3. The light generated from the active layer MQW of the light emitting element ED may pass through the superlattice layer SL and the second semiconductor layer SEM2 and may be incident on the light output pattern ELP through the third connection electrode CNE3. Accordingly, the third connection electrode CNE3 may be made of a transparent conductive material.

The display device 10_7 of the embodiment is different from the embodiment of FIG. 5 in that the width of the first groove GP1 is the same as the width of the second semiconductor layer SEM2 of the light emitting element ED. The first groove GP1 may be surrounded by the first insulating layer INS1, instead of the second semiconductor layer SEM2, and the light output patterns ELP may be easily (or suitably) placed due to the increase in the width of the first groove GP1. Because the second semiconductor layer SEM2 is electrically connected to the second connection electrode CNE2 and the common electrode CE through the third connection electrode CNE3, the light emitting elements ED may emit the light regardless of the arrangement of the first common semiconductor layer CSE1.

Figure 24:
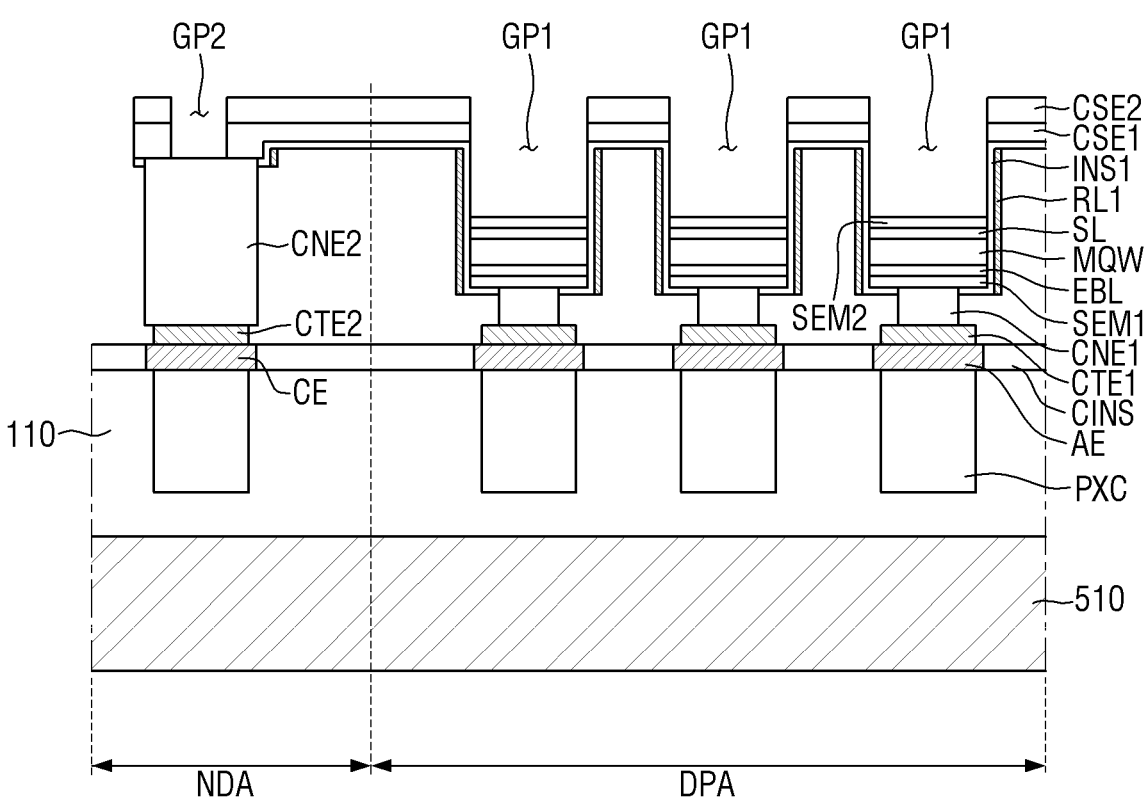
FIGS. 24-26 are cross-sectional views showing one or more parts of the manufacturing process of the display device of FIG. 21.
Figure 25:
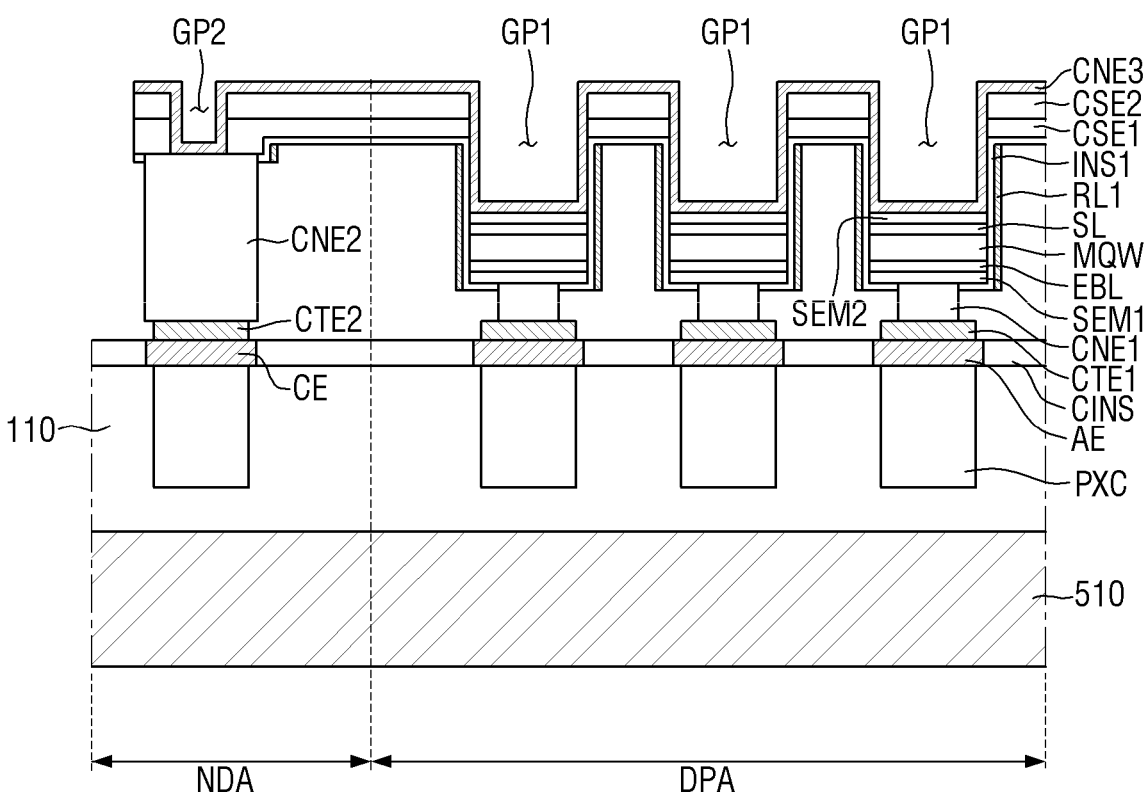
Figure 26:
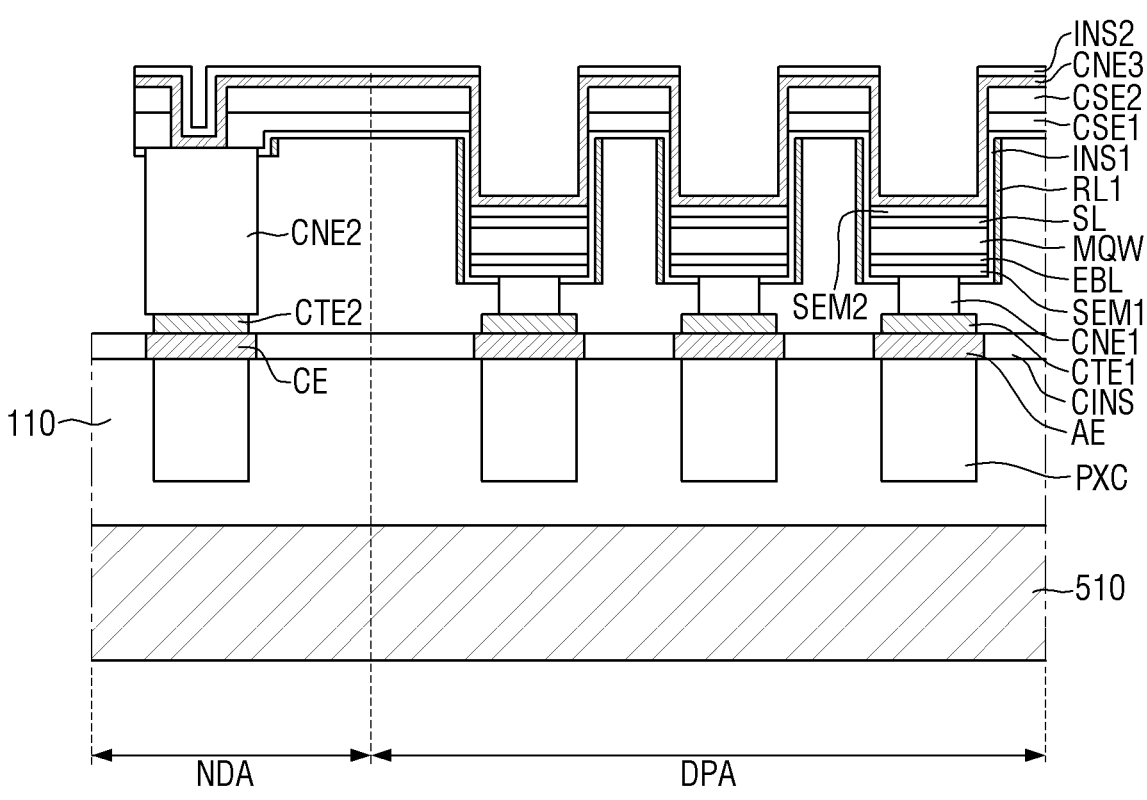

FIGS. 24 to 26 are cross-sectional views showing a part of the manufacturing process of the display device of FIG. 21.

First, referring to FIG. 24, when the light emitting elements ED formed on the common semiconductor layers CSE1 and CSE2 and the second connection electrode CNE2 are positioned on the first substrate 110, the plurality of grooves GP1 and GP2 are formed. The grooves GP1 and GP2 may be formed by the process of etching the common semiconductor layers CSE1 and CSE2 and the second semiconductor layer SEM2. In the display area DPA, a part of the common semiconductor layers CSE1 and CSE2 positioned on the light emitting elements ED and a part of the second semiconductor layer SEM2 are etched to form the first groove GP1. In the non-display area NDA, a part of the common semiconductor layers CSE1 and CSE2 may be etched to form the second groove GP2.

Next, referring to FIGS. 25 and 26, the third connection electrode CNE3 is provided on the common semiconductor layers CSE1 and CSE2 and the grooves GP1 and GP2, and the second insulating layer INS2 is provided on the third connection electrode CNE3. The third connection electrode CNE3 may be in the entire the display area DPA and the entire non-display area NDA on the second common semiconductor layer CSE2, and may also be in the grooves GP1 and GP2. The third connection electrode CNE3 may be in direct contact with the second semiconductor layers SEM2 of the light emitting elements ED and the second connection electrode CNE2 respectively exposed by the grooves GP1 and GP2.

The second insulating layer INS2 may be on the third connection electrode CNE3, and may not be in the area corresponding to the first groove GP1. The second insulating layer INS2 may include a plurality of openings corresponding to the first grooves GP1, and the top surface of the second semiconductor layer SEM2 of each of the light emitting elements ED may be exposed. The second insulating layer INS2 may cover the third connection electrode CNE3 in the second groove GP2. However, the disclosure is not limited thereto, and the second insulating layer INS2 may be in the first groove GP1 to completely cover the third connection electrode CNE3.

Next, according to one or more embodiments, the display device 10_7 may be manufactured by arranging the plurality of light output patterns ELP in the first grooves GP1 corresponding to the plurality of light emitting elements ED.

According to one or more embodiments, the display device 10 includes the third connection electrode CNE3, so that the plurality of light emitting elements ED may be electrically connected to the common electrode CE. Therefore, the plurality of light emitting elements ED may not be necessarily connected through the common semiconductor layers CSE1 and CSE2. Although the plurality of light emitting elements ED are not formed on the common semiconductor layers CSE1 and CSE2 at the same time (e.g., concurrently), they may be connected to the common electrode CE at the same time (e.g., concurrently) on the first substrate 110.

Accordingly, in the display device 10 according to one or more embodiments, different light emitting elements ED may be arranged in different emission areas EA1, EA2, and EA3, and they may emit lights of different wavelength bands. If the light output pattern ELP corresponding to each of the light emitting elements ED performs the function of the color filter corresponding to the wavelength band of the light emitted from the light emitting element ED, the emission areas EA1, EA2, and EA3 may emit lights of different wavelength bands. For example, the light output pattern ELP may not contain the wavelength conversion particles WCP.

Figure 27:
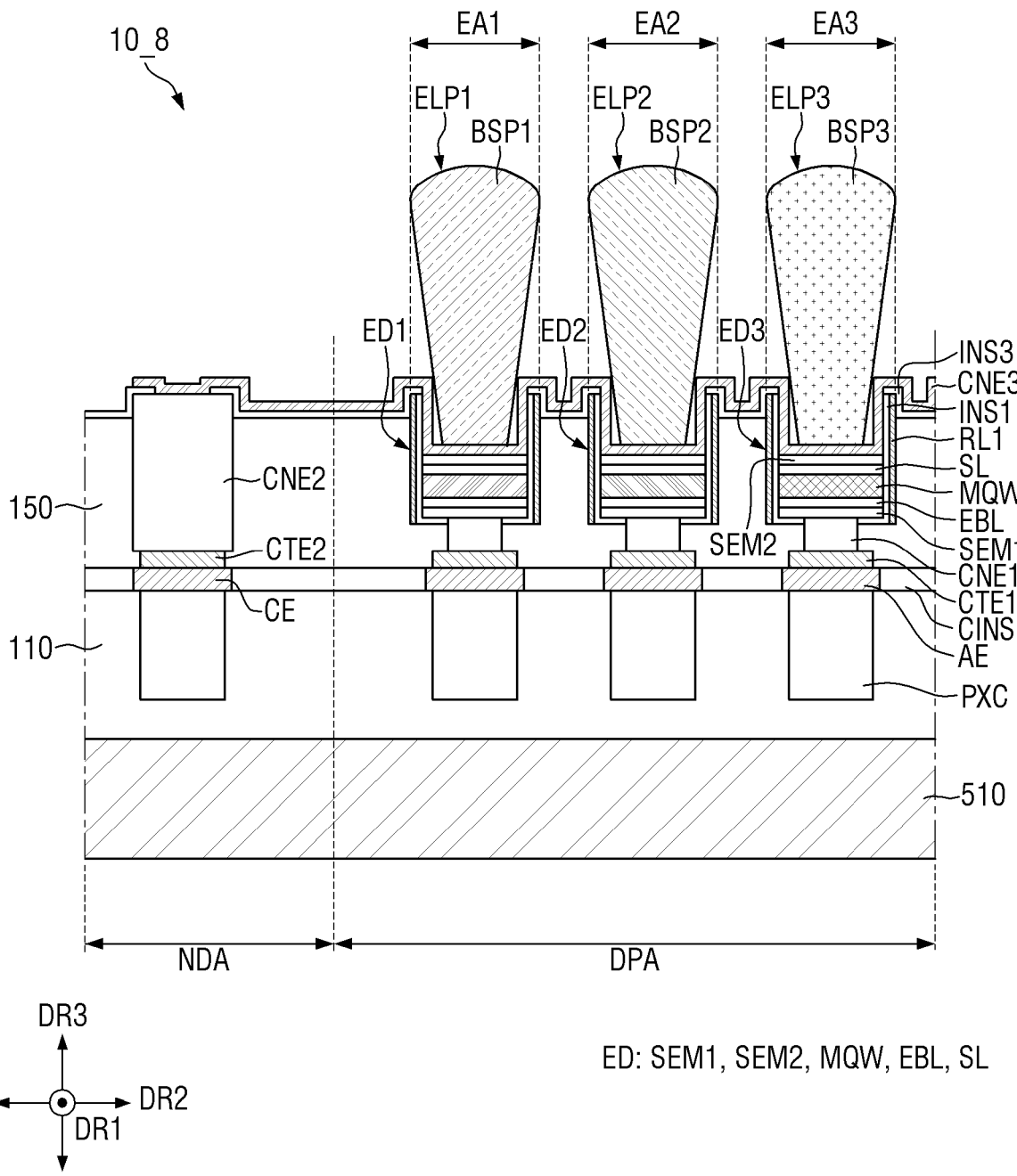
FIG. 27 is a cross-sectional view illustrating a portion of a display device according to one or more other embodiments.

FIG. 27 is a cross-sectional view illustrating a portion of a display device according to one or more other embodiments.

Referring to FIG. 27, in a display device 10_8 according to one or more embodiments, a plurality of light emitting elements ED (ED1, ED2, and ED3) may emit lights of different colors. The light emitting elements ED (ED1, ED2, and ED3) respectively positioned in the emission areas EA1, EA2, and EA3 may be different types (or kinds) of light emitting elements ED, and may be physically separated from each other. The display device 10_8 may further include a support portion 150 for supporting and fixing the light emitting elements ED separated from each other and a third insulating layer INS3, and may include the third connection electrode CNE3 for electrically connecting the plurality of light emitting elements ED.

The plurality of light emitting elements ED may include a first light emitting element ED1 in the first emission area EA1, a second light emitting element ED2 in the second emission area EA2, and a third light emitting element ED3 in the third emission area EA3. The light emitting elements ED may emit lights of different wavelength bands depending on the material of the active layer MQW. For example, the first light emitting element ED1 may emit the red light of the first color, the second light emitting element ED2 may emit the green light of the second color, and the third light emitting element ED3 may emit the blue light of the third color. Because the active layers MQW of the light emitting elements ED are made of different materials, they may not be formed at the same time (e.g., concurrently) on the common semiconductor layers CSE1 and CSE2 as shown in FIGS. 10 and 11. A plurality of first light emitting elements ED1, a plurality of second light emitting element ED2, and a plurality of third light emitting element ED3 may be individually formed and arranged to correspond to the emission areas EA1, EA2, and EA3, respectively. For example, in the display device 10_8, the common semiconductor layers CSE1 and CSE2 may be omitted, and the light emitting elements ED may be individually formed on the pixel electrode AE and the first electrode connection portion CTE1. The side surfaces of the semiconductor layers of the light emitting elements ED may be surrounded by the first insulating layer INS1 and the first reflective layer RL1. When the groove GP is formed by etching the second semiconductor layer SEM2 in the manufacturing process of the display device 10_8, the groove GP may be surrounded by the first insulating layer INS1.

The support portion 150 may partially surround the plurality of light emitting elements ED. Because the light emitting elements ED are individually arranged and physically separated, the display device 10_8 may further include a member for fixing the plurality of light emitting elements ED. The support portion 150 may be provided in the entire display area DPA and the entire non-display area NDA, and may fix the plurality of light emitting elements ED and the second connection electrode CNE2.

The third insulating layer INS3 may be positioned on the support portion 150. The third insulating layer INS3 may cover a part of the second connection electrode CNE2 and expose a part of the top surface of the second connection electrode CNE2 in the non-display area NDA. Further, a part of the third insulating layer INS3 may be on the first insulating layer INS1 surrounding the side surfaces of the light emitting elements ED in the display area DPA. The third insulating layer INS3 may not be in the groove GP where the light output pattern ELP is positioned, and may be between the plurality of light emitting elements ED or between the emission areas EA1, EA2, and EA3. In one or more embodiments, the third insulating layer INS3 may be omitted.

The plurality of grooves GP may be formed to correspond to different light emitting elements ED. The groove GP may include a first groove GP1 formed to correspond to the first light emitting element ED1, a second groove GP2 formed to correspond to the second light emitting element ED2, and a third groove GP3 formed to correspond to the third light emitting element ED3. The grooves GP (GP1, GP2, and GP3) may be formed by the process of etching the second semiconductor layer SEM2 surrounded by the first insulating layer INS1. The grooves GP (GP1, GP2, and GP3) may expose a part of the top surface of the second semiconductor layer SEM2, and may be surrounded by the first insulating layer INS1.

The third connection electrode CNE3 may be provided on the second semiconductor layers SEM2 of the light emitting elements ED respectively exposed by the grooves GP1, GP2, and GP3. The third connection electrode CNE3 may also be on the third insulating layer INS3 and the second connection electrode CNE2. The third connection electrode CNE3 may be substantially in the entire display area DPA and the entire non-display area NDA, and may also may be in the grooves GP1, GP2, and GP3. Accordingly, a part of the third connection electrode CNE3 may be directly on the second connection electrode CNE2 and the second semiconductor layers SEM2 of the light emitting elements ED. The third connection electrode CNE3 may be in contact with the top surface of the second semiconductor layer SEM2 and the inner sidewall of the first insulating layer INS1 in each of the grooves GP1, GP2, and GP3, and may be in direct contact with a part of the top surface of the second connection electrode CNE2 exposed by the third insulating layer INS3 in the non-display area NDA. The second semiconductor layers SEM2 of the plurality of light emitting elements ED may be electrically connected to the second connection electrode CNE2 and the common electrode CE through the third connection electrode CNE3.

The plurality of light output patterns ELP may be in different grooves GP1, GP2, and GP3 to correspond to the light emitting elements ED1, ED2, and ED3, respectively. For example, the first light output pattern ELP1 may be on the first light emitting element ED1 in the first emission area EA1, and may be partially in the first groove GP1. The second light output pattern ELP2 may be on the second light emitting element ED2 in the second emission area EA2, and may be partially in the second groove GP2. The third light output pattern ELP3 may be on the third light emitting element ED3 in the third emission area EA3, and may be partially in the third groove GP3. The light output patterns ELP (ELP1, ELP2, and ELP3) may emit the lights emitted from the light emitting elements ED in the upward direction.

In the display device 10_8 according to one or more embodiments, the light emitting elements ED1, ED2, and ED3 may emit the light of different wavelength bands, and the light output patterns ELP may not contain the wavelength conversion particles WCP. The light output patterns ELP may perform only the function of the color filter without converting the wavelength of the incident light. For example, the first light output pattern ELP1 may be a red color filter when the first base portion BSP1 contains a red colorant that is the first color of the light. The second light output pattern ELP2 may be a green color filter when the second base portion BSP2 contains a green colorant that is the second color of the light, and the third light output pattern ELP3 may be a blue color filter when the third base portion BSP3 contains a blue colorant that is the third color of the light. The display device 10_8 may include different types (or kinds) of light emitting elements ED and the third connection electrode CNE3 that electrically connects the different types (or kinds) of light emitting elements ED to the common electrode CE, and the light output patterns ELP may perform the functions of the color filter and a light guide member.

FIGS. 28 to 31 are cross-sectional views showing a part of the manufacturing process of the display device of FIG. 27.

Figure 28:
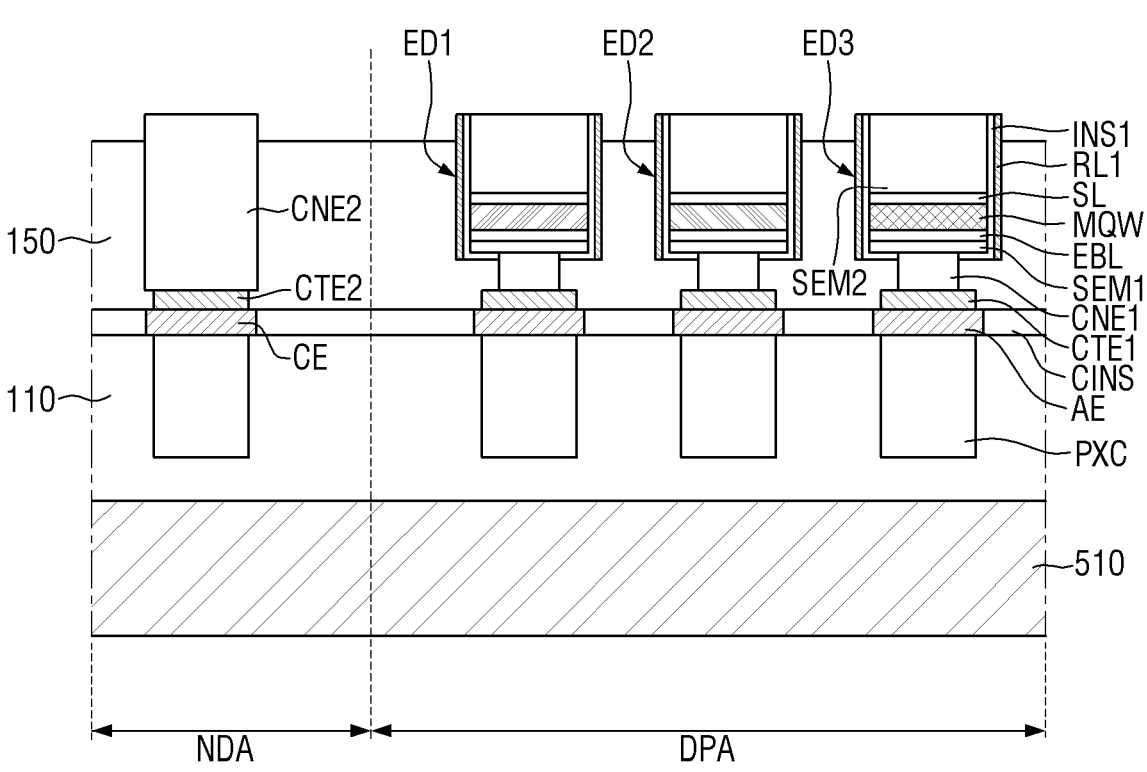
FIGS. 28-31 are cross-sectional views showing one or more parts of the manufacturing process of the display device of FIG. 27.

First, referring to FIG. 28, the plurality of light emitting elements ED1, ED2, and ED3, and the second connection electrode CNE2 are formed on the first substrate 110, and the support portion 150 surrounding them is formed on the first substrate 110. Unlike the above-described embodiments, the display device 10_8 includes different types (or kinds) of light emitting elements ED1, ED2, and ED3, so that the light emitting elements ED1, ED2, and ED3 respectively in the emission areas EA1, EA2, and EA3 may be individually formed. However, the same light emitting elements ED1, ED2, and ED3 are formed in the same emission areas EA1, EA2, and EA3, respectively, so that they may be on the first substrate 110 at the same time (e.g., concurrently). For example, the first emission areas EA1 may be arranged in the first direction DR1, and the first light emitting elements ED1 may be arranged in the first direction DR1 in the first emission areas EA1. In this case, the plurality of first light emitting elements ED1 may be formed at the same time (e.g., concurrently) on the first substrate 110 while being arranged in the first direction DR1. This process may be the same for the second light emitting elements ED2 in the second emission area EA2 and the third light emitting elements ED3 in the third emission area EA3.

The support portion 150 may be formed to cover the plurality of light emitting elements ED1, ED2, and ED3 and a part of the second connection electrode CNE2. The plurality of light emitting elements ED1, ED2, and ED3 and the second connection electrode CNE2 may partially protrude from the top surface of the support portion 150. At the protruding portions of the plurality of light emitting elements ED1, ED2, and ED3 the grooves GP1, GP2, and GP3 may be formed, and the second connection electrode CNE2 may be in contact with the third connection electrode CNE3.

Figure 29:
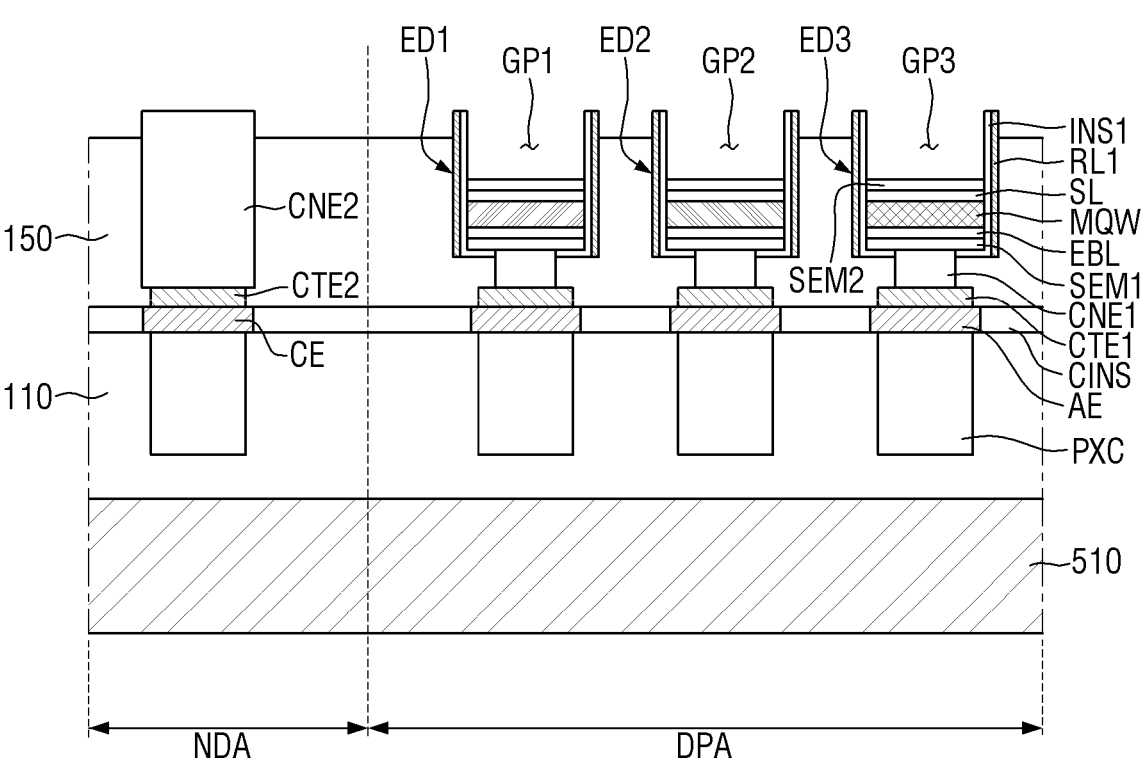
Figure 30:
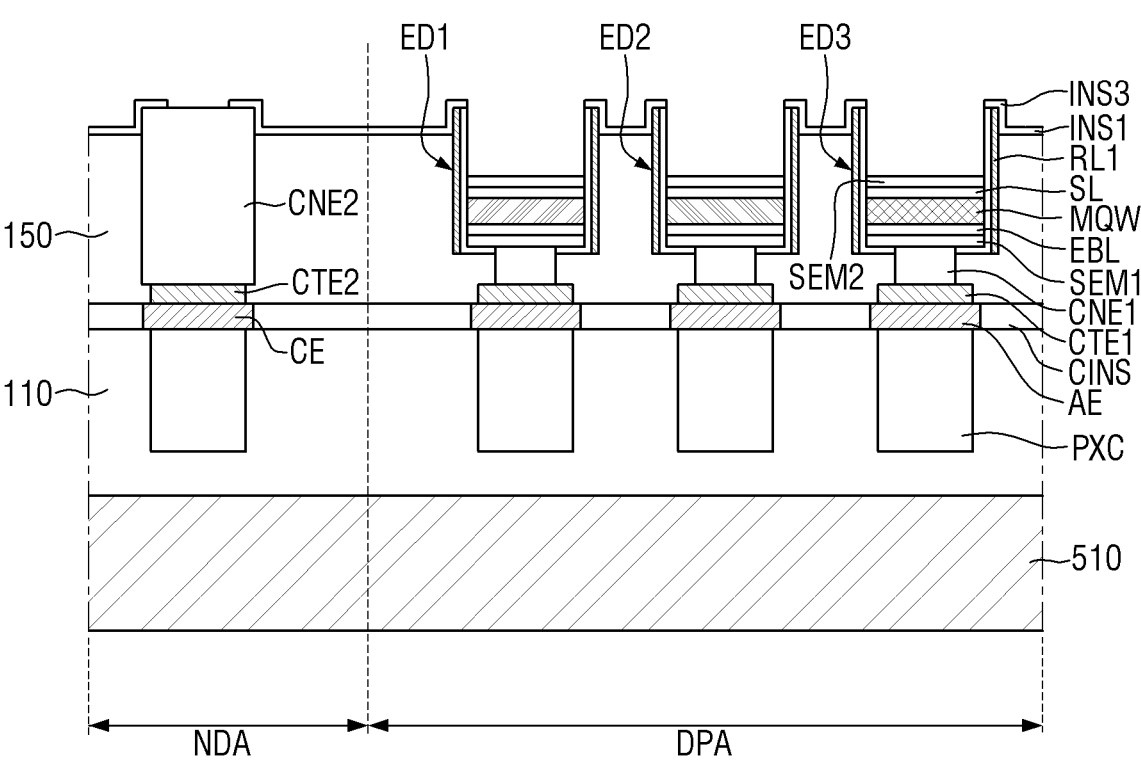

Next, referring to FIGS. 29 and 30, the plurality of grooves GP1, GP2, and GP3 are formed to correspond to the light emitting elements ED1, ED2, and ED3, respectively, and the third insulating layer INS3 is formed on the light emitting elements ED and a part of the second connection electrode CNE2.

The plurality of grooves GP1, GP2, and GP3 may be formed by the process of etching the second semiconductor layer SEM2. In the display area DPA, the second semiconductor layers SEM2 of the light emitting elements ED may be partially etched to form the grooves GP1, GP2, and GP3. The third insulating layer INS3 may be in the entire display area DPA and the entire non-display area NDA, and may expose the grooves GP1, GP2, and GP3 and a part of the top surface of the second connection electrode CNE2. Each of the second connection electrode CNE2 and the second semiconductor layer SEM2 that are exposed without the third insulating layer INS3 thereon may be in contact with the third connection electrode CNE3.

Although the case where the grooves GP1, GP2, and GP3 are formed and, then, the third insulating layer INS3 is formed is illustrated in the drawing, the disclosure is not limited thereto. In some embodiments, first, the third insulating layer INS3 may be formed on the light emitting element ED and, then, the third insulating layer INS3 and a part of the second semiconductor layer SEM2 may be etched to form the grooves GP1, GP2, and GP3.

Figure 31:
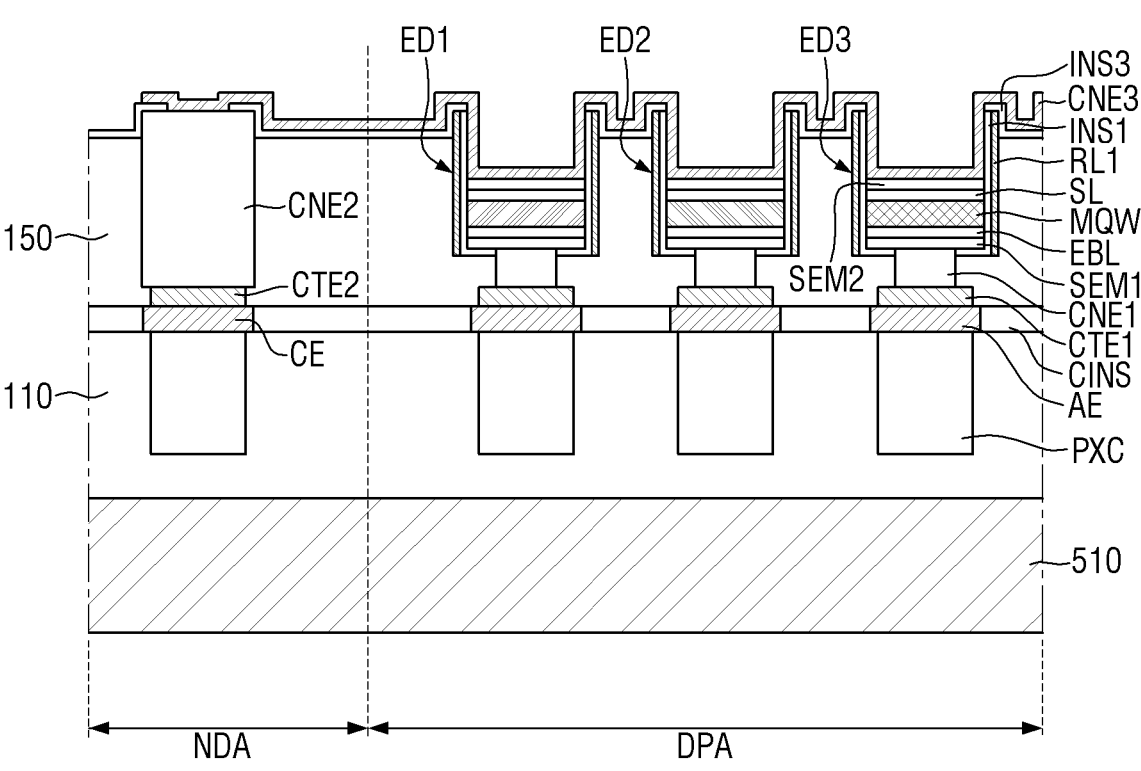

Next, referring to FIG. 31, the third connection electrode CNE3 is formed on the third insulating layer INS3 and the grooves GP1, GP2, and GP3. The third connection electrode CNE3 may be in the entire display area DPA and the entire non-display area NDA, and may also be in each of the grooves GP1, GP2, and GP3. The third connection electrode CNE3 may be in direct contact with the second semiconductor layers SEM2 of the light emitting elements ED exposed by the grooves GP1, GP2, and GP3, and may be in direct contact with the second connection electrode CNE2 exposed by the third insulating layer INS3.

Next, in one or more embodiments, the display device 10_8 may be manufactured by arranging the plurality of light output patterns ELP in the grooves GP1, GP2, and GP3 corresponding to the plurality of light emitting elements ED, respectively.

Figure 32:
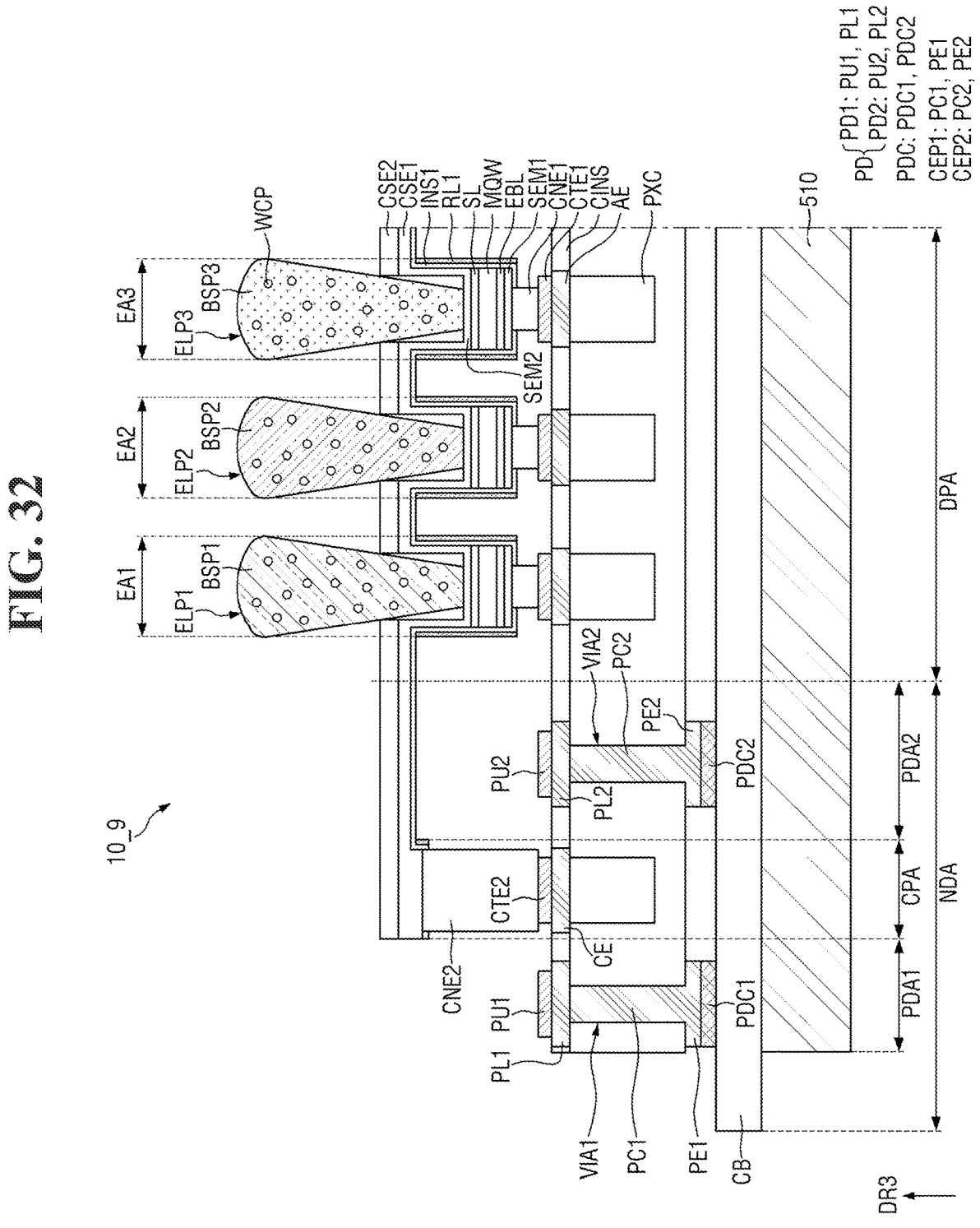
FIG. 32 is a cross-sectional view illustrating a portion of a display device according to one or more other embodiments.

FIG. 32 is a cross-sectional view illustrating a portion of a display device according to one or more other embodiments.

Referring to FIG. 32, in a display device 10_9 according to one or more embodiments, the circuit board CB may be under the first substrate 110, and a plurality of pads PD (PD1 and PD2) in the non-display area NDA may be electrically connected to circuit board pads PDC1 and PDC2 of the circuit board CB through via holes VIA1 and VIA2 penetrating the first substrate 110. The embodiment is different from the embodiment of FIG. 4 in the type (or kind) of electrical connection between the pads PD and the circuit board pads PDC1 and PDC2 and the arrangement of pad areas PDA1 and PDA2.

In the display device 10_9, it is necessary to secure the space for the common electrode connection portion CPA and the pad area PDA in the non-display area NDA. The display device 10_9 may be designed to minimize or reduce the non-display area NDA to implement an ultra-high resolution display device by arranging a larger number of light emitting elements ED per unit area.

In the display device 10_9 according to one or more embodiments, the circuit board CB may be positioned under the first substrate 110, the plurality of pads PD may be electrically connected to the circuit board pads PDC through the via holes VIA1 and VIA2 penetrating the first substrate 110, and some of the plurality of pads PD may be inside of the common electrode connection portion CPA. The plurality of pads PD may be positioned inside and outside with respect to the common electrode connection portion CPA in the non-display area NDA, and the space of the outer region of the common electrode connection portion CPA may be minimized or reduced. In the display device 10, it is possible to minimize or reduce the outer region of the common electrode connection portion CPA in the non-display area NDA of the first substrate 110, and the display area DPA may occupy a relatively large area. In the display device 10 according to one or more embodiments, the pads PD are electrically connected to the circuit board pad PDC of the circuit board CB while penetrating the first substrate 110, so that it is possible to secure the sufficient or suitable space for the display area DPA, which is advantageous in implementing the ultra-high resolution display device.

The display device 10_9 may include the pad areas PDA (PDA1 and PDA2) in the non-display area NDA, for example, a first pad area PDA1 at the outer side of the common electrode connection portion CPA, and a second pad area PDA2 at the inner side of the common electrode connection portion CPA (e.g., adjacent to the display area DPA). With respect to the common electrode connection portion CPA, the first pad area PDA1 may be an outer pad area, and the second pad area PDA2 may be an inner pad area. The plurality of pads PD (PD1 and PD2) may be in the first pad area PDA1 and the second pad area PDA2, respectively. The first pad PD1 and the second pad PD2 may be at the outer side and the inner side, respectively, with respect to the common electrode CE. The first pad PD1 may include a first pad base layer PL1 and a first pad upper layer PU1, and the second pad PD2 may include a second pad base layer PL2 and a second pad upper layer PU2. The description of the structures of the pads PD is the same as the above description.

The plurality of pads PD (PD1 and PD2) may be electrically connected to the circuit board pads PDC (PDC1 and PDC2) of the circuit board CB through the plurality of via holes VIA (VIA1 and VIA2) formed in the first substrate 110 and pad connection electrodes CEP (CEP1 and CEP2), respectively. The plurality of pads PD1 and PD2 may be on one surface of the first substrate 110, and the circuit board pads PDC1 and PDC2 may be on one surface of the circuit board CB. In accordance with one or more embodiments, the plurality of via holes VIA (VIA1 and VIA2) include a first via hole VIA1 formed in the first pad area PDA1 and a second via hole VIA2 formed in the second pad area PDA2 in the non-display area NDA. The plurality of pad connection electrodes CEP may include a first pad connection electrode CEP1 electrically connecting the first pad PD1 and the first circuit board pad PDC1 and a second pad connection electrode CEP2 electrically connecting the second pad PD2 and the second circuit board pad PDC2.

The first via hole VIA1 may be formed to correspond to each of the first pads PD1 in the first pad area PDA1, and may penetrate the first substrate 110. The first via holes VIA1 may penetrate from one surface of the first substrate 110 where the first pads PD1 are positioned to the other surface of the first substrate 110. The first via holes VIA1 may overlap the first pad PD1, and the first pad base layer PL1 may be on the first via hole VIA1. A part of the first pad connection electrode CEP1 may be in the first via hole VIA1 and electrically connected to each of the first pad PD1 and the first circuit board pad PDC1. The first pad connection electrode CEP1 may include a first connection portion PC1 in the first via hole VIA1, and a first electrode portion PE1 on the bottom surface of the first substrate 110 while being connected to the first connection portion PC1. The first connection portion PC1 may be in direct contact with the first pad base layer PL1 of the first pad PD1, and the first electrode portion PE1 may be on the other surface of the first substrate 110 to be in direct contact with the first circuit board pad PDC1.

The second via hole VIA2 may be formed to correspond to each of the second pads PD2 in the second pad area PDA2, and may penetrate the first substrate 110. The second via holes VIA2 may penetrate from one surface of the first substrate 110 where the second pads PD2 are positioned to the other surface of the first substrate 110. The second via holes VIA2 may overlap the second pad PD2, and the second pad base layer PL2 may be on the second via hole VIA2. A part of the second pad connection electrode CEP2 may be in the second via hole VIA2 and electrically connected to each of the second pad PD2 and the second circuit board pad PDC2. The second pad connection electrode CEP2 may include a second connection portion PC2 in the second via hole VIA2, and a second electrode portion PE2 on the bottom surface of the first substrate 110 while being connected to the second connection portion PC2. The second connection portion PC2 may be in direct contact with the second pad base layer PL2 of the second pad PD2, and the second electrode portion PE2 may be on the other surface of the first substrate 110 to be in direct contact with the second circuit board pad PDC2.

The via holes VIA1 and VIA2 formed in the first substrate 110 may provide paths through which the pads PD1 and PD2 positioned on the first substrate 110 are electrically connected to the circuit board pad PDC through the pad connection electrodes CEP. The first via holes VIA1 may correspond to the first pads PD1 in the first pad area PDA1, and the planar arrangement of the first via holes VIA1 may be substantially the same as the planar arrangement of the first pads PD1. The second via holes VIA2 may correspond to the second pads PD2 in the second pad area PDA2, and the planar arrangement of the second via holes VIA2 may be substantially the same as the planar arrangement of the second pads PD2.

The pad connection electrodes CEP and the circuit board pad PDC may not completely correspond to the arrangement of the pads PD on the first substrate 110. It is illustrated in the drawing that the first pad connection electrode CEP1 and the first circuit board pad PDC1 are provided to correspond to the first pad PD1 and the first via hole VIA1, respectively, and the second pad connection electrode CEP2 and the second circuit board pad PDC2 are provided to correspond to the second pad PD2 and the second via hole VIA2, respectively. However, the disclosure is not limited thereto, and the pads PD1 and PD2 and the circuit board pads PDC1 and PDC2 may not correspond to each other, respectively, and the circuit board pads PDC1 and PDC2 may correspond to some of the pads PD1 and DP2. Because the connection electrodes PC1 and PC2 are provided in the via holes VIA1 and VIA2 to correspond thereto, respectively, the pad connection electrodes CEP1 and CEP2 may correspond to the pads PD on the first substrate 110, and the electrode portions PE1 and PE2 may be in contact with the circuit board pads PDC1 and PDC2 while corresponding thereto. The pad connection electrode CEP and the circuit board pads PDC1 and PDC2 may be variously modified depending on the design of the pad PD and the structure of the first substrate 110.

In one or more embodiments, a display device for displaying an image according to one or more embodiments may be applied to various apparatuses and devices.

Figure 33:
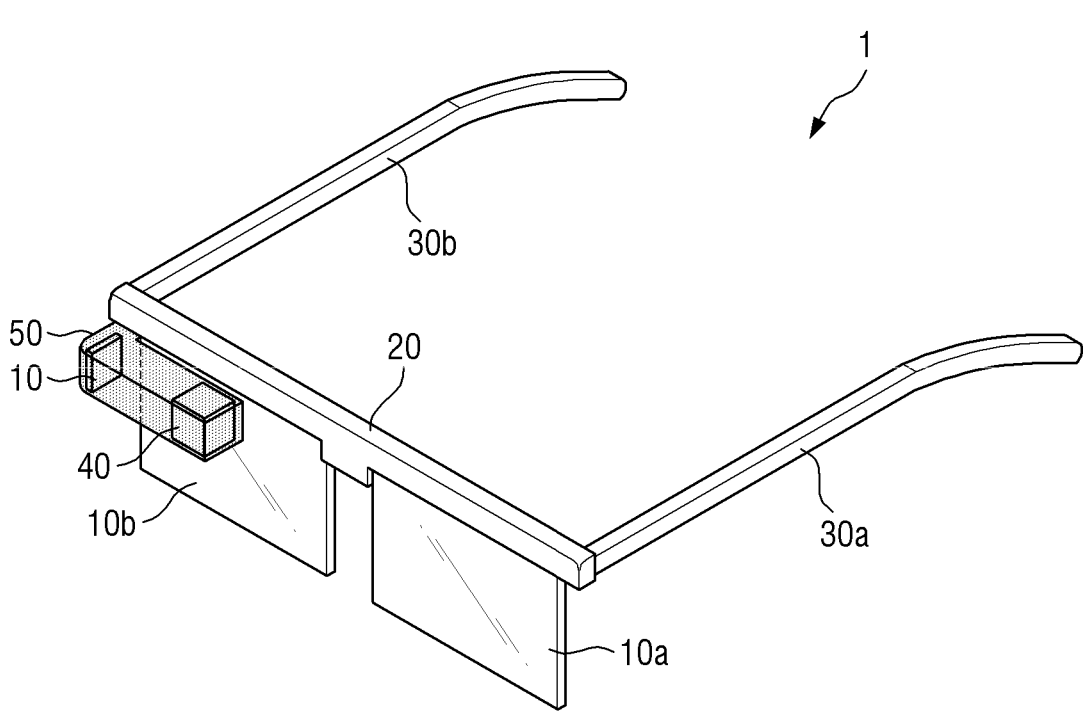
FIGS. 33-35 are schematic views showing a device including a display device according to one or more embodiments.
Figure 34:
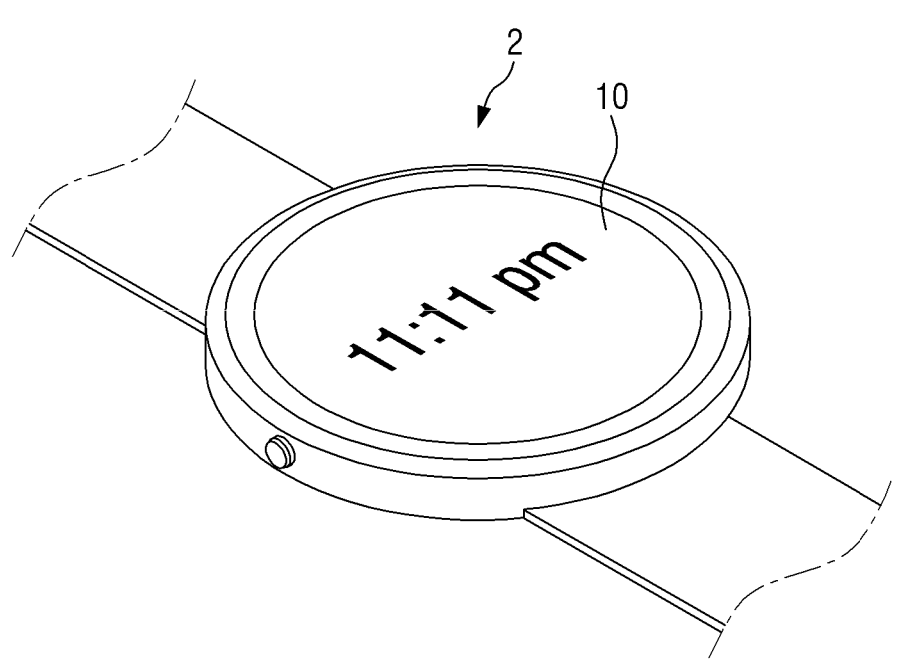
Figure 35:
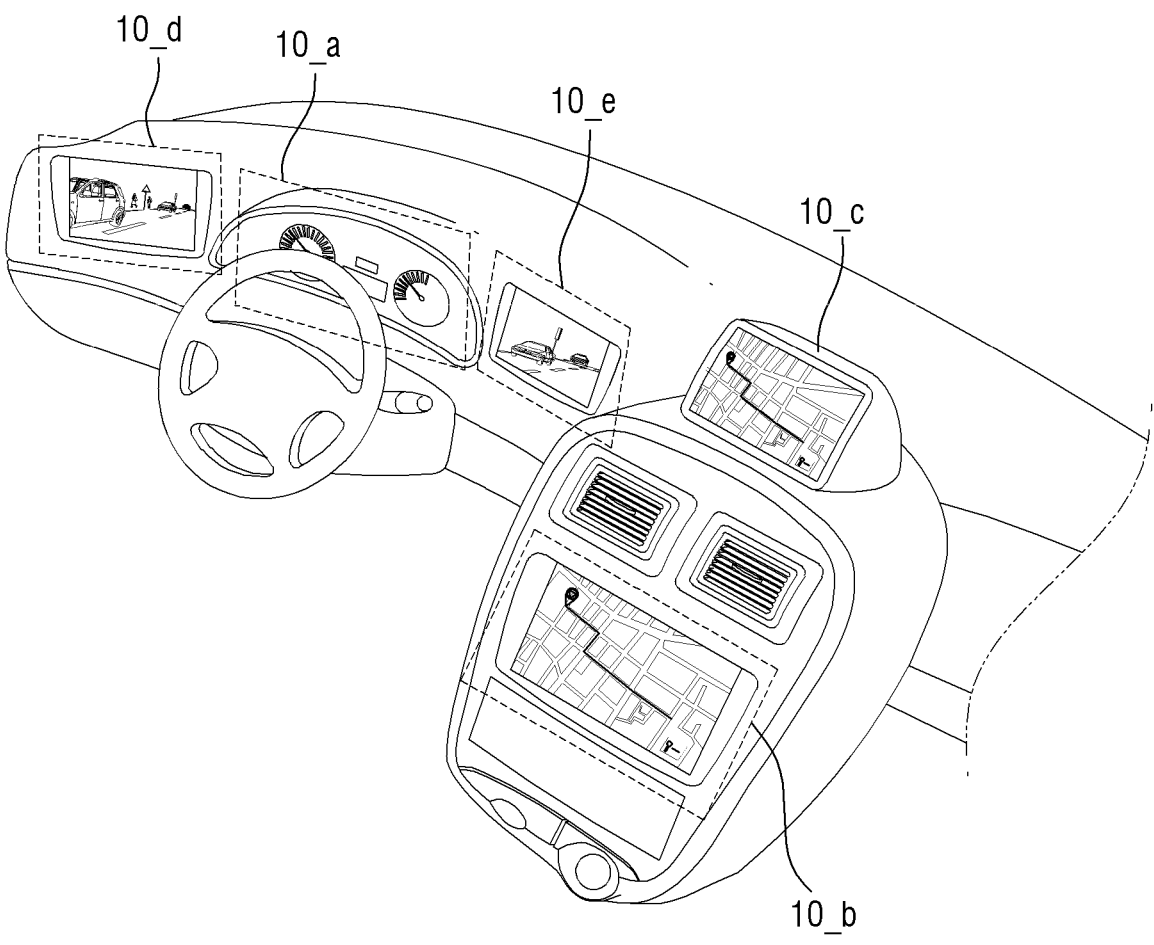

FIGS. 33 to 35 are schematic views showing a device including a display device according to one or more embodiments. FIG. 33 shows a virtual reality device 1 to which the display device 10 according to one or more embodiments is applied, and FIG. 34 shows a smart watch 2 to which the display device 10 according to one or more embodiments is applied. FIG. 35 shows that display devices 10_a, 10_b, 10_c, 10_d, and 10_e according to one or more embodiments are applied to the display unit of an automobile.

Referring to FIG. 33, the virtual reality device 1 according to one or more embodiments may be a glasses-like device. The virtual reality device 1 according to one or more embodiments may include the display device 10, a left lens 10a, a right lens 10b, a support frame 20, temples 30a and 30b, a reflection member 40, and a display device storage 50.

Although FIG. 33 illustrates the virtual reality device 1 including the temples 30a and 30b, the virtual reality device 1 according to one or more embodiments may be applied to a head mounted display including a head mounted band that may be worn on a head, instead of using the temples 30a and 30b. The virtual reality device 1 according to one or more embodiments is not limited to the structure shown in the drawing, and may be applied in various suitable forms to various suitable electronic devices.

The display device storage 50 may include the display device 10 and the reflection member 40. The image displayed on the display device 10 may be reflected by the reflection member 40 and provided to a user's right eye through the right lens 10b. Accordingly, the user can view the virtual reality image displayed on the display device 10 through the right eye.

The display device storage 50 may be, but not necessarily, at the right end of the support frame 20. For example, the display device storage 50 may be at the left end of the support frame 20, and the image displayed on the display device 10 may be reflected by the reflection member 40 and provided to a user's left eye through the left lens 10a. Accordingly, the user can view the virtual reality image displayed on the display device 10 through the left eye. In one or more embodiments, the display device storage 50 may be at both the left end and the right end of the support frame 20. In that case, the user can view the virtual reality image displayed on the display device 10 through both the left eye and the right eye.

Referring to FIG. 34, the display device 10 according to one or more embodiments may be applied to the smart watch 2 that is one of the smart devices.

Referring to FIG. 35, the display devices 10_a, 10_b, and 10_c according to one or more embodiments may be applied to the dashboard of the automobile, the center fascia (e.g., center panel) of the automobile, and/or the center information display (CID) of the dashboard of the automobile. Further, the display devices 10_d, and 10_e according to one or more embodiments may be applied to a room mirror display that may be used instead of side mirrors of the automobile.

Figure 36:
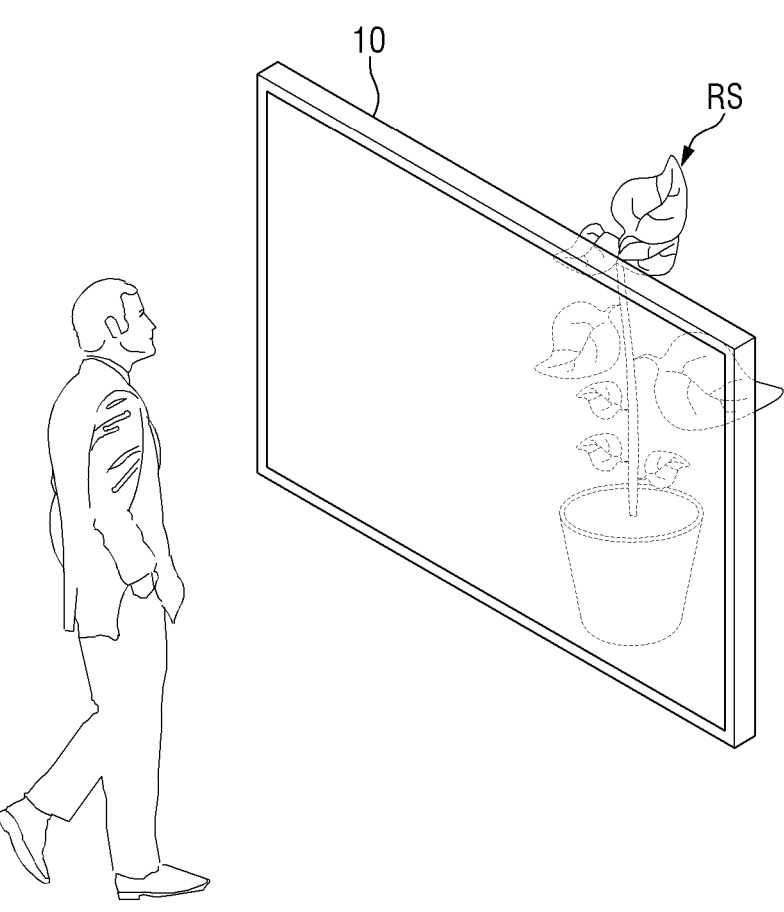
FIGS. 36 and 37 show a transparent display device including a display device according to one or more embodiments.
Figure 37:
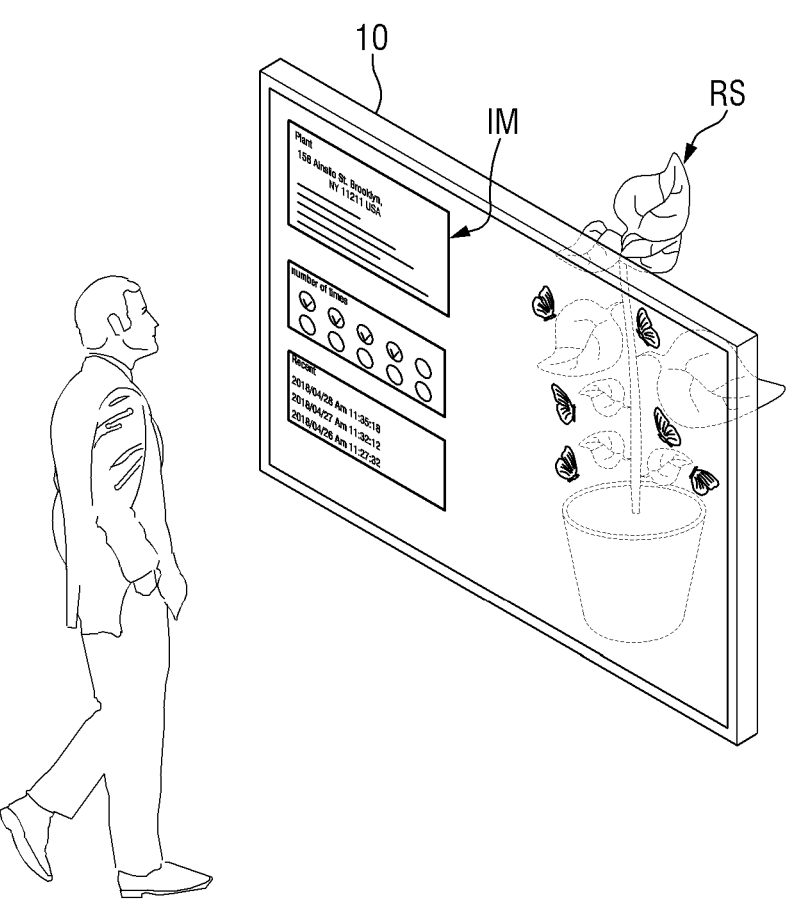

FIGS. 36 and 37 show a transparent display device including a display device according to one or more embodiments.

Referring to FIGS. 36 and 37, the display device 10 according to one or more embodiments may be applied to the transparent display device. The transparent display device may display an image IM, and also may transmit light. A user located on the front side of the transparent display device can view an object RS or a background on the rear side of the transparent display device as well as the image IM displayed on the display device 10. When the display device 10 is applied to the transparent display device, the first substrate 110, the heat dissipation substrate 510, and the circuit board CB of the display device 10 may include a light transmitting portion capable of transmitting light or may be made of a material capable of transmitting light.

In concluding the detailed description, those skilled in the art will appreciate that many variations and modifications can be made to the disclosed embodiments without substantially departing from the principles of the present disclosure. Therefore, the disclosed embodiments of the present disclosure are used in a generic and descriptive sense only and not for purposes of limitation. Various changes in form and details may be made therein without departing from the spirit and scope of the present disclosure as set forth in the following claims and their equivalents.

What is claimed is:

1. A display device comprising:
   a first substrate comprising a display area and a non-display area around the display area, the first substrate comprising a plurality of pixel circuit units;
   a plurality of light emitting elements in the display area on the first substrate and electrically coupled to a corresponding one of the plurality of pixel circuit units, respectively;
   a plurality of grooves corresponding to the plurality of light emitting elements, respectively, such that top surfaces of the plurality of light emitting elements are partially recessed;
   a connection electrode in the non-display area on the first substrate and electrically connected to the plurality of light emitting elements;
   a first common semiconductor layer on the plurality of light emitting elements and the connection electrode; and
   a plurality of light output patterns corresponding to the plurality of light emitting elements, the plurality of light output patterns being partially in a corresponding groove of the plurality of grooves, wherein a light output pattern of the plurality of light output patterns comprises a first surface in contact with a light emitting element of the plurality of light emitting elements in a corresponding groove of the plurality of grooves, a second surface opposite to the first surface, and a third surface that is a side surface connecting the first surface and the second surface,
   wherein a height of the light output pattern is greater than a height of the corresponding groove,
   wherein a cross-sectional view of the second surface of the light output pattern has a curved shape, and
   wherein there is a gap between the third surface of the light output pattern and the first common semiconductor layer.

2. The display device of claim 1, wherein a diameter of the light output pattern increases from the first surface to the second surface.

3. The display device of claim 2, wherein the third surface is inclined with respect to a top surface of the first substrate.

4. The display device of claim 2, wherein the third surface is curved.

5. The display device of claim 1, wherein each of the plurality of light emitting elements comprises a first semiconductor layer, an active layer on the first semiconductor layer, and a second semiconductor layer on the active layer,
   wherein a respective one of the plurality of grooves corresponds to a respective one of the plurality of light emitting elements,
   wherein the respective one of the plurality of grooves has a diameter smaller than a diameter of the second semiconductor layer of the respective one of the plurality of light emitting elements, and
   wherein the respective one of the plurality of grooves is on a top surface of the second semiconductor layer of the respective one of the plurality of light emitting elements, and is surrounded by a side surface portion of the second semiconductor layer.

6. The display device of claim 5, wherein the first surface of the light output pattern is in direct contact with the second semiconductor layer.

7. The display device of claim 5, further comprising an optical layer between the first surface of the light output pattern and the second semiconductor layer.

8. The display device of claim 5, further comprising a reflective layer on the side surface of the light output pattern.

9. The display device of claim 1, wherein the light output pattern comprises a base portion to reduce transmission of some of light emitted from the plurality of light emitting elements, and wavelength conversion particles in the base portion.

10. The display device of claim 9, wherein the light emitting element is to emit light of a first color, and at least some of the plurality of light output patterns comprise a colorant to reduce transmission of the light of the first color by the base portion.

11. The display device of claim 1, further comprising a second substrate on the first substrate and partially around the plurality of light output patterns,
   wherein a refractive index of the light output pattern is greater than a refractive index of the second substrate.

12. The display device of claim 11, further comprising a capping layer on the second substrate,
   wherein the capping layer is to cover the second surfaces of the plurality of light output patterns.

13. The display device of claim 12, wherein a refractive index of the capping layer is smaller than a refractive index of the light output pattern.

\* \* \* \* \*